United States Patent [19]

Endoh et al.

[11] Patent Number: 5,555,204
[45] Date of Patent: Sep. 10, 1996

[54] NON-VOLATILE SEMICONDUCTOR MEMORY DEVICE

[75] Inventors: Tetsuo Endoh; Yoshiyuki Tanaka, both of Yokohama; Seiichi Aritome; Riichiro Shirota, both of Kawasaki; Susumu Shuto, Ichikawa; Tomoharu Tanaka, Yokohama; Gertjan Hemink, Kawasaki; Toru Tanzawa, Ebina, all of Japan

[73] Assignee: Kabushiki Kaisha Toshiba, Kawasaki, Japan

[21] Appl. No.: 266,633

[22] Filed: Jun. 28, 1994

[30] Foreign Application Priority Data

Jun. 29, 1993 [JP] Japan ................. 5-158386
Dec. 13, 1993 [JP] Japan ................. 5-311740

[51] Int. Cl.⁶ ................................. G11C 16/02
[52] U.S. Cl. ............... 365/189.01; 365/218; 365/184
[58] Field of Search ..................... 365/185, 218, 365/184, 104, 189.01

[56] References Cited

U.S. PATENT DOCUMENTS

| 5,299,162 | 3/1994 | Kim et al. ................... | 365/185 |
| 5,315,547 | 5/1994 | Shoji et al. ................. | 365/218 |
| 5,325,327 | 6/1994 | Ema ........................... | 365/185 |
| 5,357,462 | 10/1994 | Tanaka et al. ............... | 365/185 |

FOREIGN PATENT DOCUMENTS

| 0463331 | 1/1992 | European Pat. Off. . |
| 4040492A1 | 2/1992 | Germany . |
| 4232025A1 | 7/1995 | Germany . |

Primary Examiner—David C. Nelms
Assistant Examiner—Vu A. Le
Attorney, Agent, or Firm—Oblon, Spivak, McClelland, Maier, & Neustadt, P.C.

[57] ABSTRACT

A non-volatile semiconductor memory device includes a semiconductor substrate, a memory cell including source and drain regions formed in a surface region of the semiconductor substrate, and a first gate insulating film, a charge storage layer, a second gate insulating film, and a control gate sequentially stacked on the semiconductor substrate, the memory cell being capable of electrically rewriting data by exchanging charges between the charge storage layer and the semiconductor substrate, and a means for applying a high potential to the semiconductor substrate and an intermediate potential to the control gate in a first data erase operation, and applying a high potential to the semiconductor substrate and a low potential to the control gate in second and subsequent data erase operations, thereby removing electrons from the charge storage layer.

34 Claims, 31 Drawing Sheets

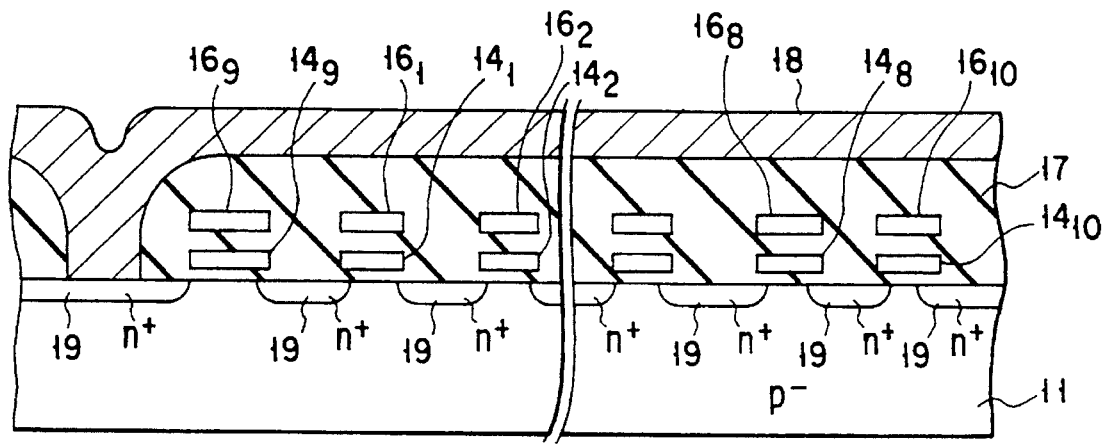
F I G. 10A
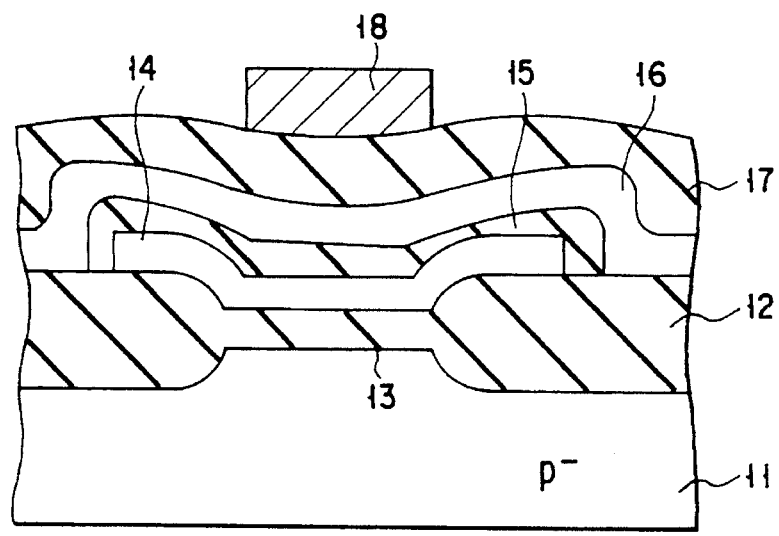
F I G. 10B

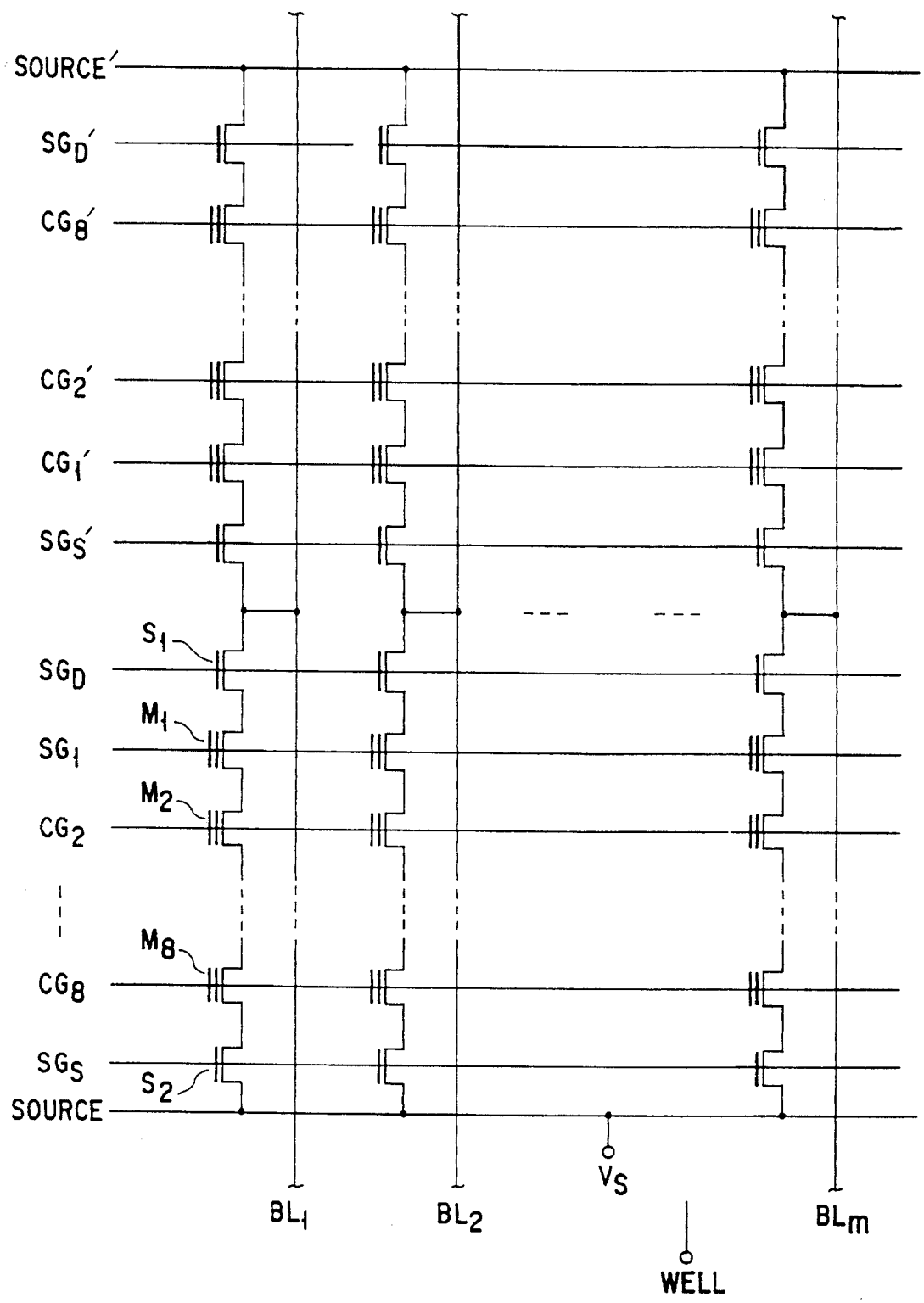
F I G. 11

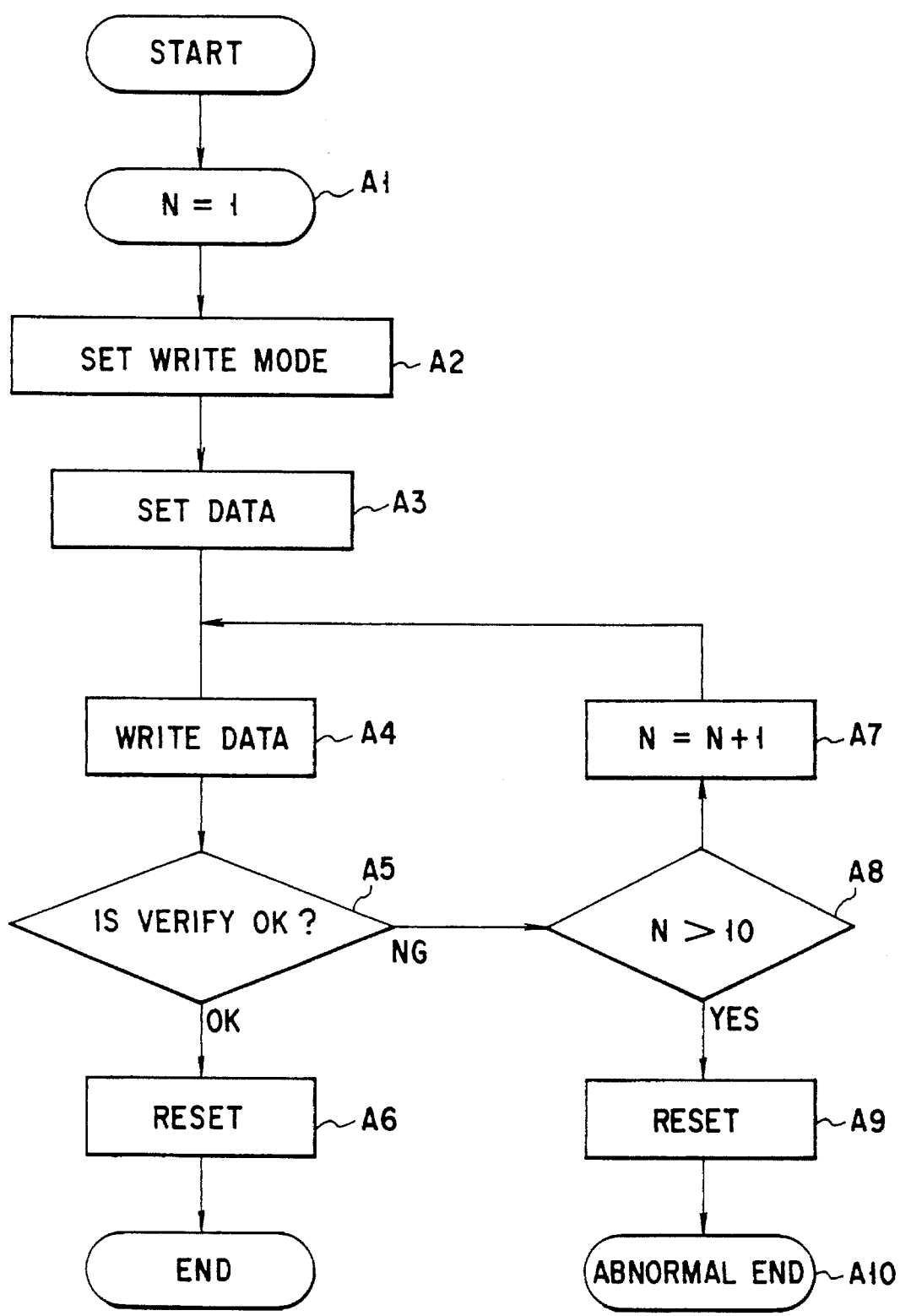
F I G. 14

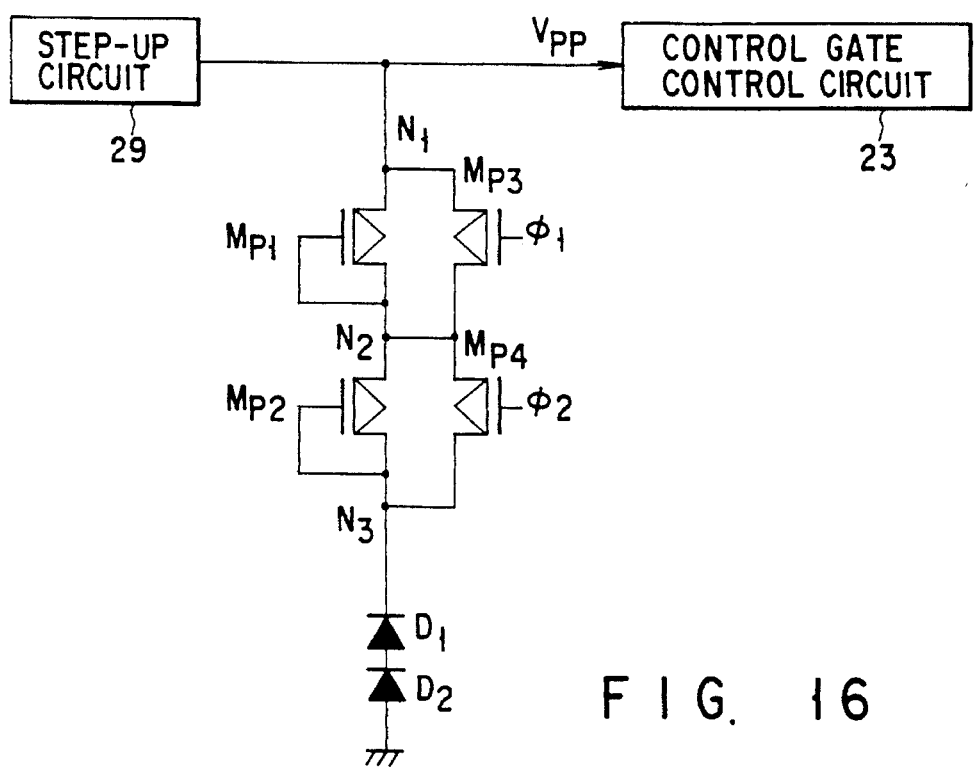
F I G. 16
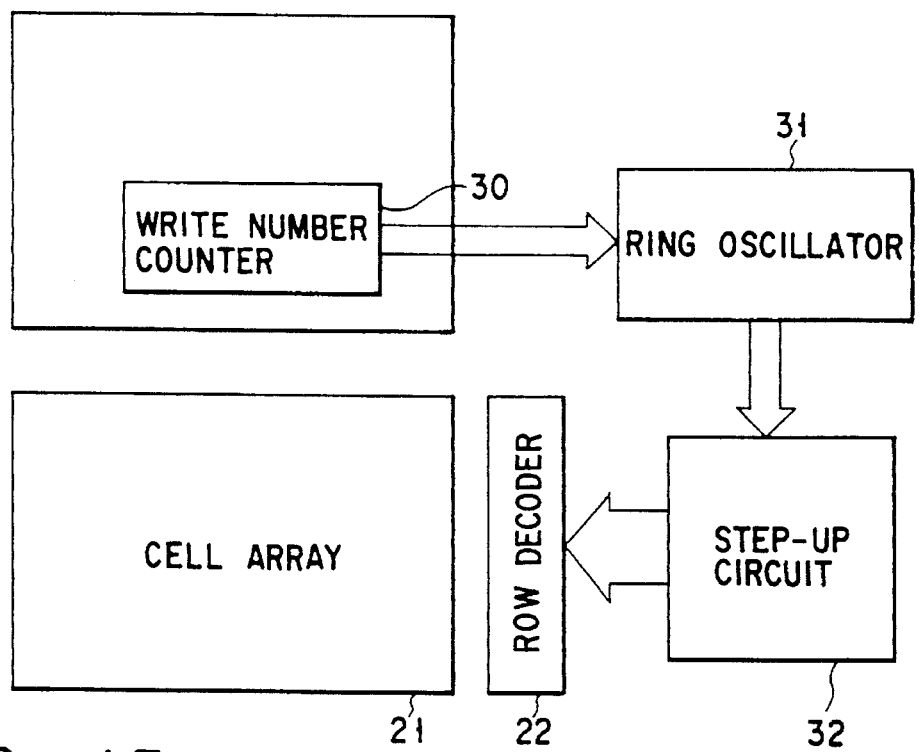
F I G. 17

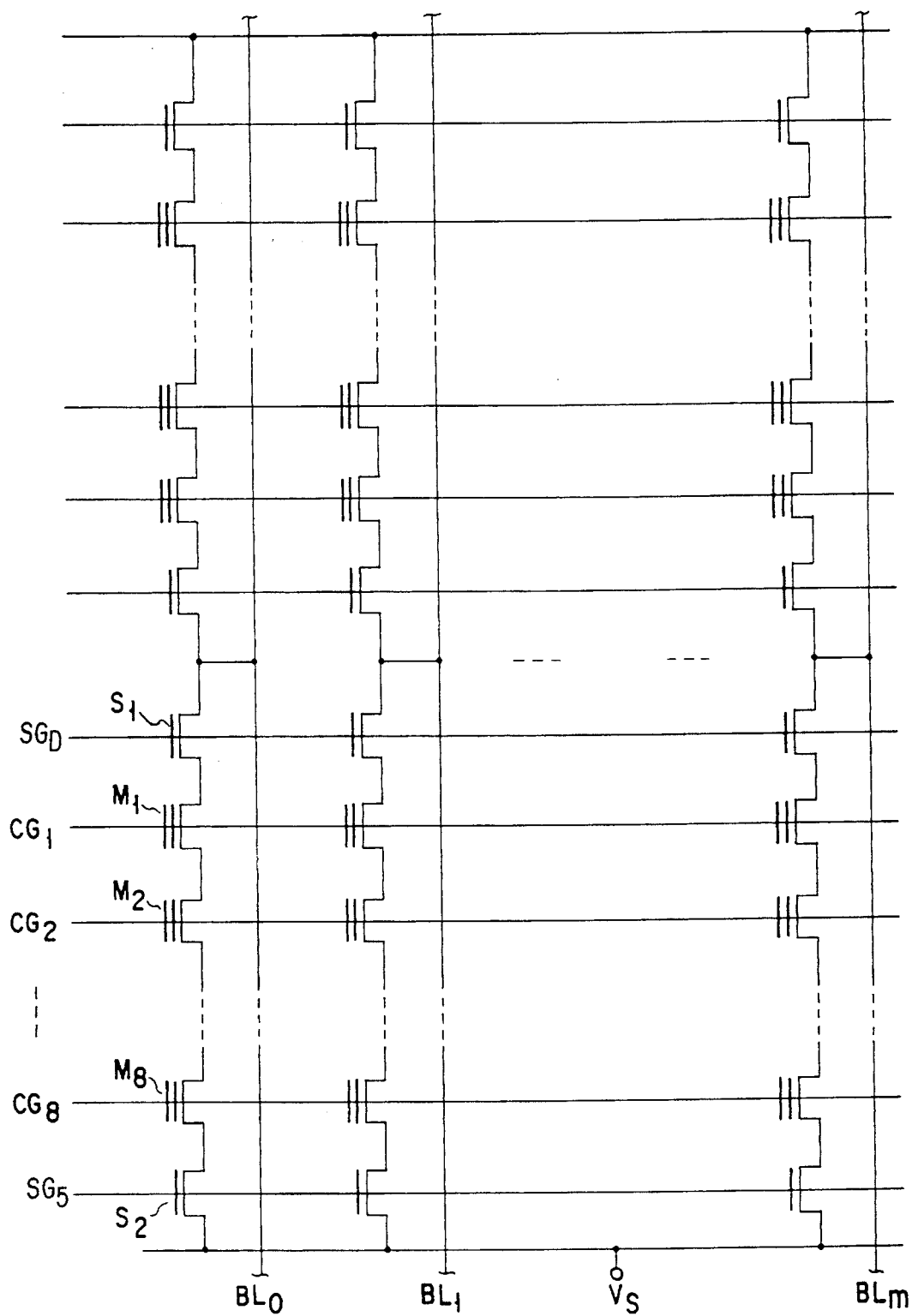
F I G. 28

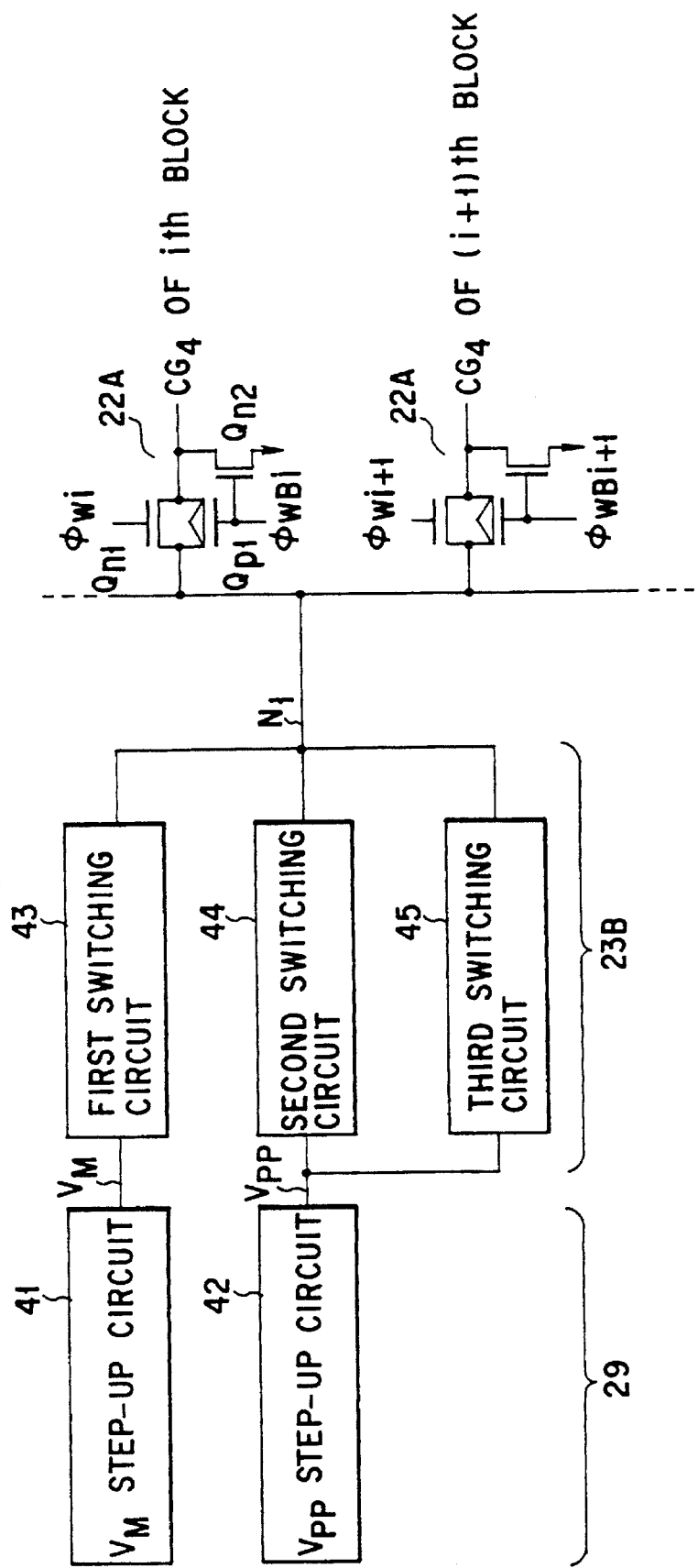
F I G. 30

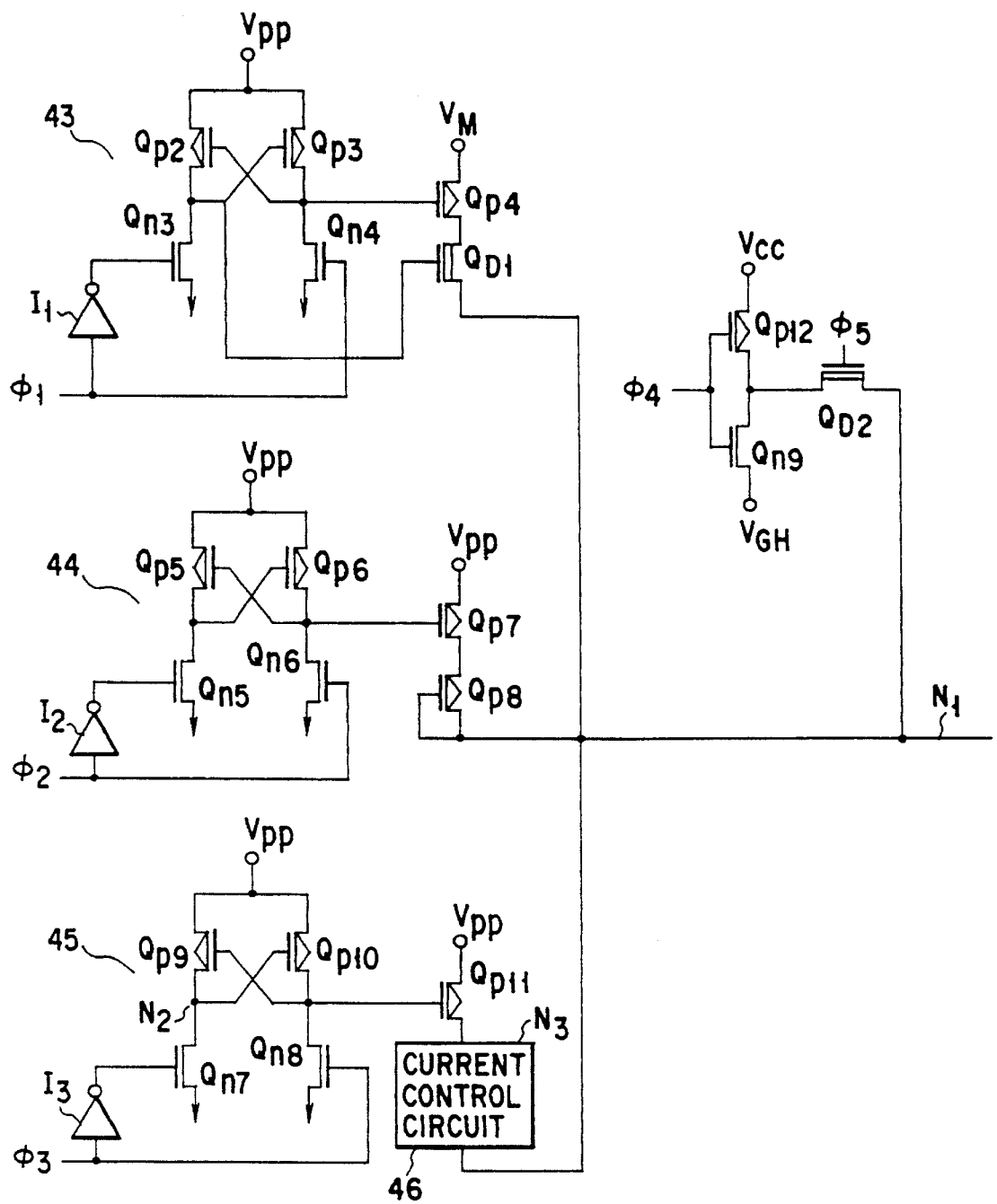
F I G. 31

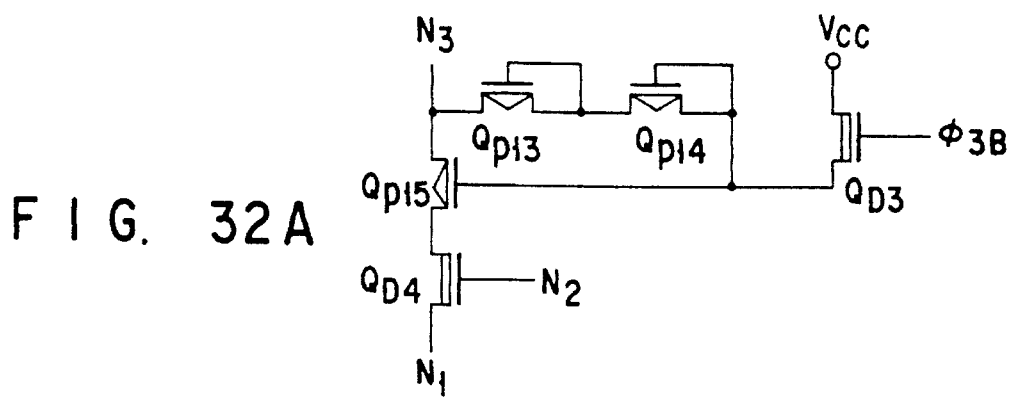
F I G. 32A
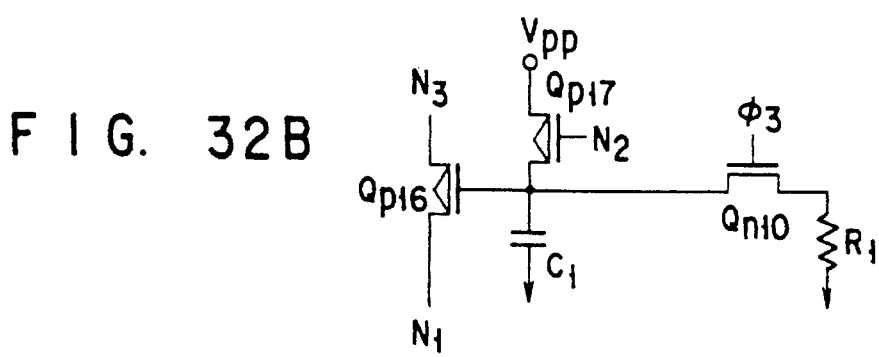
F I G. 32B
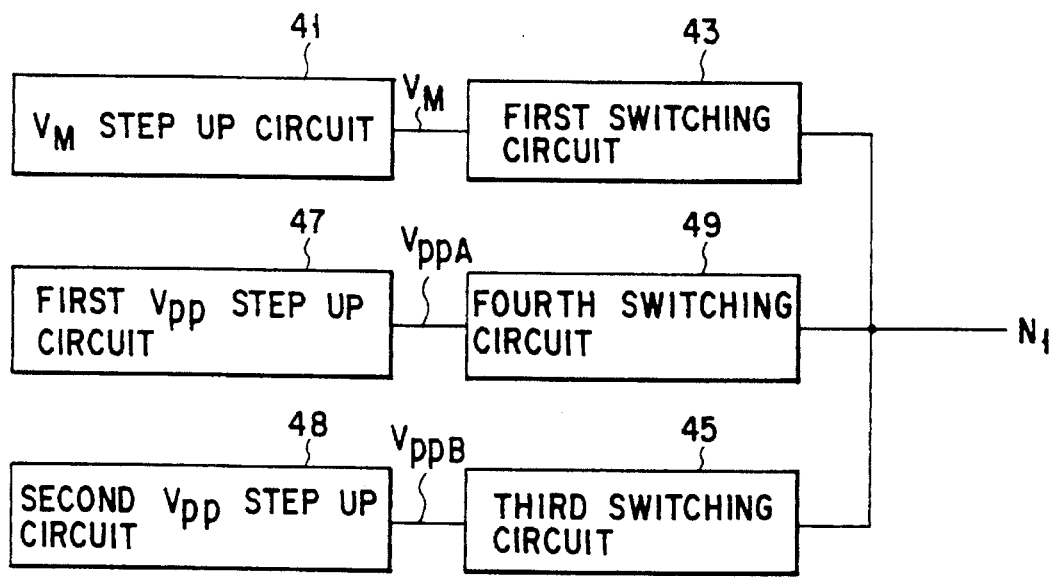
F I G. 35

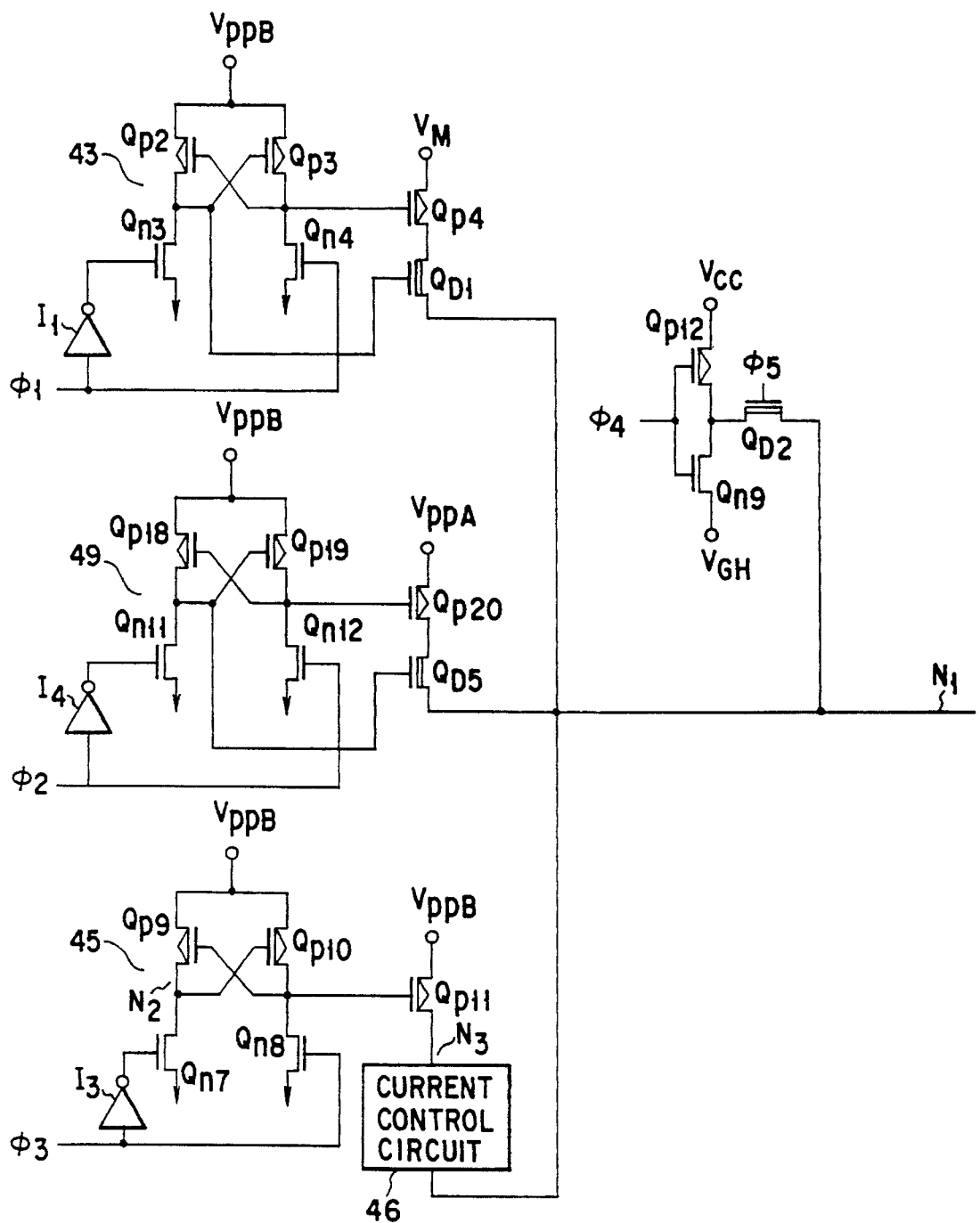
F I G. 36

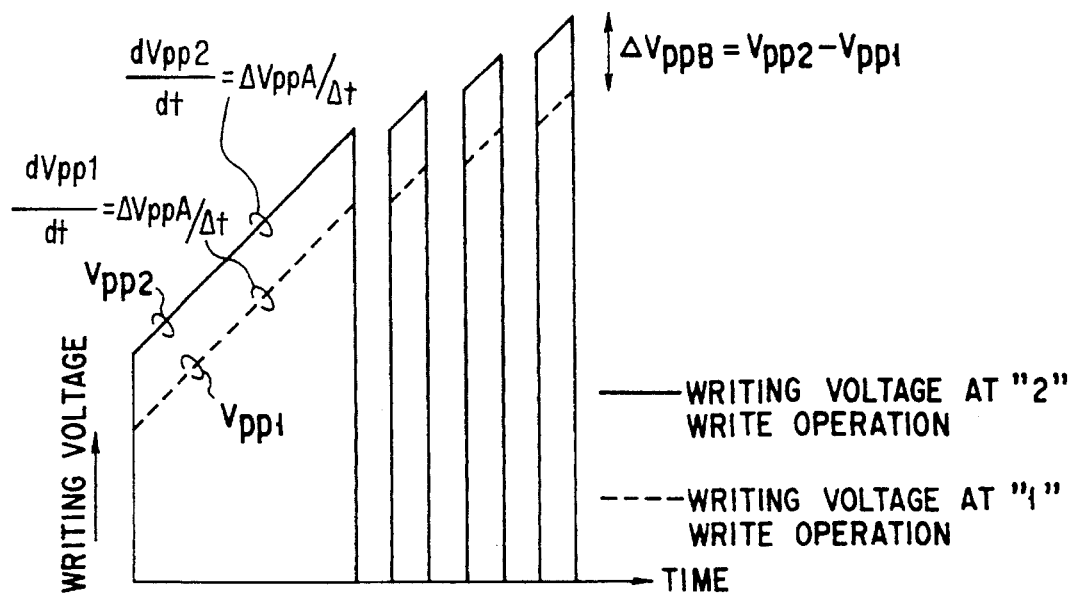
F I G. 38A
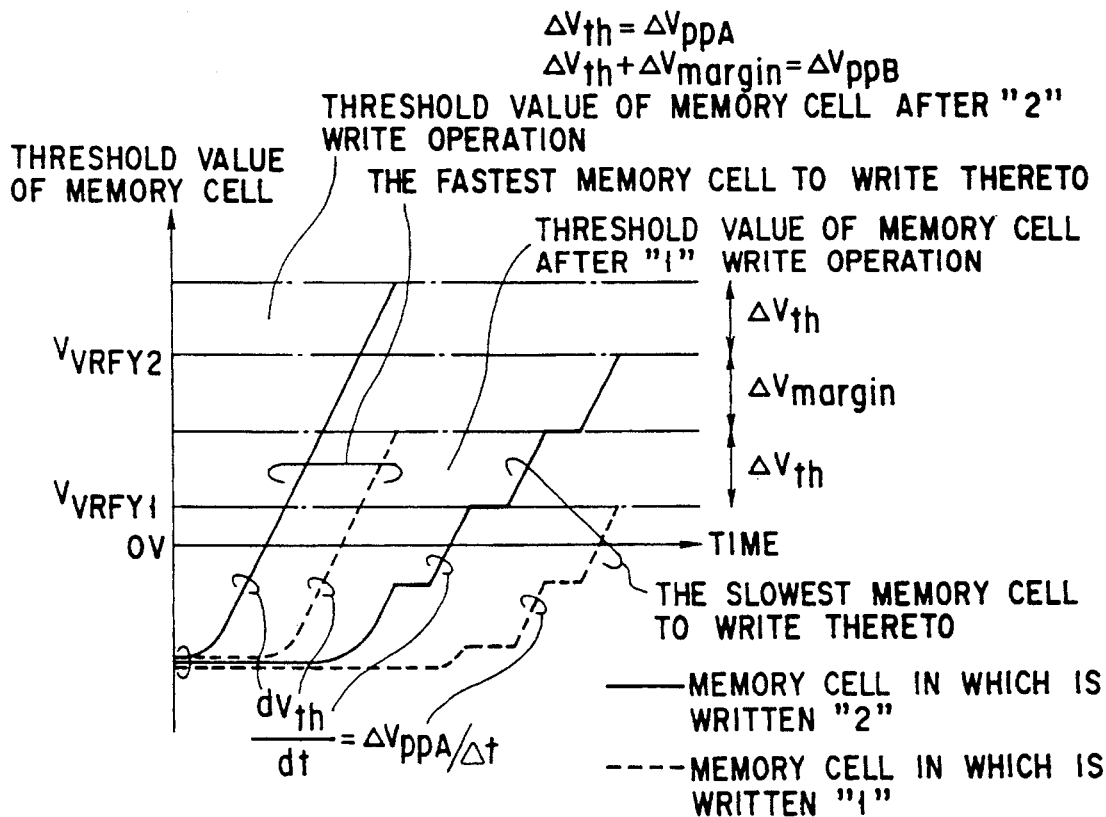
F I G. 38B

NON-VOLATILE SEMICONDUCTOR MEMORY DEVICE

BACKGROUND OF THE INVENTION

1. Field of the Invention

The present invention relates to a non-volatile semiconductor memory device (EEPROM) capable of electrically rewriting data, which device is constituted by memory cells each having a MOS transistor structure having a charge storage layer and a control gate, and more particularly, to an EEPROM for writing/erasing data in/from each memory cell using a tunnel current.

2. Description of the Related Art

In the field of EEPROMS, a memory cell of a MOS transistor structure having a charge storage layer (floating gate) and a control gate is widely used, and there is a growing trend toward higher integration densities. This memory cell is capable of electrically writing data by exchanging charges between the floating gate and the semiconductor substrate.

In a device of this type, when a data erase operation is to be performed, a high electric field is applied to the tunnel oxide film of each memory cell between the floating gate and the semiconductor, posing problems in terms of dielectric breakdown and leakage current. In a data write operation, a high electric field is applied to the tunnel oxide film, and hence a great stress is applied thereto. For this reason, the tunnel oxide film of each memory cell deteriorates after the device is used for a certain period of time. This deterioration in the tunnel oxide film will reduce the resistance of the cell data to a stress acting on each cell in a cell data read operation, and shorten the life time of the cell data.

As one of the above EEPROMS, a NAND-type EEPROM which allows a high integration density is known. In a NAND-type EEPROM, a plurality of memory cells are connected in series such that the respective adjacent memory cells share sources and drains. These memory cells are connected, as a unit, to a bit line. Each memory cell generally has an FET structure in which a charge storage layer and a control gate are stacked on each other. A memory cell array is integrally formed in a p-type well formed in a p- or n-type substrate.

The drain and source sides of a NAND cell are respectively connected to a bit line and a source line (reference potential line) via selection gates. The control gates of the respective memory cells are continuously connected to each other in the row direction to constitute a word line. In general, a set of cells connected to the same word line is called a page, and a set of pages between a pair of selection gates on the drain and source sides is called a NAND block or simply a block. In general, one block is the minimum unit which can be independently erased.

The NAND-type EEPROM is operated as follows.

A data erase operation is performed with respect to the memory cells in one NAND block at once. All the control gates of a selected NAND block are set at $V_{SS}$, and a high voltage $V_{PP}$ (e.g., 20 V) is applied to the p-type well and the n-type substrate. With this operation, electrons are discharged from the floating gates of all the memory cells, and the threshold value of each memory cell shifts in the negative-value direction (normally, this state is defined as a "1" state). A chip erase operation is performed by setting all the NAND blocks in a selected state.

A data write operation is sequentially performed from the memory cell located farthest from the bit line. A high voltage $V_{PP}$ (e.g., 20 V) is applied to a selected control gate in a NAND block, and an intermediate potential $V_M$ (e.g., 10 V) is applied to the remaining non-selected control gates. A potential $V_{SS}$ or $V_{bitH}$ (8 V) is applied to the bit line in accordance with data. When the potential $V_{SS}$ is applied to the bit line ("0" write operation), the potential is transferred to the selected memory cell, and electrons are injected into the floating gate. As a result, the threshold value of the selected memory cell shifts in the positive-value direction (normally this state is defined as a "0" state). When the potential $V_{bitH}$ is applied to the bit line ("1" write operation), since no electrons are injected into the memory cell, the threshold value of the memory cell does not change and remains negative. The potential $V_M$ is applied to the drain-side selection gate to transfer the bit line potential.

A data read operation is performed as follows. The control gate of a selected memory cell in a NAND block is set at $V_{SS}$, and the remaining control gates and the selection gates are set at $V_{CC}$. In this state, it is checked whether a current flows in the selected memory cell. The readout data is latched in a sense amplifier/data latch circuit.

A write/verify cycle will be described below.

After write data is input, a high voltage (e.g., 20 V) is applied to selected control gates for a set time (e.g., 40 g sec). Thereafter, a read operation is performed to confirm the completion of the write operation. If there are any memory cells which have undergone an insufficient write operation, a write operation is performed again with respect to these memory cells by applying a voltage of 20 V thereto for 40 g sec. At this time, with respect to memory cells which have undergone a sufficient write operation, the potential $V_{bitH}$ is applied to the bit line to prevent further electron injection. That is, the write operation with a voltage of 20 V and a writing time of 40 μ sec is repeated until the data is completely written in all the memory cells.

Table 1 shows potentials at the respective regions in this case.

TABLE 1

| | Number of Times of Write Operations | First Time | Second Time | Third Time | Fourth Time | Fifth Time |
|---|---|---|---|---|---|---|
| ($V_{bitH}$) | bit line "1" | 8 V | 8 V | 8 V | 8 V | 8 V |
| | bit line "0" | $V_{SS}$ | $V_{SS}$ | $V_{SS}$ | $V_{SS}$ | 8 V |
| ($V_M$) | $SG_D$ | 10 V | 10 V | 10 V | 10 V | 10 V |
| ($V_M$) | $CG_1$ to $CG_7$ | 10 V | 10 V | 10 V | 10 V | 10 V |
| ($V_{PP}$) | $CG_8$ (selected) | 20 V | 20 V | 20 V | 20 V | 20 V |
| | $CG_s$ | $V_{SS}$ | $V_{SS}$ | $V_{SS}$ | $V_{SS}$ | $V_{SS}$ |

In the above write method of verifying data in units of blocks (or chips), a method of writing data while increasing the voltage (high voltage $V_{PP}$) applied to each control gate so as to shorten the programming time is known (to be referred to as a chip-by-chip verify voltage increasing method hereinafter).

This write method will be described below with reference to FIG. 1.

There are variations in process parameters and threshold value among the respective memory cells. For example, in this case, the threshold value of a memory cell having the minimum threshold value (i.e., a hardest cell $M_2$ to write thereto) is set to be $V_{th}=-4$ V (A0 in FIG. 1); a memory cell having the maximum threshold value (i.e., an easiest memory cell $M_1$ to write thereto) is set to be $V_{th} = -1$ V (B0 in FIG. 1); and the threshold value of a memory cell in which a "0" is written is set to fall within the range of 0.5 V to 2 V.

A page (or a chip) is selected first.

The potential $V_{SS}$ (e.g., 0 V) for a "0" write operation or the potential $V_{bitH}$ (e.g., 10 V) for a "1" write operation is applied to the bit line connected to each memory cell of the selected page in accordance with the data to be written.

Thereafter, the first write operation is performed by applying the high voltage $V_{PP}$ (e.g., 18.5 V) to each selected word line (i.e., the control gate of each selected memory cell).

Upon completion of the first write operation, it is checked whether the threshold value $V_{th}$ of each memory cell has reached a completion determination level (verify operation). At this time, the threshold value $V_{th}$ of the memory cell $M_1$ is 0 V (B1), and the threshold value $V_{th}$ of the memory cell $M_2$ is −3 V (A1).

Since both the threshold values $V_{th}$ of the memory cells $M_1$ and $M_2$ are lower than a predetermined value, it is determined that the write processing is not completed. As a result, a constant voltage $V_{PP}$ (e.g., 19.5 V) higher than the voltage applied in the first write operation is applied to each selected word line, thus performing the second write operation. With the second write operation, the threshold value $V_{th}$ of the memory cell $M_1$ becomes 1 V (B2), and hence falls within the predetermined range. However, the threshold value $V_{th}$ of the memory cell $M_2$ is −0.5 V (A2), and hence falls outside the predetermined range. Therefore, it is determined that the write processing is not completed.

In order to perform a write operation with respect to the memory cell $M_2$, a constant voltage $V_{PP}$ (e.g., 20.5 V) higher than the voltage applied in the second write operation is applied to each selected word line, thus performing the third write operation. Subsequently, verify and write operations are performed, while the voltage of the selected word line is gradually increased, until the write processing with respect to the hardest memory cell $M_2$ to write thereto is completed (the threshold value falls within the predetermined range).

This method is disclosed in, e.g., Jpn. Pat. Appln. KOKAI Publication No. 61-239497.

In the above method, the voltage $V_{PP}$ applied to the selected word line is sequentially increased until all the memory cells in a selected page are programmed. The finally applied voltage $V_{PP}$ (= 21.5 V) is equally applied to both the hardest memory cell to write thereto and the easiest memory cell to write thereto. That is, data is written in all memory cells by using the same voltage $V_{PP}$.

The programming time, therefore, can be shortened. However, the easiest memory cell to write thereto is subjected to over-programming.

In order to solve the above problem, a method of verifying memory cells in units of bits (to be referred to as a bit-by-bit verify fixed voltage method hereinafter) may be used.

This method will be described below with reference to FIG. 2.

There are process variations and variations in the threshold voltage among the respective memory cells. For example, in this case, a memory cell having the minimum threshold value (i.e., an slowest memory cell $M_2$ to write thereto) is set to be $V_{th} = -3$ V (C0 in FIG. 2); a memory cell having the maximum threshold value (i.e., a fastest memory cell $M_1$ to write thereto) is set to be $V_{th} = 0$ V (D0 in FIG. 2); and the threshold value $V_{th}$ of a memory cell in which "0" is to be written is set to fall within the range of 0.5 V to 2 V.

A given page (or a chip) is selected first.

A voltage $V_{SS}$ (e.g., 0 V) for "0" write operation or a voltage $V_{bitH}$ (e.g., 10 V) for "1" write operation is applied to a bit line connected to each memory cell of the selected page in accordance with the data to be written.

The first write operation is performed by applying a high voltage $V_{PP}$ (= 18.5 V) to each selected word line (i.e., the control gate of each selected memory cell).

Upon completion of the first write operation, it is checked whether the threshold value $V_{th}$ of each memory cell has reached a completion determination level (verify operation). In this case, the threshold value $V_{th}$ of the memory cell $M_1$ is 1 V (D1), and hence falls within the predetermined range. However, the threshold value $V_{th}$ of the memory cell $M_2$ is −2 V (C1), and hence falls outside the predetermined range. Therefore, it is determined that the write processing is not completed.

A voltage of 10 V is applied to bit lines connected to memory cells (not shown) for which no write operation is to be performed and memory cells for which data processing is completed, and a voltage of 0 V is applied to a bit line connected to memory cells for which write processing is not completed. In addition, the same voltage $V_{PP}$ (18.5 V) as that applied in the first write operation is applied to each selected word line for a slightly longer period of time than in the first write operation.

The above operation is repeated until write processing with respect to the hardest memory cell $M_2$ to write thereto is completed (the threshold value falls within the predetermined range).

This method is disclosed in, e.g., Jpn. Pat. Appln. KOKAI Publication No. 1-159895.

In the above method, since data is verified in units of memory cells, over-programming with respect to memory cells can be prevented. That is, the width of the threshold value distribution of the memory cells can be set within a predetermined (desired) range. All the memory cells on a selected page are programmed by the same voltage $V_{PP}$ (18.5 V). Since a memory cell exhibiting a low programming speed (a hard memory cell to write thereto) and a memory cell exhibiting a high programming speed (an easy memory cell to write thereto) are programmed by the same voltage, it takes much time to completely program all the memory cells.

SUMMARY OF THE INVENTION

It is an object of the present invention to provide a non-volatile semiconductor memory device which can prevent the electric breakdown and leakage current increase of a tunnel oxide film during data erase and write operations, and which can improve the reliability of each memory cell.

It is another object of the present invention to provide a non-volatile semiconductor memory device having a write verify scheme which can suppress an increase in writing time even if cell characteristics vary.

It is still another object of the present invention to provide an EEPROM which can ensure a sufficient writing voltage $V_{PP}$ margin, can reduce the width of the threshold value distribution of memory cells, and can perform electron injection at high speed.

The gist of the present invention is to program with the optimal program condition for each bit during a page programming. This technology is named as bit by bit program voltage selection page programming method. A specific embodiment is to gradually increase a writing voltage $V_{PP}$ (or gradually decrease a voltage $V_{CC}$ of a selected bit line) while a write operation/bit-by-bit verify operation cycle is repeated. The writing voltage $V_{PP}$ is increased by $\Delta V_{PP}$ for every cycle, and the writing time $\Delta t$ for one write operation is made constant. In addition, the values $\Delta V_{PP}$ and $\Delta t$ are set in such a way that the width of the threshold value distribution after a "0" write operation becomes equal to the value $\Delta V_{PP}$.

The characteristic features of the present invention will be described in more detail below.

A non-volatile semiconductor memory device according to the first aspect of the invention is characterized by comprising: a semiconductor substrate; a memory cell including source and drain regions formed in a surface region of the semiconductor substrate, and a first gate insulating film, a charge storage layer, a second gate insulating film, and a control gate sequentially stacked on the semiconductor substrate, the memory cell being capable of electrically rewriting data by exchanging charges; and means for applying a high potential to the semiconductor substrate and an intermediate potential to the control gate in a first data erase operation, and applying a high potential to the semiconductor substrate and a low potential to the control gate in the second and subsequent data erase operations, thereby removing electrons from the charge storage layer.

A non-volatile semiconductor memory device according to another first aspect of the invention is characterized by comprising: a semiconductor substrate; a plurality of memory cells, each including source and drain regions formed in a surface region of the semiconductor substrate, and a first gate insulating film, a charge storage layer, a second gate insulating film, and a control gate sequentially stacked on the semiconductor substrate, the memory cells being capable of electrically rewriting data by exchanging charges between the charge storage layers and the semiconductor substrates and being arranged in the form of a matrix; and means for applying a high potential to the semiconductor substrate and the control gate of each non-selected memory cell and applying an intermediate potential to the control gate of a selected memory cell in a first data erase operation, and applying a high potential to the semiconductor substrate and the control gate of each non-selected memory cell and applying a potential lower than the intermediate potential to the control gate of the selected memory cell in second and subsequent data erase operations, thereby removing electrons from the charge storage layer.

According to the first aspect of the present invention, before a data write operation is performed, the data in each memory cell is data "1" or "0". In this case, the threshold value of a memory cell having data "0" is higher than a reference potential. That is, a large number of electrons are stored in the charge storage layer. Thereafter, a high potential is applied to the substrate to discharge the electrons from the charge storage layer to the substrate, thereby erasing the data. When data "0" is stored, since electrons are present in the charge storage layer, a higher electric field is applied to the tunnel oxide film.

In the first aspect, the high potential is a boosted potential, the intermediate potential is a power supply potential, and the low potential is a ground potential.

According to the present invention, in the first erase operation, a high potential (to be referred to as, for example, an "H"-level potential) is applied to the substrate, and an intermediate potential (to be referred to as, for example, an "M" level) is applied to the control gate. In practice, the potential applied between the gate and the substrate corresponds to the difference between the "H"- and "M"-level potentials, and the peak electric field applied to the tunnel oxide film is reduced. At this time, the threshold value shifts in the negative-value direction, and the number of electrons in the charge storage layer decreases. In the second erase operation, for example, an "H"-level potential is applied to the substrate, and a low potential (to be referred as an "L"-level potential) or a potential lower than the "M"-level potential is applied to the control gate. With this operation, although a higher voltage is applied, the peak electric field applied to the tunnel oxide film can be suppressed because electrons are removed from the charge storage layer during the first step, and its potential is decreased. In this case, the potential of the control gate and the substrate may be inversely set and the same method may be used during the write of the memory cells.

In the above-described manner, the peak electric field applied to the tunnel oxide film is suppressed, and the problems of dielectric breakdown and leakage current can be solved.

A non-volatile semiconductor memory device according to the second aspect of the invention is characterized by comprising: a memory cell array including a plurality of memory cells, which are arranged in a matrix, capable of electrically rewriting and erasing data and connected in series such that the memory cells share drains and sources; a plurality of bit lines coupled to the drain of the memory cells; a plurality of word lines which are control gates of the memory cells; write means for, when a page write operation is to be performed, applying a first writing potential to a selected word line, applying a first bit line potential to a bit line which is connected to the selected word line and to which a memory cell in which data is to be written is connected, and applying a second bit line potential to a bit line which is connected to the selected word line and to which a memory cell in which no data is to be written is connected; and rewrite means for reading out data written by the write means, causing the write means to perform a write operation again if there is a memory cell which has undergone an insufficient write operation, and sequentially increasing the first writing potential in accordance with the number of the write operations.

The rewrite means is characterized by including means for changing the first and second bit line potentials.

According to the second aspect of the present invention, a writing voltage $V_{PP}$ applied to each selected control gate of a selected block, a bit line potential transfer potential $V_M$ applied to each non-selected control gate of the selected block and a bit line potential $V_{bitH}$ applied to each cell in which a "1" is to be written, are controlled in accordance with the number of the write/verify cycles. More specifically, a predetermined number of write operations is carried out, and the potential $V_{PP}$ is increased within predetermined ranges. For example, in a conventional scheme, the same $V_{PP}$ pulse voltage is repeatedly applied (20 V–20 V–20 V). In the present invention, the $V_{PP}$ pulse voltage is sequentially increased from 19 V to 21 V at a rate of 1 V (19 V 20 V–21 V–21 V). In addition, the potential $V_{PP}$ is increased in accordance with a predetermined relationship between the potentials $V_M$ and $V_{bitH}$. As described above, the maximum value of $V_{PP}$ (e.g., 21 V) is determined by a rated potential of the device.

With the above arrangement, the following effects can be obtained.

First, an effect obtained by decreasing the first writing potential will be described. The first writing voltage is lower than that in the conventional scheme. If a limiter exhibits a variation in the direction of higher voltages (+0.5 V), a voltage of 20.5 V is output with respect to a set voltage of 20 V in the conventional scheme. As a result, the easiest memory cell to write thereto with a 40-μ sec pulse reaches 2 V which is the upper limit of the threshold value distribution. Therefore, the maximum width of the first pulse is determined by this pulse width.

In the present invention, even if a limiter exhibits a variation in the direction of higher voltages, since the first writing voltage is set to be lower than that in the conventional scheme by 1 V, the threshold voltage change to conventional scheme by 1 V, with a 40/mec pulse, the threshold voltage of the fastest memory cell to write thereto does not exceed the upper limit of the threshold voltage distribution while with a 200/sec pulse, the slowest memory cell to write thereto can be written up to a threshold voltage higher than the lower limit of the threshold voltage distribution. As a result, process control of the limiter is facilitated to improve the yield.

Second, an effect obtained by increasing the writing voltage in the second and third operations will be described. Consider a case wherein the limiter exhibits a variation in the direction of lower voltages. In the conventional scheme, a voltage of 19.5 V is output with respect to a set voltage of 20 V. In this case, a writing time of 400 μ sec is required to write data in the slowest memory cell to write thereto up to a lower limit of 0.5 V. In the above case with the minimum pulse width being 40 μ sec, write and verify operations must be repeated 10 times at maximum.

According to the present invention, since the writing voltage is gradually increased, the voltage of the first write pulse is lower than that in the conventional scheme. However, the writing voltage is increased in the second and third operations. Therrefore, even if the voltage in the third and subsequent operations is fixed, data is written in the memory cell up to the threshold value lower limit (0.5 V) with five writing operations using a 40-μ sec write pulse. The writing time is shortened to ½ the writing time in the conventional scheme. The writing time is shortened more as the threshold value distribution (calculated as 1 V in the above case) without a verify operation expands.

Third, the reliability of a memory cell will be described. It is known that deterioration of a memory is greatly associated with the maximum electric field applied to the tunnel oxide film in a write operation. Consider the easiest memory cell to write thereto in a case wherein a limiter exhibits a variation in the direction of higher voltages in a conventional method. Before the first write operation, each memory cell is in an erased state and has a negative threshold value. In general, a fast memory cell to write thereto is a memory cell which can be easily erased, and hence has a large negative threshold voltage. When a writing voltage exhibiting a variation in the direction of higher voltages is applied to this memory cell, a very high electric field is applied to the tunnel oxide film, resulting in a deterioration of the memory cell.

According to the present invention, since the writing voltage for the first write operation is set to be low, only a low electric field is applied to the tunnel oxide film as compared with the conventional method. Therefore, a deterioration of the memory cell can be suppressed.

Fourth, consider a case wherein the bit line potential transfer voltage $V_M$ applied to each nonselected control gate of a selected block and the bit line potential $V_{bitH}$ applied to each cell in which a "1" is written are increased with an increase in $V_{PP}$.

$V_{PP}$ and $V_{bitH}$ are respectively applied to the control gate and source/drain of each memory cell in which a "1" is written and each memory cell in which a "0" is completely written so as not to inject electrons therein any more. Therefore, a write error can be prevented by increasing $V_{bitH}$ with an increase in $V_{PP}$. For this reason, the voltage $V_M$ of each non-selected gate is increased to transfer $V_{bitH}$. Since each memory cell connected to a non-selected control gate is subjected to a weak write mode in which $V_M$ and $V_{SS}$ are respectively applied to the gate and the source/drain, $V_{PP}$ and $V_{bitH}$ need to be increased proportionately to prevent a write error.

As described above, according to the present invention, an improvement in the reliability of each memory cell and a high-speed write operation can be achieved at the same time.

A non-volatile semiconductor memory device according to the third aspect of the invention is characterized by further comprising means for setting a rise time of a first write pulse to be longer than a rise time of second and subsequent pulses in a data write operation using a plurality of pulses in addition to the device of the first aspect.

The effects of the third aspect of the present invention will be described below. Consider an EEPROM in which a data write or erase operation is performed by supplying an F-N tunnel current to the entire gate insulating film of a memory cell to store negative or positive charges in the charge storage layer. It is known that in general, as the F-N tunnel current flows in the gate insulating film, a leakage current in the low-electric-field region increases, and the data holding characteristics deteriorate. It is also known that the degree of this deterioration in the gate insulating film depends on the electric field applied to the gate insulating film, and can be suppressed by reducing the electric field.

In a memory cell, letting $C_1$ be the capacitance of a capacitor constituted by the substrate and the charge storage layer, $C_2$ be the capacitance of a capacitor constituted by the charge storage layer and the control gate, $V_{PP}$ is the potential applied to the control gate in a write operation, $V_1$ is the potential applied to the capacitance $C_1$, Q be the charges stored in the charge storage layer, and $T_{ox}$ be the thickness of the gate insulating film, the potential Vfg of the charge storage layer can then be given by: $V_{fg} = V_{PP} \times C_2/(C_1+C_2) + V_1 \times C_1/(C_1+C_2) + Q/(C_1+C_2)$, and the electric field Eox applied to the gate insulating film can be given by: $E_{ox} = (V_{fg}-V_1)/T_{ox}$.

In an EEPROM using n-channel cell transistors, a write operation is performed by injecting electrons into a charge storage layer to store electrons therein. It is, therefore, apparent that the electric field $E_{ox}$ decreases as write processing progresses. In this case, injection of electrons is performed by using the F-N tunnel current, and the intensity of the F-N tunnel current is highly proportional to the electric field $E_{ox}$ applied to the gate (tunnel) insulating film. Therefore, a decrease in the electric field $E_{ox}$ with the progress of write processing is equivalent to a reduction of the in electron injecting rate with the progress of write processing.

Similar to the first aspect of the present invention, a high voltage as the voltage $V_{PP}$ is required when write processing progresses to a certain extent, but a sufficient injecting rate can be obtained by using a relatively low voltage as the voltage $V_{PP}$ in the initial period of the write processing. At the same time, the maximum value of the electric field $E_{ox}$ applied to the gate insulating film can be suppressed to a low value by decreasing the voltage $V_{PP}$ in the initial period of the write processing, thereby reducing a deterioration of the gate insulating film. More specifically, this effect can be obtained by prolonging the rise time of the first pulse of a plurality of pulses in a write operation. As the rise time is prolonged, a greater effect is expected. However, in consideration of the writing speed, it is not practical to prolong the rise time too much.

In a write operation during the second and subsequent pulses, since a certain amount of charges are already stored in the charge storage layer, even if the pulse rise time is prolonged, the effect on the deterioration of the gate insulating film is not as much as in the first write operation. Therefore, the pulse rise time need not be prolonged any more. The extent to which the rise time of the first pulse is prolonged is determined in consideration of the writing speed. However, if at least the rise time of the first pulse is set to be longer than the normal rise time (the rise time of the second and subsequent pulses), the deterioration in the gate insulating film can be suppressed as compared with that in a normal write operation.

According to the first to third aspects of the present invention, since the peak electric field applied to the tunnel oxide film in a data erase or write operation can be suppressed, the dielectric breakdown of the tunnel oxide film and an increase of the leakage current can be prevented, thus improving the reliability of each memory cell. A write verify scheme can be realized, in which even if cell characteristics vary, the prolongation of the writing time can be suppressed by controlling the writing potential in accordance with the number of the write operations.

A non-volatile semiconductor memory device according to the fourth aspect of the invention is characterized by comprising: a semiconductor substrate; a memory cell array constituted by memory cells capable of electrically rewriting data and arranged in the form of a matrix, each of the memory cells being formed by stacking a charge storage layer and a control gate on the semiconductor substrate; threshold value changing means for applying a threshold value changing voltage pulse between the control gate and the semiconductor layer to change the threshold value of each of an arbitrary number of memory cells in the memory cell array; threshold value verify means for detecting the states of the arbitrary number of memory cells after application of the threshold value changing voltage pulse; threshold value re-changing means for applying a threshold value changing voltage pulse to a memory cell, of the arbitrary number of memory cells, whose threshold value has not reached a desired threshold value yet, for a time $\Delta t$, thereby changing the threshold value again; and repeating means for, after a threshold value changing operation and a threshold value verify operation are respectively performed by the threshold value changing means and the threshold value verify means, repeating a threshold value rechanging operation by the threshold value re-changing means and the threshold value verify operation until the threshold value of the memory cell reaches the desired value, wherein the threshold value re-changing means includes means for increasing a potential of the threshold value changing voltage pulse by a pulse peak value increase $\Delta V_{PP}$ every time a threshold value re-changing operation is performed, and the repeating means includes means for electrically erasing or writing data such that the width of a threshold value distribution of the memory cell whose threshold value has reached the desired threshold value becomes $|\Delta V_{PP}|$.

A non-volatile semiconductor memory device according to another fourth aspect of the invention is characterized by comprising: a memory cell array constituted by memory cells capable of electrically rewriting data and arranged in the form of a matrix, each of the memory cells being formed by stacking a charge storage layer and a control gate on a semiconductor layer; erase means for performing an erase operation to set data in each memory cell of the memory cell array to "0"; pulse applying means for applying threshold value changing voltage pulses ($V_{pp1}$, $V_{pp2}$, ..., $V_{ppn}$) corresponding to write data ("1", "2", ..., "n") between the control gate and the semiconductor layer to change a threshold value of each of an arbitrary number of memory cells in the memory cell array; threshold value verify means for detecting states of the arbitrary number of memory cells upon application of the threshold value changing voltage pulses; rewrite pulse applying means for applying threshold value changing voltage pulses corresponding to the write data to memory cells, of the arbitrary number of memory cells, whose threshold value values have not reached the desired threshold values ($V_{th1}$, $V_{th2}$, ..., $V_{thn}$) corresponding to the write data ("1", "2", ..., "n"), thereby changing the threshold values again in accordance with the write data; and repeating means for, after a threshold value changing operation and a threshold value verify operation are respectively performed by the write pulse applying means and the threshold value verify means, repeating a threshold value re-changing operation by the rewrite pulse applying means and the threshold value verify operation until the threshold values of the memory cells reach the desired values corresponding to the write data, wherein the write pulse applying means includes means for setting the threshold value changing voltage pulses according to $V_{pp1} = V_{pp2} - \Delta V_{ppd2} = V_{pp3} - \Delta V_{ppd3} = \ldots = V_{ppn} - \Delta V_{ppdn}$, and the rewrite pulse applying means includes means for setting the desired threshold values according to $V_{thi} - V_{thi-1} = \Delta V_{ppdi}$ (i=2, 3, ..., n).

The preferred embodiments of the fourth aspect of the present invention are as follows.

(1) The write pulse applying means includes means for applying a threshold value changing voltage pulse for a time $\Delta t_0$, the rewrite pulse applying means includes means for applying a threshold value changing voltage pulse for a time $\Delta t$, and means for increasing the threshold value changing voltage pulse by a pulse peak value increase $\Delta V_{PP}$ every time a threshold value re-changing operation is performed, and the repeating means includes means for electrically writing data such that the width of the threshold value distribution of the memory cell whose threshold value has reached the desired threshold value becomes $|\Delta V_{PP}|$.

(2) The rewrite pulse applying means includes means for keeping the peak value of the threshold value changing voltage pulse constant.

(3) The rewrite pulse applying means includes means for increasing a peak value of a threshold value changing voltage pulse by a pulse peak value increase $\Delta V_{PP}$ for a time corresponding to a pulse width $\Delta t$, and means for increasing the peak value of the threshold value changing voltage pulse by $\Delta V_{PP} \times \Delta t_0 / \Delta t$ for a time corresponding to a pulse width $\Delta t_0$.

(4) The rewrite pulse applying means includes means for increasing the peak value of the threshold value changing voltage pulse by a pulse peak value increase $\Delta V_{PP}$ at a predetermined increase rate for a time corresponding to a pulse width $\Delta t$, and means for increasing the peak value of the threshold value changing voltage pulse by $\Delta V_{PP} \times \Delta t_0/\Delta t$ at a predetermined increase rate for a time corresponding to a pulse width $\Delta t_0$.

(5) A threshold value changing pulse width $\Delta t_0$ used in a threshold value changing operation is equal to a threshold value changing pulse width $\Delta t$ used in a threshold value rechanging operation.

(6) A threshold value changing pulse width $\Delta t_0$ used in a threshold value changing operation is larger than a threshold value changing pulse width $\Delta t$ used in a threshold value rechanging operation.

In the present invention, the writing voltage $V_{PP}$ is gradually increased with the writing time. With this operation, write processing with respect to a fast memory cell to write thereto is completed by using a relatively low writing voltage $V_{PP}$, and write processing with respect to a slow memory cell to write thereto is performed by using a relatively high writing voltage $V_{PP}$, thereby obtaining a wide writing voltage $V_{PP}$ margin.

To set the values $\Delta V_{PP}$ and $\Delta t$ such that the width of the threshold value distribution after the "0" write operation becomes $\Delta V_{PP}$ means that the threshold value shift amount in one cycle is almost equal to the constant value $\Delta V_{PP}$. Therefore, the voltage applied to an insulating film in which a tunnel current flows is controlled to be uniform in every cycle, and the maximum value of the voltage can be reduced, resulting in an improvement in the reliability.

The preferred embodiments of the first to fourth aspects of the present invention are as follows.

(1) The memory cells construct to form a NAND cell structure by connecting the plurality of memory cells in series.

(2) A first selecting gate connected to one end of the NAND cell and the bit line; a second selecting gate connected to another end of the NAND cell; and a source line connected to another end of the NAND cell via the second selecting gate is further provided.

(3) The plurality of memory cells construct a memory cell unit by connecting to the bit lines in parallel.

(4) The memory cells, whose common drain is connected to the bit line via a first selecting gate and common source is connected to a common source line via a second selecting gate, construct a NOR structure by connecting to the bit line in parallel.

(5) Means for setting a potential of a first write pulse to a potential to prevent overprogram for the easiest memory cell to write thereto during data write by a plurality of pulses is further provided.

(6) Means for setting a upper-limit potential of a write pulse to a rated potential of the memory cells and peripheral circuits during data write by a plurality of pulses is further provided.

According to the present invention, there is provided an EEPROM which can ensure a sufficient $V_{PP}$ margin, can reduce the width of the threshold value distribution of memory cells, and allows a high-speed electron injecting operation by gradually increasing the writing voltage $V_{PP}$ while repeating a write operation/bit-by-bit verify operation cycle. An electron discharging operation can be easily performed by inverting the polarity of the voltage of the control gate of each memory cell. In addition, the present invention can be equally applied to a device using a p-channel MOS transistor as a memory cell.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 10A and 10B are cross sectional views taken along lines 10A—10A' and 10B—10B' in FIG. 9A, respectively;

FIG. 11 is an equivalent circuit diagram of a cell array constituted by NAND cells arranged in the form of a matrix;

FIG. 14 is a flow chart showing write processing;

FIG. 16 is a circuit diagram showing a limiter circuit for realizing a write operation in the embodiment;

FIG. 17 is a block diagram showing a concept of a circuit for applying a writing potential;

FIG. 28 is a circuit diagram showing a memory cell array of NAND-type EEPROMs in the sixth embodiment of the present invention;

FIG. 30 is a diagram showing the circuit arrangement of a control gate driver in the sixth embodiment;

FIG. 31 is a circuit diagram showing the detailed circuit arrangement of a control gate driver in the sixth embodiment;

FIGS. 32A and 32B are circuit diagrams showing the detailed arrangement of a current control circuit in a control gate driver in the sixth embodiment;

FIG. 35 is a block diagram showing the arrangement of a control gate driver in the seventh embodiment of the present invention;

FIG. 36 is a circuit diagram showing the detailed circuit arrangement of a control gate driver in the seventh embodiment;

FIGS. 38A and 38B are charts showing an electron injection scheme using a verify operation and its electron injection characteristics in the eighth embodiment of the present invention.

DETAILED DESCRIPTION OF THE PREFERRED EMBODIMENTS

Embodiments of the present invention will be described below with reference to the accompanying drawings.

The gist of the present invention is to gradually increase a write pulse potential $V_{PP}$ that is applied to the control gate (or gradually decrease a potential $V_d$ of a selected bit line) of a non-volatile memory cell while write/verify cycles are repeated.

Figure 3:
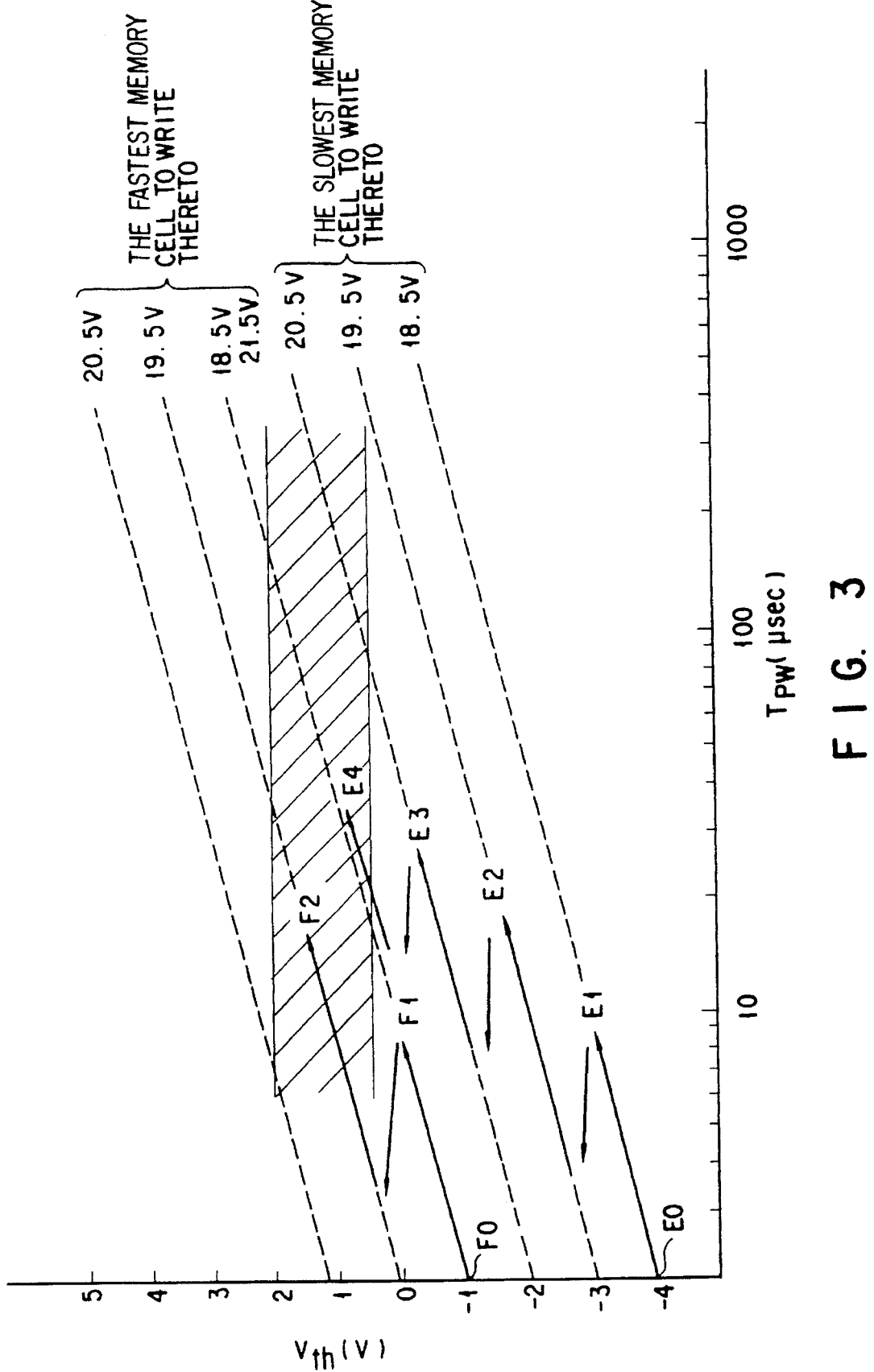
FIG. 3 is a graph for explaining the present invention.

The present invention will be described with reference to FIG. 3 in which the write processing is depicted.

In this case, a memory cell having the minimum threshold value (i.e., a hardest memory cell $M_2$ to write thereto) is set to be $V_{th}=-4$ V (E0 in FIG. 3); a memory cell having the maximum threshold value (i.e., an easiest memory cell $M_1$ to write thereto) is set to be $V_{th}=-1$ V (F0 in FIG. 3); and the threshold value $V_{th}$ of a memory cell in which "0" is to be written is set to fall within the range of 0.5 V to 2 V.

A given page, corresponding with a given word line is selected.

A potential $V_{SS}$ (e.g., 0 V) for a "0" write operation or a potential $V_M$ (e.g., 10 V) for a "1" write operation is applied to each bit line that is connected to a memory cell of the selected page in accordance with the data to be written in each memory cell. In this case, there are process variations among the respective memory cells and variations in threshold value depending on the used states of the memory cells (i.e., $V_{PP}$ is applied to a selected page).

The first write operation is performed by applying a high voltage $V_{PP}$ (= 18.5 V) to the selected word line that corresponds with the selected page (i.e., the control gate of each memory cell in the selected page).

Upon completion of the first write operation, it is checked whether the threshold value $V_{th}$ of each memory cell has reached a completion determination level (verify operation). In this case, the threshold value $V_{th}$ of the memory cell $M_1$ is 1 V (E1), and hence falls within the predetermined range. However, the threshold value $V_{th}$ of the memory cell $M_2$ is $-2$ V (F1), and hence falls outside the predetermined range. Therefore, it is determined that the write processing is not completed.

A voltage of 10 V is applied to bit lines connected to memory cells (not shown) for which no write operation is to be performed and memory cells for which data processing is completed, and a voltage of 0 V is applied to a bit line connected to memory cells for which write processing is not completed. In addition, a constant voltage $V_{PP}$ (19.5 V) higher than that applied in the first write operation is applied to the selected word line, thus performing the second write operation. With the second write operation, the threshold value vth Of the memory cell M1 becomes about 1 V (F2), and hence falls within the predetermined range. However, the threshold value $V_{th}$ of cell M2 is about 2 V (E2), and hence still falls outside the predetermined range. Therefore, it is determined that the write processing is not yet completed.

In order to write the "0" data in the memory cell M2, a constant voltage Vpp (e.g., 20.5 V) higher than the voltage applied in the second write operation is applied to the selected word line, thus performing the third write/verify cycle. The write/verify cycles are repeated while the voltage applied to the selected word line is gradually increased in each subsequent write operation until the write processing for the hardest memory cell M2 to write a "0" therein is completed (the threshold value falls within the predetermined range). Therefore, since memory cells having slow write characteristics are written with a higher $V_{PP}$, e.g. 21.5 V, and memory cells having fast write characteristics are written with a -Low $V_{PP}$ (e.g. 19.5 V), all memory cells are written with the optimal $V_{PP}$. The inventors call this method a bit-by-bit writing voltage selection.

With the above write processing, no memory cell is subjected to overwrite as in the increasing $V_{PP}$ method, and hte prolongation of the writing time, as occurs in the bit-by-bit verify fixed $V_{PP}$ method, can be prevented.

Figure 4:
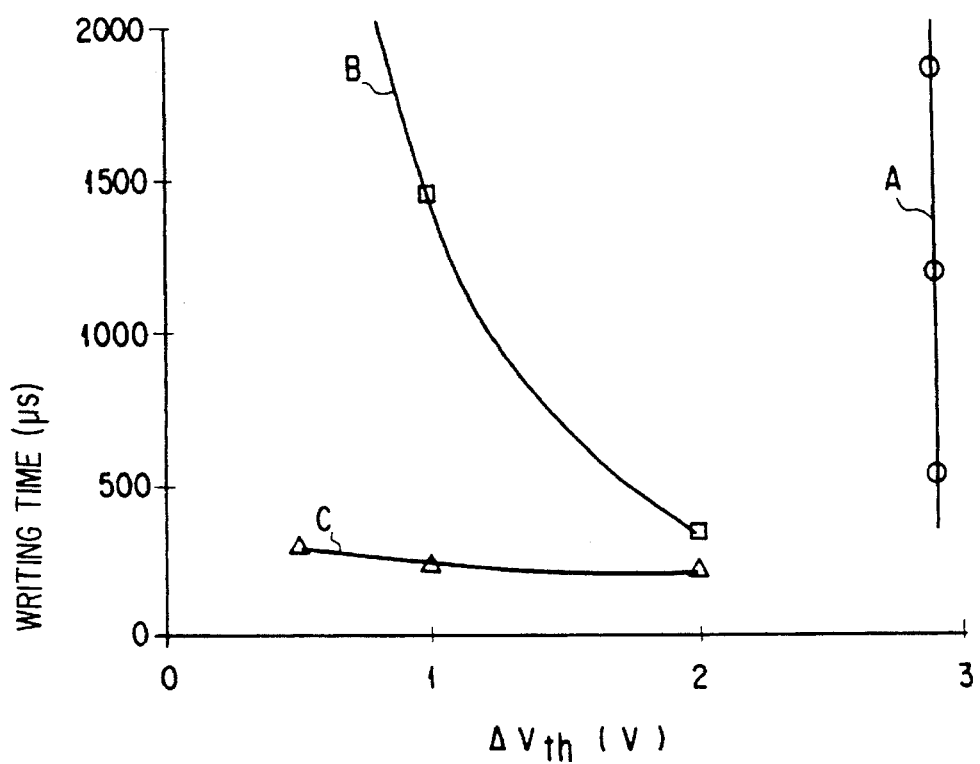
FIG. 4 is a graph showing the relationship between the width of the threshold voltage distribution of memory cells and the write time.

FIG. 4 is a graph showing the relationship between the programming time and the width of the threshold value distribution of the respective memory cells after write processing. In this graph, the ordinate indicates the programming time, and the abscissa indicates the range of threshold voltage variations. Referring to FIG. 4, a curve A indicates the case of the chip-by-chip verify voltage increasing method; a curve B, the case of the bit-by-bit verify fixed voltage method; and a curve C, the case of the present invention.

In the case of the chip-by-chip verify voltage increasing method, the width of the threshold value distribution of the respective memory cells cannot be corrected by a program, and does not depend on the programming time.

In the case of the bit-by-bit verify fixed voltage method, as variations in the threshold values of the respective memory cells after write processing are to be made small, a longer writing time is required. For example, if the width of the threshold value distribution is 2 V, the writing time is about 500 μsec. If, however, the width of the threshold value distribution is 1 V, the writing time is prolonged about three times.

In comparison with the above two methods, in case of the present invention, if the threshold volage distribution is set to be 0.5 V, the writing time is only about 300 koec. That is, the write processing can be performed with a small threhsold voltage distribution without requiring a long writing time.

Figure 5:
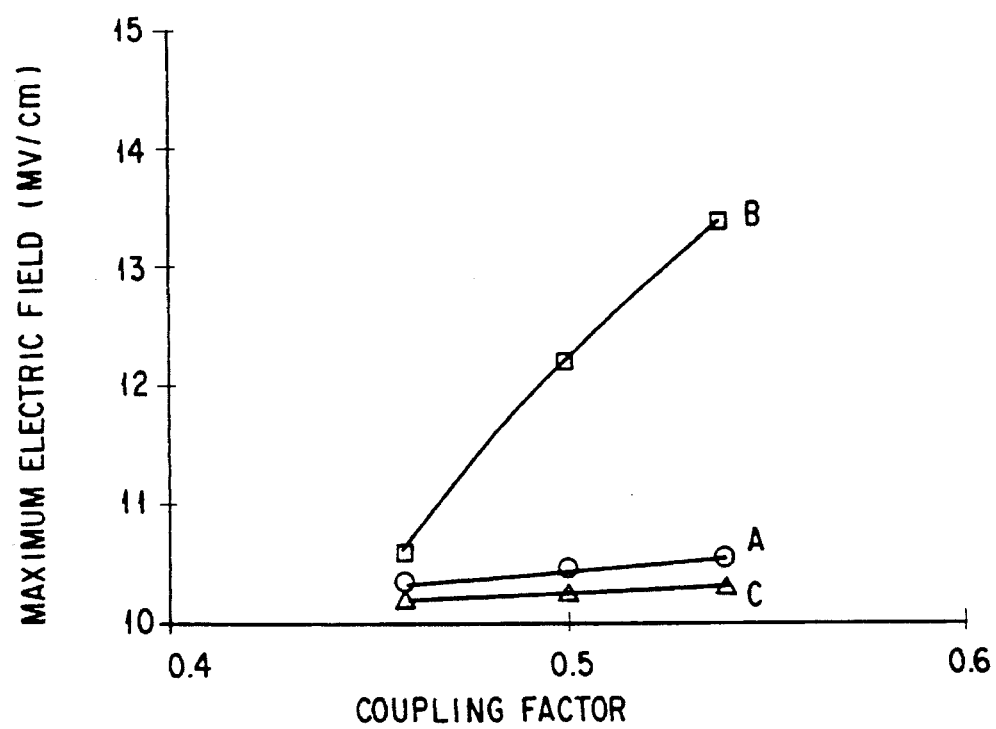
FIG. 5 is a graph showing the relationship between the maximum electric field (peak electric field) and the coupling factor.

FIG. 5 is a graph showing the relationship between the maximum electric field (peak electric field) and the coupling factor. In this graph, the ordinate indicates the maximum'electric field; and the ordinate, the coupling factor. Since the types of curves in FIG. 5 are the same as those in FIG. 4, a description thereof will be omitted.

Referring to FIG. 5, curves A and C have almost the same characteristics. A curve B indicates that as the coupling factor increases, the maximum electric field increases (if, for example, the coupling factor is 0.5, the maximum electric field is about 1.2 times that indicated by the curves A and C). Therefore, the peak electric field applied to a tunnel oxide film increase, and problems are posed in terms of dielectric breakdown and leakage current.

Figure 6:
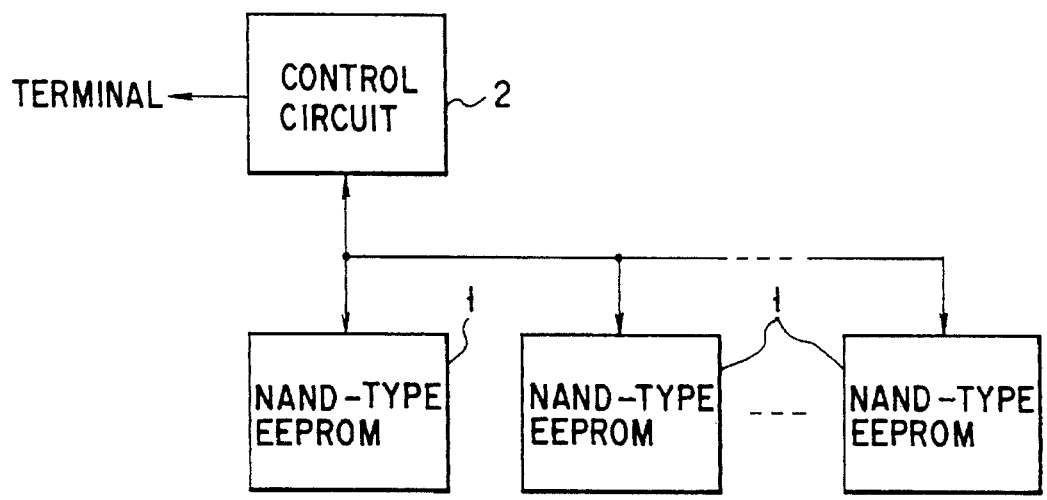
FIG. 6 is a block diagram showing a NAND-type EEPROM system arrangement according to the first embodiment of the present invention.

FIG. 6 is a block diagram showing the system arrangement of NAND-type EEPROMs according to the present invention. This EEPROM system includes a plurality of NAND-type EEPROMs 1 and a control circuit 2 for controlling the data rewrite operation with respect to each NAND-type EEPROM 1.

Figure 1:
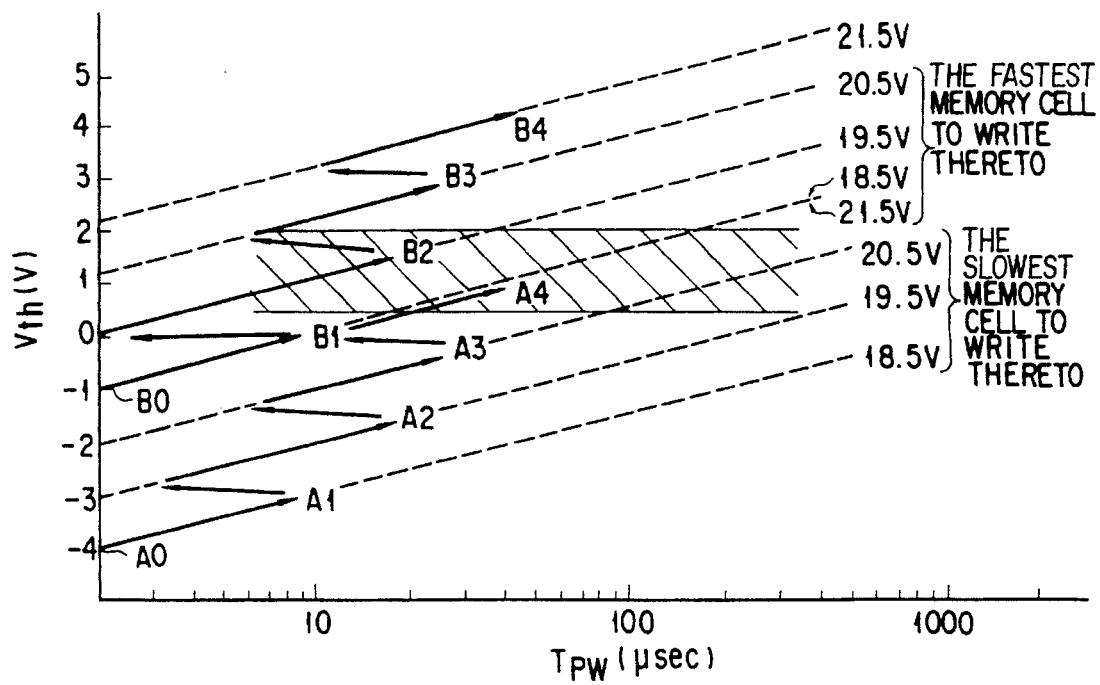
FIG. 1 is a graph for explaining a chip-by-chip verify voltage increasing method.
Figure 2:
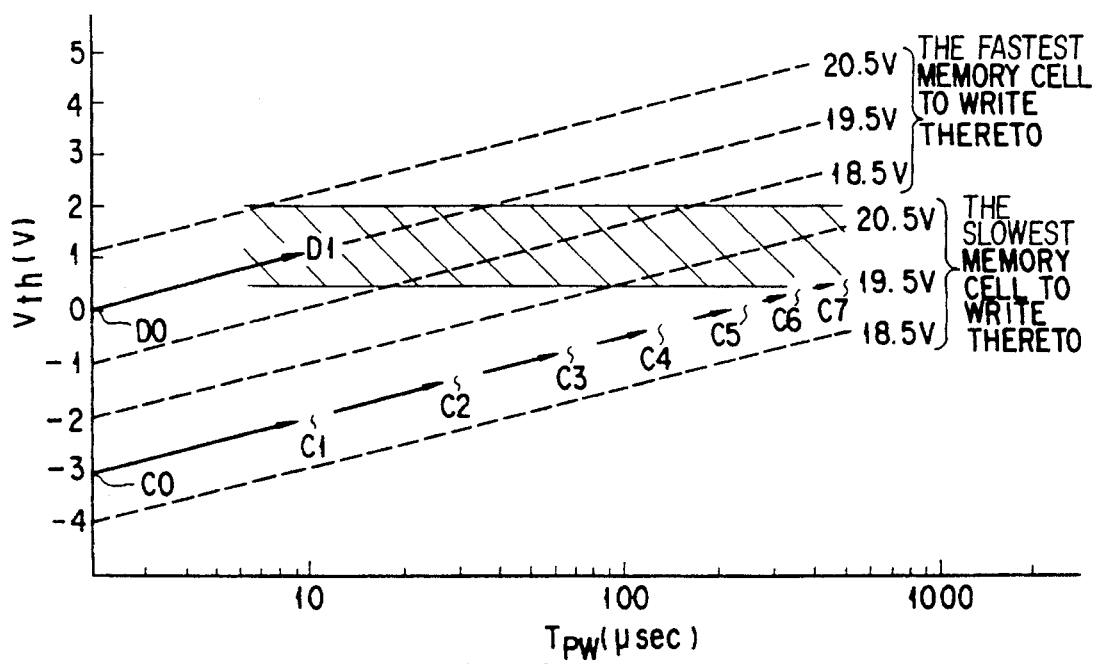
FIG. 2 is a graph for explaining a bit-by-bit verify fixed voltage method.
Figure 7A:
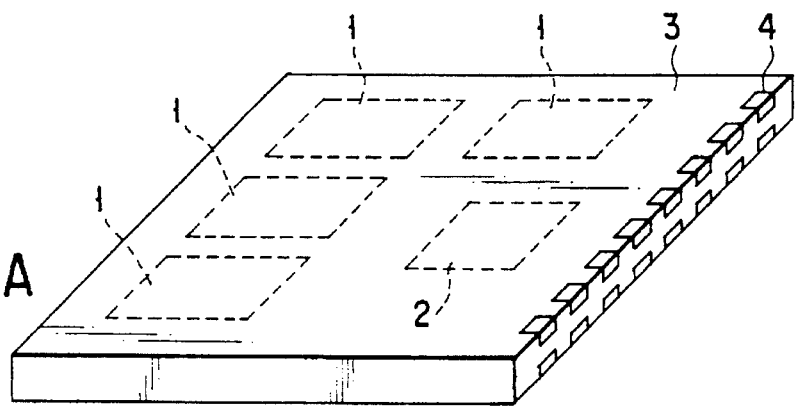
FIGS. 7A and 7B are perspective and plan views, respectively, showing an LSI memory card as an example of the system arrangement shown in FIG. 6.
Figure 7B:
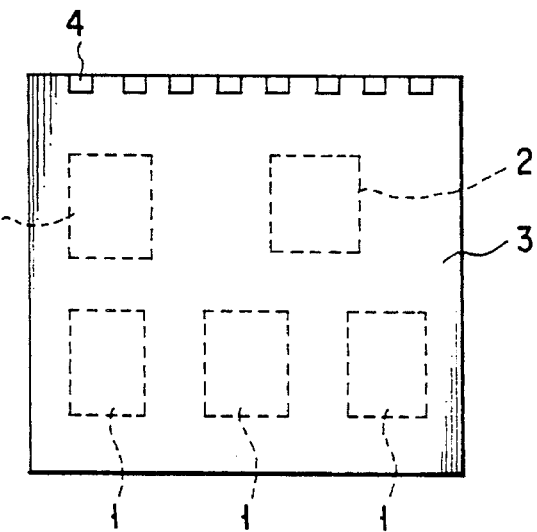

FIGS. 7A and 7B are perspective and plan views, respectively, showing an LSI memory card as an example of the system arrangement shown in FIG. 1. A card body 3 of the LSI memory card incorporates four NAND-type EEPROMs 1 and one control circuit 2. The card body 3 is connected to an external unit via a terminal 4.

Figure 8:
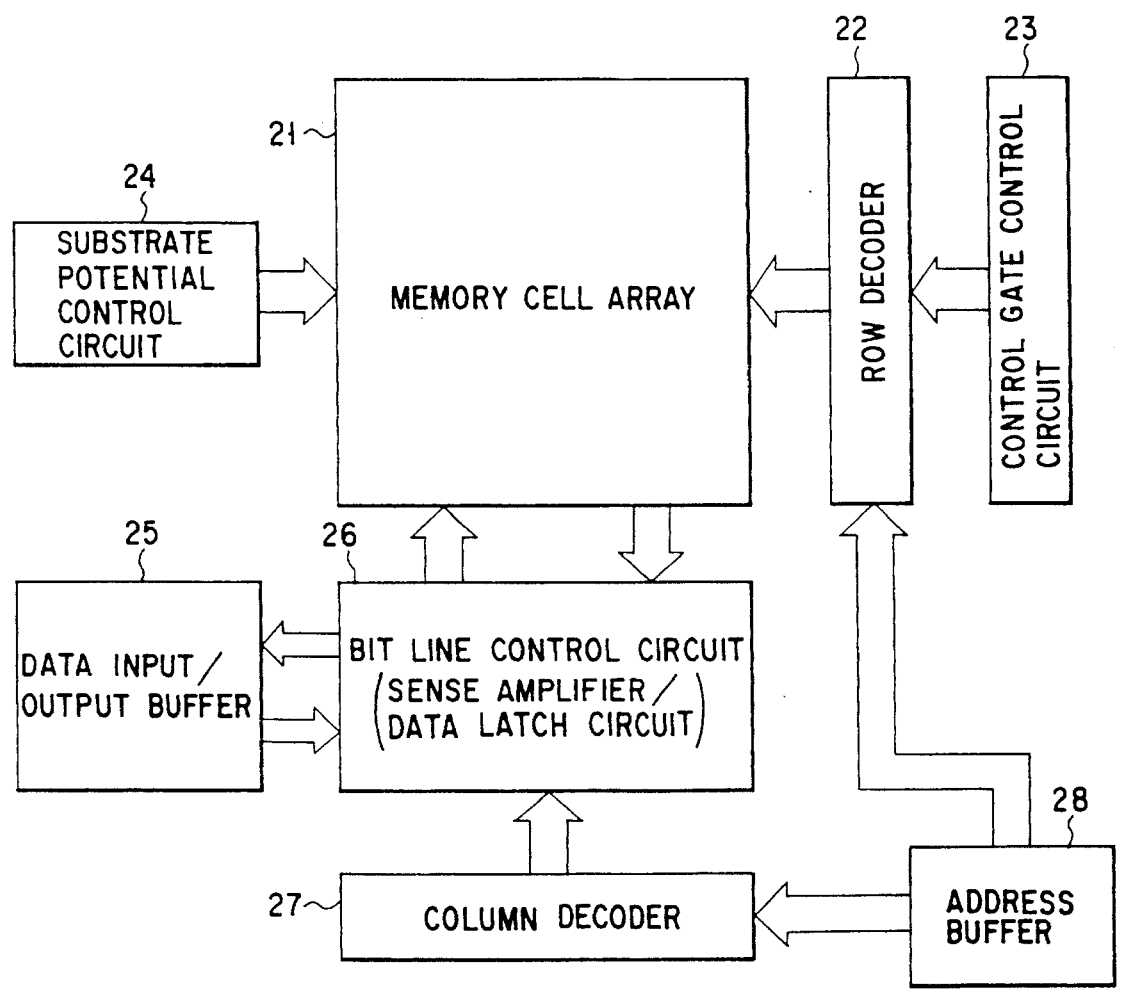
FIG. 8 is a block diagram showing the arrangement of a NAND-type EEPROM according to the first embodiment.

FIG. 8 is a block diagram showing the circuit arrangement of a NAND-type EEPROM according to the first embodiment of the present invention.

The NAND-type EEPROM of the first embodiment includes a memory cell array 21, a row decoder 22, a control gate control circuit 23, a substrate potential control circuit 24, a data input/output buffer 25, a bit line control circuit 26, a column decoder 27, and an address buffer 28.

The control gate control circuit 23 outputs predetermined control signals corresponding to data write, erase, read, and verify operations to control gate lines, of the memory cell array 21, which are selected by the row decoder 22.

The substrate potential control circuit 24 controls a p-type well, in which the memory cells are located, at the potential of 0 V in a normal operation, and at a potential $V_E$ (about 20 V) in an erase operation.

The bit line control circuit 26 performs data write and read operations with respect to the memory cell array 21. The bit line control circuit 26 is connected to the data input/output buffer 25.

The address buffer 28 transfers an input address to the row decoder 22 and the column decoder 27.

Although not shown, the NAND-type EEPROM of the first embodiment further includes write, erase, and intermediate potential generating circuits for respectively applying a writing potential $V_{PP}$, an erase potential $V_E$, and an intermediate potential $V_M$, required for data write, erase, and read operations, to control gate lines, bit lines, the substrate, and the like.

Figure 9A:
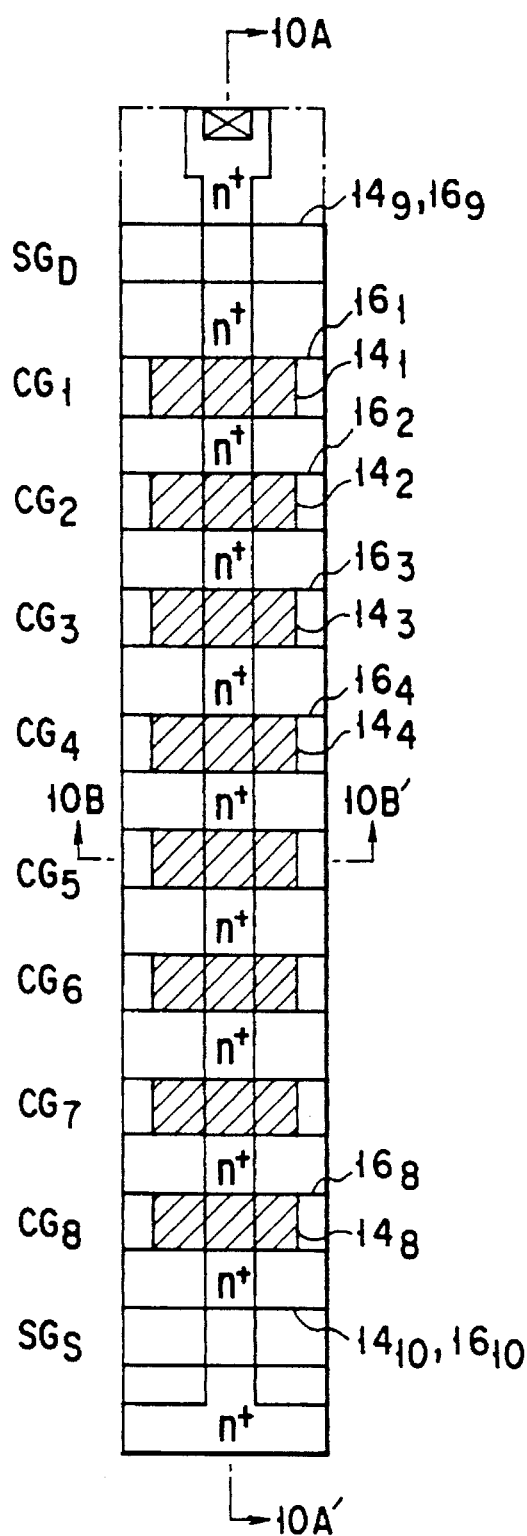
FIGS. 9A and 9B are a plan view and an equivalent circuit diagram, respectively, of one NAND cell portion of a memory cell array.
Figure 9B:
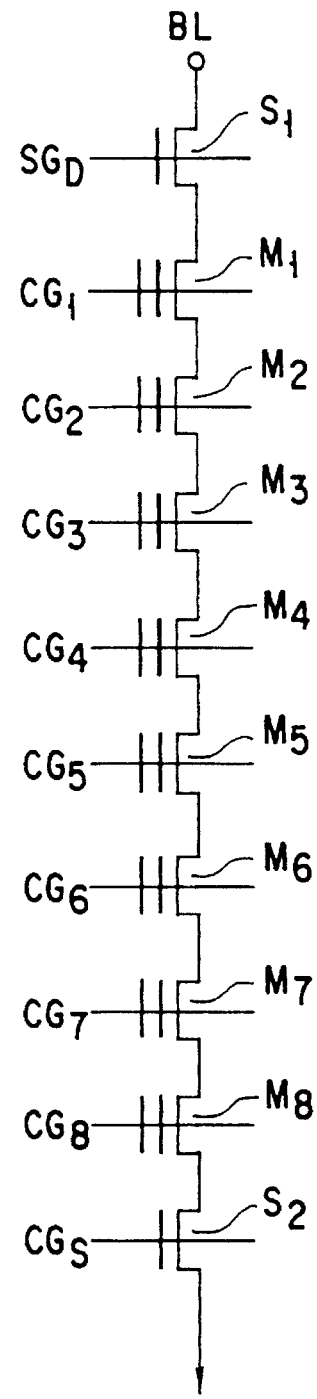

FIGS. 9A and 9B are a plan view and an equivalent circuit diagram, respectively, of one NAND cell portion of the memory cell array. FIGS. 10A and 10B are cross sectional views taken along lines 10A—10A' and 10B—10B' in FIG. 9A, respectively.

A memory cell array constituted by a plurality of NAND cells is formed in a p-type silicon substrate (or p-type well) 11 isolated from each other or other devices by an isolation oxide film 12 (e.g. LOCOS).

The arrangement of the memory cells will be described below, considering one NAND cell.

One NAND cell is constituted by eight in series-connected memory cells $M_1$ to M8. Each memory cell has the following arrangement. A floating gate 14 ($14_{1l}$, $14_2$, ···, $14_8$) is formed on an insulating layer 13 that is formed on the substrate 11 electrically isolated from the floating gate by an insulating layer 15. A control gate 16 (1611 162,——, 168) is formed on top of the floating gate 14. These memory cells are connected in series in such a manner that the respective adjacent memory cells share n-type diffusion layers 19 serving as the sources and drains of the memory cells. With this arrangement, a NAND cell is formed.

Two pairs of selection gates $14_9$ and $16_9$, and $14_{10}$ and $16_{10}$, which are formed simultaneously with the floating and control gate of each memory cell, are respectively formed at the drain and source sides of the NAND cell. The substrate having elements formed thereon is covered with a CVD oxide film 17. A bit line 18 is arranged on the CVD oxide film 17. The bit line 18 is contacted with the drain diffusion layer 19 at one end of the NAND cell.

The control gates 16 of the NAND cell are arranged in the row direction as control gate lines $CG_1$, $CG_2$, . . . , $CG_8$ serving as word lines. The selection gates $14_9$, $16_9$, $14_{10}$, and $16_{10}$ are also continuously arranged in the row direction as selection gate lines $SG_S$ and $SG_D$.

FIG. 11 is an equivalent circuit diagram of the memory cell arrays having the above NAND cells arranged in the form of a matrix.

Figure 12:
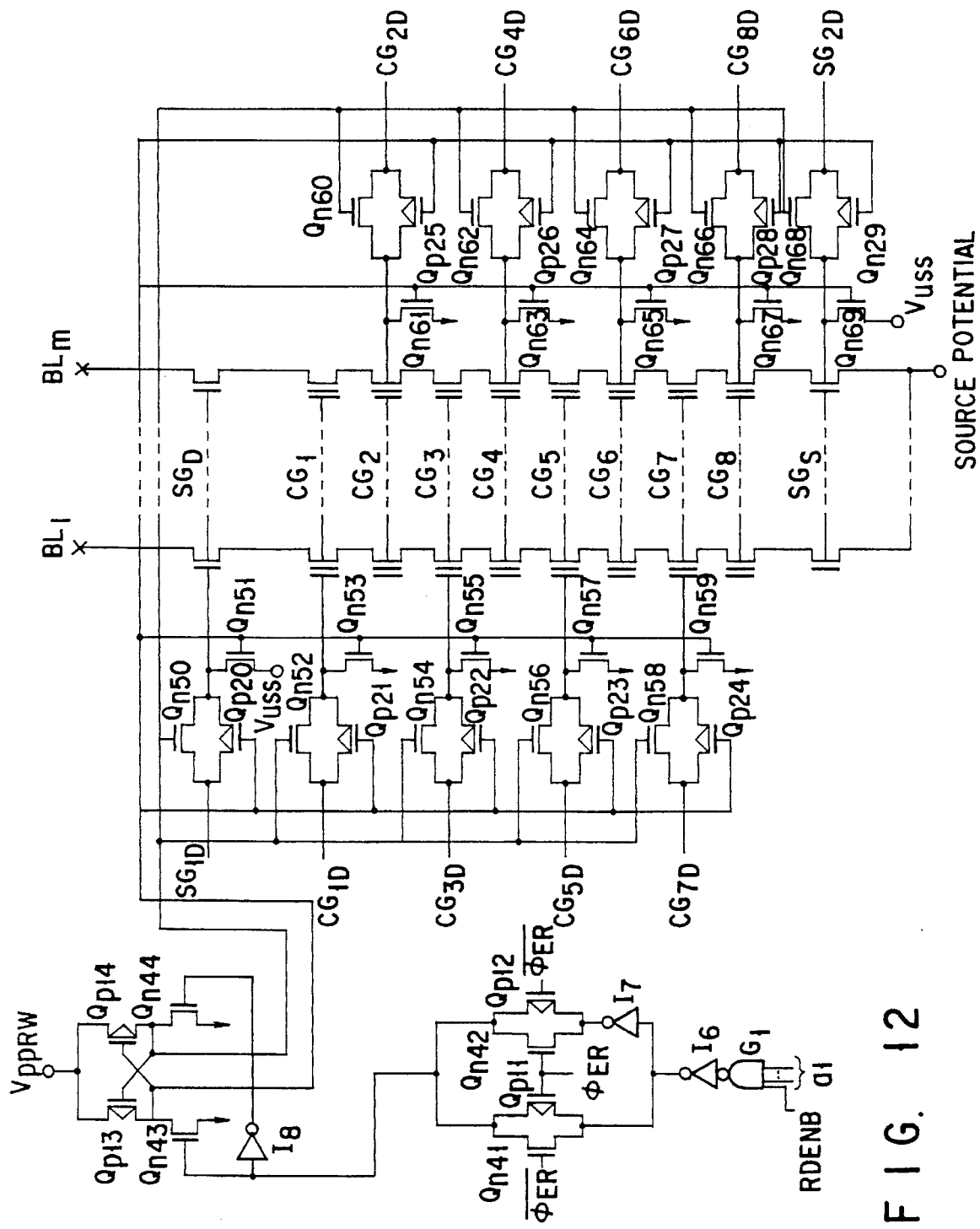
FIG. 12 is a circuit diagram showing the detailed arrangement of a row decoder of a NAND-type EEPROM.

FIG. 12 shows the detailed arrangement of the row decoder of a NA-ND-type EEPROM in the preferred first embodiment.

The row decoder includes an enable circuit constituted by E type n-channel MOS transistors $Q_{n41}$ and $Q_{n42}$ and E type p-channel MOS transistors $Q_{p11}$ and $Q_{p12}$, and a transfer circuit constituted by E type n-channel MOS transistors $Q_{n43}$ and $Q_{n44}$ and E type p-channel MOS transistors $Q_{p13}$ and $Q_{p14}$.

The row decoder is activated by an address signal $a_i$ and a decoder enable signal RDENB to select a block, of the memory cell array, which corresponds to an input address. In the erase mode, the row decoder is operated when a signal $\phi_{ER}$ is set at "H" level. The voltage $V_{ppRW}$ is connected to $V_{CC}$ in a read operation, and to $V_{PP}$ (or $V_E$) (about 20 V) in a write or erase operation, respectively.

E type the n-channel MOS transistors $Q_{n50}$ to $Q_{n69}$ and E type p-channel MOS transistors $Q_{p20}$ to $Q_{p29}$ constitute a transfer gate for transferring the selection gate potentials $SG_{1D}$ and $SG_{2D}$ and control gate potentials $CG_{1D}$ to $CG_{8D}$ and $V_{USS}$ upon reception of an output from the row decoder. Reference symbols $V_{USS}$, $SG_{1D}$ $SG_{2D}$, and $CG_{1D}$ to $CG_{8D}$ denote signals common to the row decoder.

Figure 13:
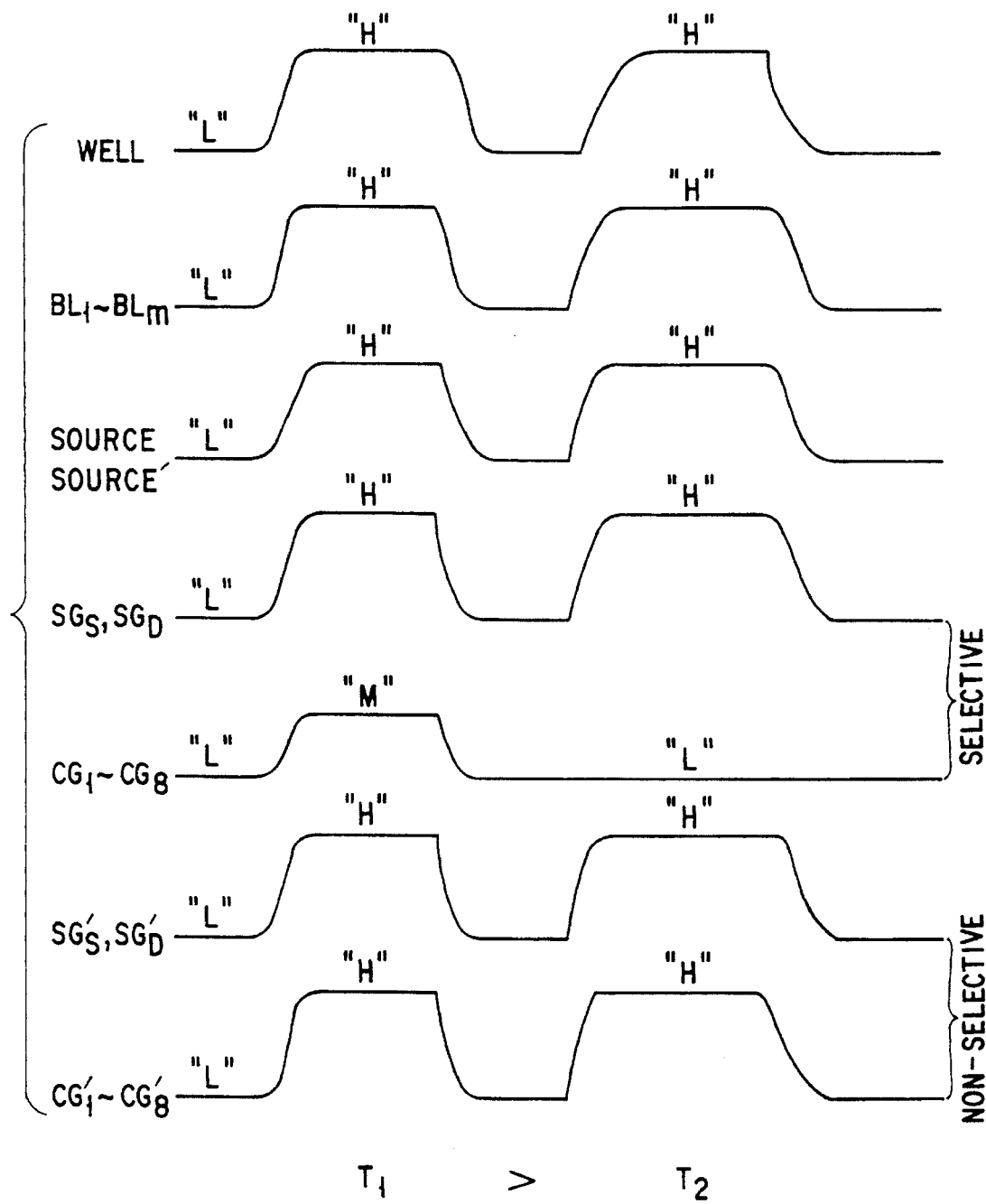
FIG. 13 is a timing chart showing the waveforms of voltages applied to a substrate, a control gate, and a selection gate in a data erase operation.

A data erase operation in the first embodiment will be described below. FIG. 13 shows the waveforms of the voltages applied to the substrate (well), the control gates CG, and select gates $SG_S$ and $SG_D$ in the erase mode.

As shown in FIG. 13, the select gates $SG_S$ and $SG_D$ and the non-selected control gates $CG_1$, to $CG'_8$ are set at "H" level in the first and second operations, whereas the selected word lines $CG_1$ to $CG_8$ are set at the "M" level in the first operation, and at the "L" level in the second operation.

As described above, during the data erase mode, in the first erase pulse, a potential of the "M" level is applied to the word lines to change the threshold voltage of the memory cells in the negative direction while the electric field applied to the tunnel oxide film is kept low.

In the second and subsequent operations, the voltage at the word lines is further lowered resulting in a further shift of the threshold voltage in the negative direction while the maximum electric field strength is reduced because some threshold voltage shift in the negative direction already occurred during the first erase pulse. With this operation method, the reliability of the EEPROM can be further improved since the reduced maximum electric field strength results in less degradation of the tunnel oxide film. In FIG. 13, the first and second erase pulse are separated pulses, however, it is possible to keep all the voltages, except for the word line voltages, at the same level until the erase mode is completed.

The data write processing in the first embodiment will be described. The write processing is performed in accordance with the flow chart shown in FIG. 14.

After the write mode is set (steps A1 and A2), data setting is performed (step A3), and a write operation is carried out on the memory cells of the selected page (step A4). Thereafter, a verify operation is performed to check whether the written data is correct (step A5). If all the data is correct, the write processing is completed (step A6). If it is determined in step A5 that all memory cells of the selected page are not yet in the desired threshold voltage range, a write operation is performed again (steps AB, A7, and A4). At this time, the writing potential $V_{PP}$ is increased, as will be described later. If the data is not properly written after, e.g., 10 repeated write/verify cycles, the flow goes to an abnormal end (steps A8 to A10).

Tables 2 to 5 show the relationships between SGD, SGS, and CG, to CG8 and the bit line potentials in the write mode. Assume that the word line CG8 is selected in this case. A "1" write operation is carried out in the case wherein the data is "1" and also in the case wherein a "0" write operation is successfully completed, and a potential equal to the writing potential at a "1" write operation is applied to the bit line to prevent further injection of electrons.

TABLE 2

| | Number of Times of Write Operations | First Time | Second Time | Third Time | Fourth Time | Fifth Time |
|---|---|---|---|---|---|---|
| ($V_{bitH}$) | bit line "1" | 8 V | 8 V | 9 V | 9 V | 9 V |
| | bit line "0" | $V_{SS}$ | $V_{SS}$ | $V_{SS}$ | $V_{SS}$ | $V_{SS}$ |
| ($V_M$) | $SG_D$ | 10 V | 10 V | 11 V | 11 V | 11 V |
| ($V_M$) | $CG_1$ to $CG_7$ | 10 V | 10 V | 11 V | 11 V | 11 V |
| ($V_{PP}$) | $CG_8$ (selected) | 19 V | 20 V | 21 V | 21 V | 21 V |
| | $CG_S$ | $V_{SS}$ | $V_{SS}$ | $V_{SS}$ | $V_{SS}$ | $V_{SS}$ |

TABLE 3

| | Number of Times of Write Operations | First Time | Second Time | Third Time | Fourth Time | Fifth Time |
|---|---|---|---|---|---|---|
| ($V_{bitH}$) | bit line "1" | 8 V | 8.5 V | 9 V | 9 V | 9 V |
| | bit line "0" | $V_{SS}$ | $V_{SS}$ | $V_{SS}$ | $V_{SS}$ | $V_{SS}$ |
| ($V_M$) | $SG_D$ | 10 V | 10.5 V | 11 V | 11 V | 11 V |
| ($V_M$) | $CG_1$ to $CG_7$ | 10 V | 10.5 V | 11 V | 11 V | 11 V |
| ($V_{PP}$) | $CG_8$ (selected) | 19 V | 20 V | 21 V | 21 V | 21 V |
| | $CG_S$ | $V_{SS}$ | $V_{SS}$ | $V_{SS}$ | $V_{SS}$ | $V_{SS}$ |

TABLE 4

| | Number of Times of Write Operations | First Time | Second Time | Third Time | Fourth Time | Fifth Time |
|---|---|---|---|---|---|---|
| ($V_{bitH}$) | bit line "1" | 9 V | 9 V | 9 V | 9 V | 9 V |
| | bit line "0" | 2 V | 1 V | $V_{SS}$ | $V_{SS}$ | $V_{SS}$ |
| ($V_M$) | $SG_D$ | 11 V | 11 V | 11 V | 11 V | 11 V |
| ($V_M$) | $CG_1$ to $CG_7$ | 11 V | 11 V | 11 V | 11 V | 11 V |
| ($V_{PP}$) | $CG_8$ (selected) | 21 V | 21 V | 21 V | 21 V | 21 V |
| | $CG_S$ | $V_{SS}$ | $V_{SS}$ | $V_{SS}$ | $V_{SS}$ | $V_{SS}$ |

TABLE 5

| | Number of Times of Write Operations | First Time | Second Time | Third Time | Fourth Time | Fifth Time |
|---|---|---|---|---|---|---|
| ($V_{bitH}$) | bit line "1" | 8 V | 8 V | 9 V | 9 V | 9 V |
| | bit line "0" | $V_{SS}$ | $V_{SS}$ | $V_{SS}$ | $V_{SS}$ | $V_{SS}$ |
| ($V_M$) | $SG_D$ | 11 V | 11 V | 11 V | 11 V | 11 V |
| ($V_M$) | $CG_1$ to $CG_7$ | 11 V | 11 V | 11 V | 11 V | 11 V |
| ($V_{PP}$) | $CG_8$ (selected) | 19 V | 20 V | 21 V | 21 V | 21 V |
| | $CG_S$ | $V_{SS}$ | $V_{SS}$ | $V_{SS}$ | $V_{SS}$ | $V_{SS}$ |

Table 2 shows a case wherein the writing potential is increased in two steps from 19 V to 21 V in 1 V steps. In this case, when the writing potential is increased by 2 V, the bit line potential and the select gate $SG_D$ potential are increased by 1 V.

Table 3 shows a case wherein as the writing potential $V_{PP}$ is increased, the bit line potential and the select gate potential $V_M$ are increased with the same value as $V_{PP}$.

Each of the above potentials is not limited to the value in the embodiment but may be properly changed. For example, in each of the above cases, the writing potential $V_{PP}$ is increased 1 V at a time. However, this potential may be increased 0.5 V or 2 V at a time. In addition, the potential need not be increased regularly. For example, the increase may be gradually decreased in the following manner: 19 V–20 V–20.5 V–20.7 V. In contrast to this, the increase may be gradually increased.

In the first embodiment, the potential is changed for each operation. However, for example, the potential may be changed for every other operation in the following manner: 19 V–19 V–20 V–20 V–21 V–21 V. Alternatively, the potential may be increased for each of set operations in the following manner: 19 V–20 V–20 V–21 V–21 V–21 V. Similarly, a high degree of freedom is allowed in methods of increasing bit line potentials $V_{bitH}$ and $V_M$. As is apparent, the two potentials may be fixed if there is a sufficient potential margin to avoid write errors.

The timings of increasing the potentials $V_{bitH}$ and $V_M$ need not coincide with the timing of the increase of the writing potential, as in the above embodiment, but may be independently controlled. In the above embodiment, $V_{PP}$ is gradually increased. However, the same effect can be obtained by decreasing the bit line potential while the writing potential $V_{PP}$ is fixed. As shown in Table 4, the bit line potential may be decreased stepwise.

Both the potentials $V_{bitH}$ and $V_M$ need not be increased. For example, only the potential $V_{bitH}$ may be increased while the potential $V_M$ is fixed (Table 5). The potentials $V_{bitH}$ and $V_M$ may also be equal to each other. In this case, since a potential drop determined by the threshold voltage occurs at the drainside select gate, the potential $V_{bitH}$ is lowered by the threshold voltage and then transferred to the memory cells. Furthermore, the potential $V_M$ applied to the select gate line $SG_D$ may differ from the potential $V_M$ applied to a non-selected memory cell.

A write verify scheme will be described with reference to the sense amplifier/data latch circuit (FF) shown in FIG. 15.

Figure 15:
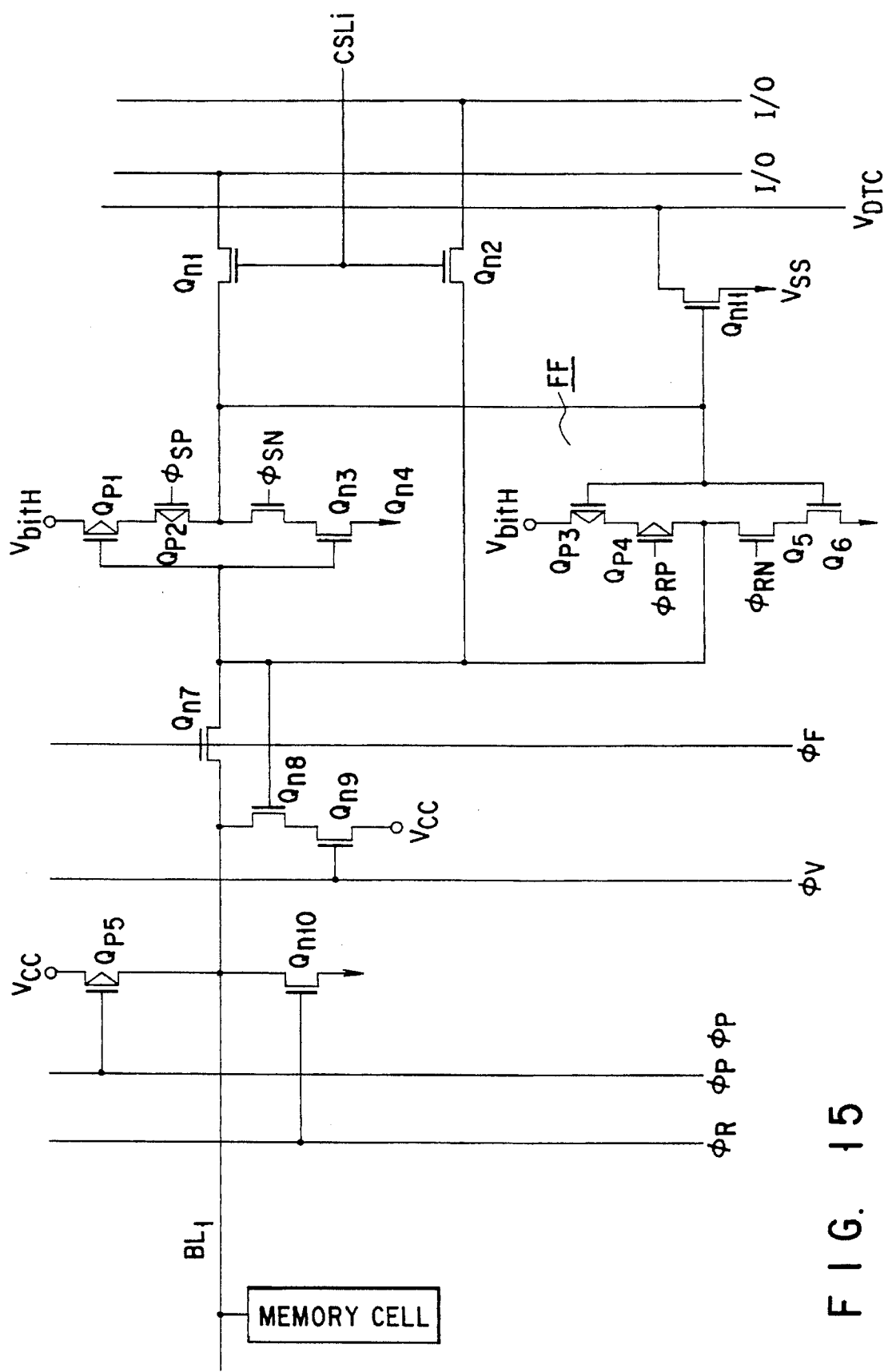
FIG. 15 is a circuit diagram showing a sense amplifier/data latch circuit.

As shown in FIG. 15, the sense amplifier/data latch circuit (FF) is constituted by a CMOS flip-flop. The first output of this circuit is connected to a bit line BLi via an n-channel MOS transistor $Q_{n7}$ which is controlled by a signal $\phi_F$. The n-channel MOS transistors $Q_{n8}$ and $Q_{n9}$, which are respectively controlled by the first output of the flip-flop FF and a signal $\phi_v$, are connected in series between the bit line BLi and $V_{CC}$. A p-channel MOS transistor $Q_{p5}$ for precharging the bit line and an n-channel MOS transistor $Q_{n10}$ for discharging the bit line are connected to the bit line. A sense line $V_{DTC}$ is connected to $V_{SS}$ via a detection transistor $Q_{n11}$ for receiving the second output from the flip-flop FF.

In the write mode, when a "1" write operation is to be performed, the bit-line-side node of the flip-flop FF is latched at "H" level, and an intermediate potential $V_M$ is transferred to the bit line. When a "0" write operation is to be performed, the bit-line-side node of the flip-flop FF is latched at "L" level, and the potential $V_{SS}$ is transferred to the bit line.

In the write verify operation, while the transistor $Q_{n7}$ is kept on, a precharge signal $\phi_{PB}$ is set at "L" level to precharge the bit line to $V_{CC}$. In this state, write data is held in the flip-flop FF. Thereafter, the select and control gates are driven. In this case, if the cell data is "1" ($V_{th}$<OV), the bit line discharged to $V_{SS}$. If the cell data is "0" ($V_{th}$>> OV), the bit line stays at the "$V_{CC}$" level. Subsequently, the select and control gates are reset, and the verify signal $\phi_V$ is set at "H" level. As a result, the bit line in which data "11", is held is charged to $V_{CC}$–$V_{th}$ Subsequently, the CMOS inverter constituting the flip-flop FF is inactivated, and the transistor $Q_{n7}$ is turned on. With this operation, the potential of the bit line is sensed, latched, and used as data to be written again.

Each bit line in which "1" is written is latched at "H" level, and each bit line in which "0" is written and for which a write operation is sufficiently performed is latched at "H" level. In addition, each bit line in which "0" is written and for which a write operation is not sufficiently performed is latched at "L" level. The write operation is continued until the bit-line-side nodes of all the flip-flops FF are latched at "H" level.

Written states are detected in the following manner.

The detection transistors of all the flip-flops FF are connected to a sense line SL. The sense line $V_{DTC}$ is connected to a p-channel transistor $Q_{PK}$. After a latch operation, the transistor $Q_{PK}$ is activated for a predetermined period of time. If write processing with respect to all the bits has been completed at this time, all the detection transistors are in an OFF state. Therefore, the sense line $V_{DTC}$ is charged to $V_{CC}$. If cells which have undergone an insufficient write operation are left, since the detection transistors corresponding to the bit lines of these cells are in an ON state, the potential of the sense line $V_{DTC}$ decreases to $V_{SS}$. Therefore, by detecting the potential of the sense line $V_{DTC}$, the completion of the write processing can be detected at once (unlike the case wherein all the bits are read out by changing the address). If the write processing is not completed, a write operation is performed again.

FIG. 16 shows a limiter circuit for realizing the above write processing. In this case, a reverse-biased diode D is connected to the output of a step-up circuit 29 via a p-type transistor $M_P$. The breakdown potential of the diode D is set to be 9.5 V.

Assume that the signals $\phi_1$ and $\phi_2$ are set at $V_{SS}$ in the first write operation. In this case, since the nodes $N_1$ and $N_3$ are short-circuited via the p-type transistors $M_{P3}$ and $M_{P4}$, the output potential $V_{PP}$ is 19 V. In the second write operation, the signals $\phi_1$ and $\phi_2$ are respectively set at $V_{PP}$ and $V_{SS}$. In this case, although the node $N_2$ and the node $N_3$ are short-circuited, the potential between the nodes $N_1$ and $N_2$ drops by a threshold voltage $V_{th}$ of the p-type transistor $M_{P1}$. Therefore, if the threshold voltage of this p-type transistor is 1 V, the potential $V_{PP}$ is 20 V. Similarly, in the third write operation, both the signals $\phi_1$ and $\phi_2$ are set at $V_{PP}$. Consequently, the output potential $V_{PP}$ is 21 V as a result of 2 voltage drops of 1 V over $M_{P1}$ and $M_{P2}$.

A desired writing potential can be obtained by controlling the limiter circuit in such a way that the output potential increases with the number of write/verify operations in the above-described manner.

The circuit shown in FIG. 16 uses two p-type transistors. However, this arrangement may be variously modified. For example, transistors having different threshold voltages may be arranged to change the increased potential, or three or more transistors having the same threshold voltage may be arranged in series to obtain 3 or more different output potentials. In addition, p- and n-type transistors may be coupled. A step-up circuit for $V_M$ and $V_{bitH}$ may be formed by a similar arrangement.

A write/verify cycle may be automatically controlled within a chip or may be externally controlled by a separate controller chip or microprocessor (CPV).

When the cycle is to be automatically controlled within the chip, a counter circuit for storing the number of times that a write/verify cycle is carried out is provided, and the output potential of the limiter is switched in accordance with an output signal from the counter circuit or the like. A ready/busy pin is set in a busy state during a write/verify cycle, and completion of the write operation is confirmed by a verify operation. Alternatively, if the write processing is not completed, after the write/verify operation is repeated a predetermined number of times, the ready/busy pin is restored to a ready state, and, for example, information indicating whether the write processing is completed is output to a specific I/O pin. Obviously, when or after the ready/busy pin is restored to the ready state, the counter circuit is reset at a predetermined time by, for example, inputting a reset signal.

When the write/verify cycle is to be controlled outside the chip, a data input command, a write command, a verify command, and the like are prepared. When a write operation is completed, a verify command is input. If the write operation is not completed, a write command is input again. At this time, a CPU or the like outside the chip stores the number of write/verify cycles. In such a control operation, for example, three types of write commands are prepared, each write command corresponding with a certain output potential $V_{PP}$ of the step-up circuit. With this arrangement, the writing potential can be controlled in accordance with the number of times of write/verify cycles.

With this write/verify method, the following effects can be obtained.

Since the writing potential for the first write operation is set to be lower than that in the conventional system, even if the breakdown voltage of the limiter diode varies in the high-potential direction, the threshold voltage of the fastest memory cells does not exceed the upper limit of the threshold voltage distribution, thus reducing the influence of the limiter diode. The number of write/verify cycles can be reduced by gradually increasing the writing potential. This shortens the writing time. In addition, since the writing potential in the first write operation in which the highest electric field is applied to the tunnel oxide film is lower than the conventional one, the deterioration of the tunnel oxide film can be reduced, and an improvement in the reliability of the memory cells can be realized.

Another write processing method will be described below.

A block of memory cells in a memory array in which data is to be written is selected. The data in the memory cells of all the NAND cells in the selected block are erased before a data write processing with respect to the block is performed. In an erase operation, 0 V is applied to all the control gate lines (word lines) CG of the selected block. At this time, the erase potential $V_E$ is applied to the select gate lines $SG_S$ and $SG_D$, the bit and source lines, and the p-type substrate (or the p-type well) on which the memory cell array is formed. Similarly, the erase potential is also applied to the control gate lines of the non-selected blocks. By keeping this bias state for, e.g., 10 ms, electrons are emitted from the floating gates of all the memory cells in the selected blocks, and the threshold voltage of each memory cell is changed in the negative-value direction.

An erase verify operation is then performed to check whether the threshold voltage of each erased memory cell has become sufficiently negative. The control gates of the memory cells in all the selected NAND cells are set at 0 V. The select gates $SG_S$ and $SG_D$ are set at, e.g., 5 V, and a read potential of, e.g., 1.5 V is applied to the bit lines. The source lines and the p-type substrate (or the p-type well) are set at 0 V. At this time, the time during which the selection gates $SG_S$ and $SG_D$ are kept at 5 V is set such a way that data "1" can be read out if the threshold voltage of each erased memory cell becomes sufficiently negative. If data "1" cannot be read out within this time, the erase/verify cycle is repeated until this condition is satisfied.

Subsequently, a data write processing is performed. In this write processing, data corresponding to the number of bits constituting a NAND cell, e.g., data corresponding to eight words (if one NAND cell is constituted by eight bits), is latched in a data latch circuit. The bit line potential is controlled in accordance with this data to write a "0" or a "1". At this time, the writing potential $V_{PP}$ is applied to the selected control gate line, and the intermediate potential $V_M$ is applied to the non-selected control gate lines. A voltage of 0 V is applied to the bit line BL when a "0" write operation is performed. The intermediate potential $V_M$ is applied to the bit line BL when a "1" write operation is performed. In this write operation, the intermediate potential $V_M$ is applied to the selection gate $SG_D$, and 0 V is applied to the selection gate $SG_S$ and the p-type substrate (or the p-type well).

By keeping the biased state for the data write operation for, e.g., 1 ms, the threshold voltage of each memory cell in which a "0" is written shifts in the positive direction, while the threshold voltage of each memory cell in which a "1" is written remains to a negative value.

Subsequently, a verify operation is performed. In the first embodiment, a verify potential $V_{VER}$ is used to check whether the threshold voltage of each memory cell in which data "0" is written is equal to or larger than the desired value. This threshold voltage is determined in consideration of the data retention characteristics of each memory cell and the value of "$V_{CC}$" is set to be, e.g., 1.5 V.

More specifically, the verify potential $V_{VER}$ is applied to the selected control gate line. $V_{CC}$ is applied to the other control gate lines. Both the select gates $SG_S$ and $SG_D$ are simultaneously selected and are set at $V_{CC}$. A read potential, e.g., 1.5 V, is applied to the bit line, and the source line is set at 0 V. With this operation, if the threshold voltage of a selected memory cell in which a "0" is written exceeds the verify potential, the selected memory cell is rendered non-conductive, and data "0" is read out. If a "0" write operation is not sufficiently performed, the threshold voltage of the selected memory cell has not reached the verify potential, the selected memory cell is conductive, and data "1" is read out. Therefore, the write/verify cycles are repeated until the threshold voltage of all selected and "0" write memory cells is larger than the verify potential.

Summarizing a write processing is performed by a number of write/verify cycles repeatedly carried out until all memory cells reach a desired cell threshold voltage.

FIG. 17 shows the concept of a circuit for applying the writing potential.

A signal from a write number counter 30 in a program controller i supplied to a ring oscillator 31 which generates in its turn a signal for the step-up circuit that contains a charge-pump circuit. In response to the signal from the write number counter, the frequency of the ring oscillator is lowered only for the writing pulse that is applied during the first write operation. As a result, the first writing pulse generated by the step-up circuit will have a longer rise time than the second and following pulses.

Figure 18:
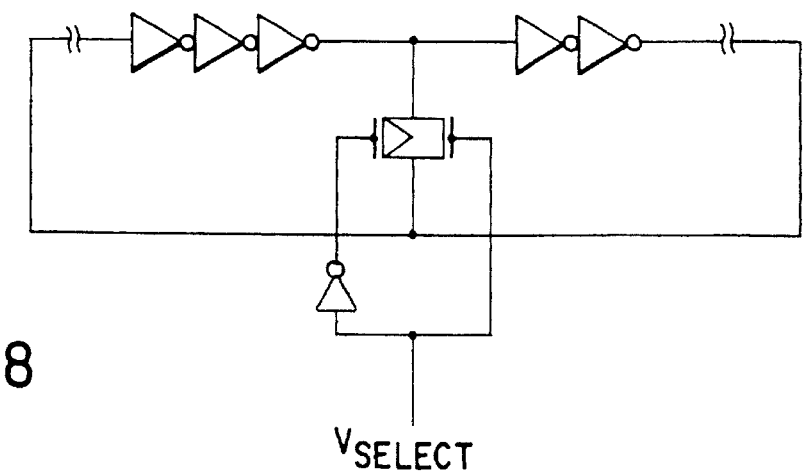
FIG. 18 is a circuit diagram showing a circuit for variably changing the period of a ring oscillator.

FIG. 18 shows a circuit for variably changing the period of the ring oscillator 31. An "L"-level potential (e.g., 0 V) is normally applied to the terminal $V_{select}$. However, an "H"-level potential (e.g., 5 V) is applied to the terminal $V_{select}$ to lower the frequency. If the above circuit for controlling the ring oscillator frequency is added to a conventional circuit, the rise time of the initial pulse can be set to be longer than that of the second and subsequent pulses. With this arrangement, the peak electric field strength in the tunnel oxide film can be reduced in comparison with the conventional arrangement and the degradation of the tunnel oxide can be reduced.

Figure 19A:
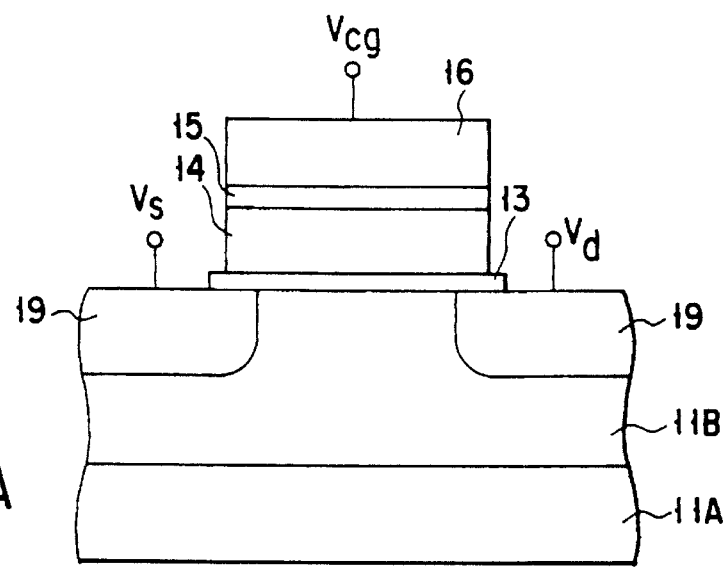
FIGS. 19A and 19B are a sectional view and an equivalent circuit diagram, respectively, of the structure of a memory cell used in the embodiment of the present invention.

FIG. 19A shows the structure of a non-volatile memory cell. The same reference numerals in FIG. 19A denote the same parts as in FIGS. 10A and 10B.

A floating gate (charge storage layer) 14 and a control gate 16 are stacked on a p-type well 11B on an n-type silicon substrate 11A. The p-type well 11B and the floating gate 14 are insulated from each other by a tunnel oxide film 13. The floating gate 14 and the control gate 16 are insulated from each other by a gate insulating film 15. An n-type diffusion layer 19 forms the source and drain of the memory cell transistor.

Figure 19B:
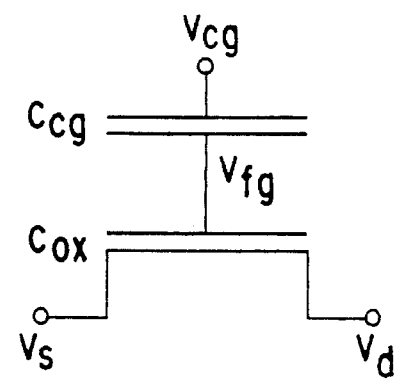
Figure 20A:
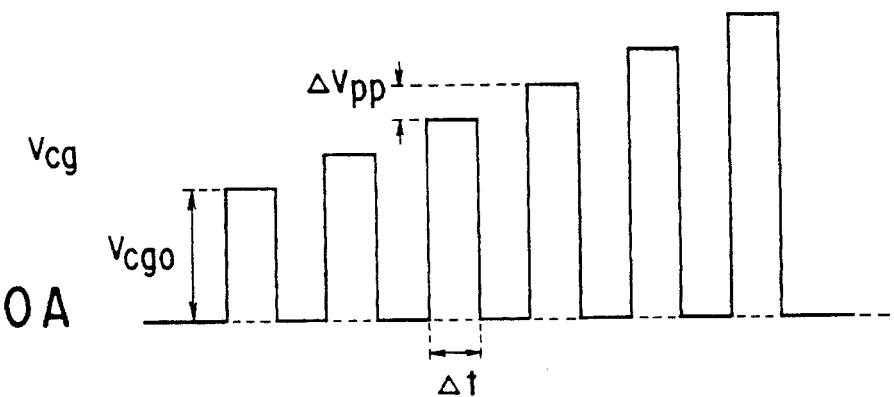
FIGS. 20A to 20D are charts showing electron injection characteristics obtained by an electron injection scheme using a verify operation in the second embodiment of the present invention when the selected cells are programmed by "0" data.
Figure 20B:
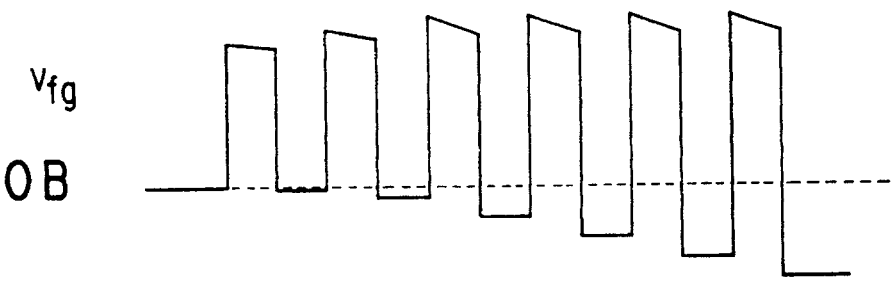
Figure 20C:
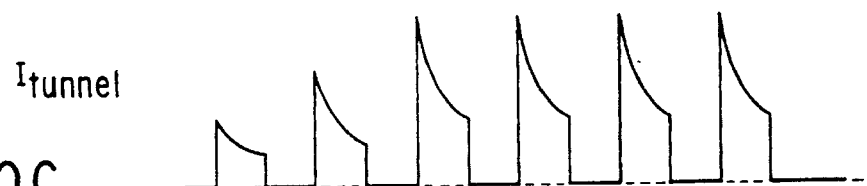
Figure 20D:
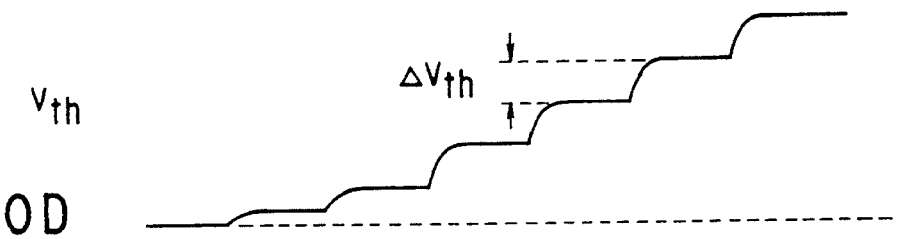
Figure 21A:
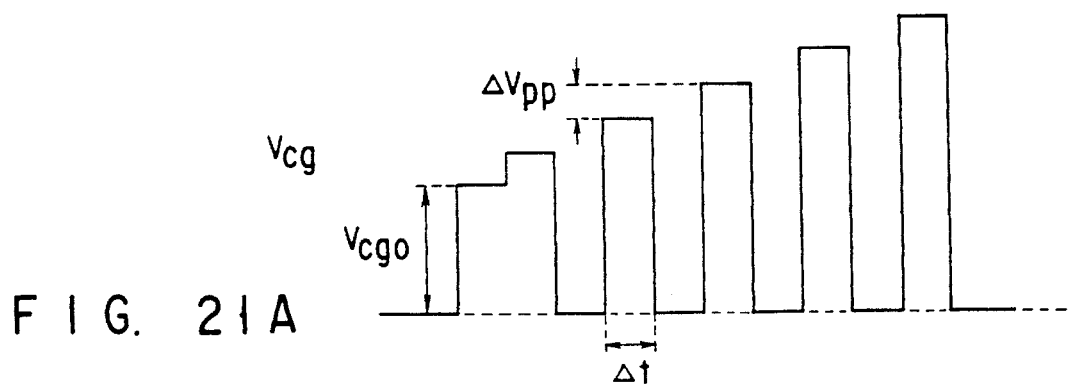
FIGS. 21A to 21D are charts showing electron injection characteristics obtained by an electron injection scheme using a verify operation in the third embodiment of the present invention.
Figure 21B:
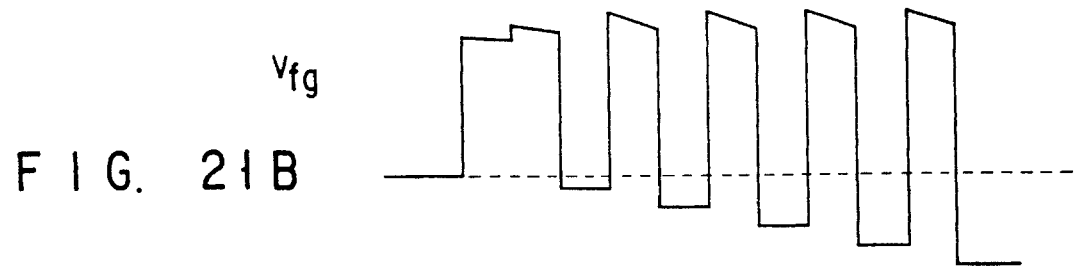
Figure 21C:
Figure 21D:
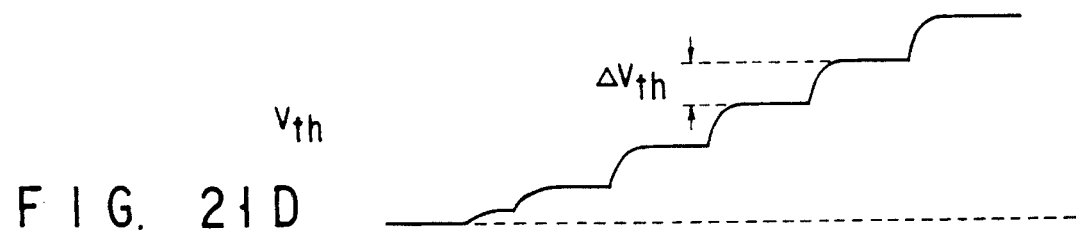

The capacitances between the floating gate 14 and the control gate 16, and between the floating gate 14 and the p-type well 11B are respectively denoted by the reference symbols $C_{cg}$ and $C_{ox}$ in FIG. 19B. The capacitor $C_{ox}$ includes the capacitance between the floating gate 14 and the n-type diffusion layers 19. The threshold voltage of the memory cell is determined by the amount of charge stored in the floating gate 14 and a certain threshold voltage or threshold voltage range corresponds with a certain data value, e.g., a "0" or a "1", that is stored in the memory cell The amount of charge stored in the floating gate 14 can be changed by a passing tunnel current through the tunnel oxide film 13.

When the control gate 16 is set at a sufficiently higher potential than those of the p-type well 1ib and the n-type diffusion layers 19, electrons are injected into the floating gate 14 via the tunnel oxide film 13. As a result, the threshold voltage increases. In contrast to this, when the p-type well 11B and the ntype diffusion layers 19 are set at a higher potential than that of the control gate 16, electrons are emitted from the floating gate 14 via the tunnel oxide film 13. As a result, the threshold voltage decreases.

FIGS. 20A to 20D show a write processing method according to the second embodiment of the present invention when "0" data is written to the selected cell. FIG. 20A to 20D respectively show the control gate voltage $V_{cg}$, the floating gate potential $V_{fg}$, the tunnel current $I_{tunnel}$, and the threshold voltage $V_{th}$ of a selected memory cell during a "0" write.

Although not shown here, in a "1" write, a voltage $V_M$ of about 10 V is connected to the bit lines correspondingn with the "1" write cells in the selected page. Applying this $V_M$ voltage to the bit line of a "1" write cell, prevents a threshold voltage shift in the "1" write cell during the write operation. In a 10, write, a voltage $V_{SS}$, typically 0 V, is connected to the bit line of the "0" write cells. As a result, the threshold voltage of the "0" write cells will change in the positive direction if a high voltage write pulse is applied to the control gate of those cells.

A high potential $V_{PP}$ pulse is applied to the control gate while 0V is applied to the bit line, and a verify operation is performed after the application of the $V_{PP}$ pulse. The initial $V_{PP}$ pulse voltage is set to be a voltage $V_{cgo}$ and $V_{PP}$ is continually increased with a rate of $\Delta V_{PP}$ for each following write/verify cycle. The pulse width is a predetermined time $\Delta t$. The values $\Delta t$ and $\Delta V_{PP}$ are set in such a way that the maximum change $\Delta V_{th}$ of the threshold voltage of the memory cell in one write/verify cycle becomes equal to the value $\Delta V_{PP}$.

If a write pulse with a voltage $V_{PP}$ (FIG. 20A) is applied to the control gate of the memory cell, the floating gate voltage Vfg (FIG. 20B) is increased and a tunnel current Itunnel (FIG. 20C) will flow to the channel and the drain/source regions (i.e. electrons tunnel from the channel and the drain/source regions to the floating gate), thereby reducing the floating gate voltage Vfg during the write pulse. For the next write pulse, Vpp is increased with a voltage A Vpp, as a result, the floating gate voltage Vfg is increased with a value KΔVpp in comparison with the voltage of Vfg at the end of the previous pulse. K is the couple factor of the memory cell and given by K=Ccg/(Ccg+Cox) as indicated in FIG. 19. As a result, the floating gate voltage Vfg will increase with every subsequent write pulse, as Vpp is continuously increased, and thus increasing Itunnel and the shift in Vfg that occurs due to the current Itunnel during one pulse.

However, the rise of the floating gate voltage Vfg will stop when the Vfg increase K ΔVpp is compensated by the Vfg decrease during one pulse as is the case in the last 4 pulses in FIG. 20. Under that condition, the threshold voltage increase ΔVth is equal to ΔVpp.

If the initial write pulse voltage Vcgo is set to a sufficiently low value, the threshold voltage shift ΔVth of the fastest memory cell is also equal or smaller than A Vpp. As a result, the problem of overwriting can be completely avoided by setting ΔVpp to a value equal or smaller than Vth-max– Vth-min with $V_{th}$-min and $V_{th}$-max respectively the minimum and maximum allowable cell threshold voltage for the '0' state. For the slowest memory cells, the threshold voltage also reaches the minimum value $V_{th}$-min quickly because the write pulse voltage is continuously increased for each subsequent pulse.

After each write pulse, a verify operation is carried out to check if the threshold voltage of all '0' write cells in the selected page is larger or equal to Vth-min. If a '0' write cell fulfills this condition, further writing is avoided by applying a Vm voltage to the drain/source regions of the cell by applying Vm to the corresponding bit line during the next write pulse. If the threshold voltage of all '0' write cells in the selected page is larger or equal to Vth-min, no further write pulses are required and the write processing is completed.

In this embodiment, since even in the fastest memory cells the threshold voltage shift ΔVth can be limited to the value A Vpp if the voltage Vcgo of the first pulse is sufficiently low, the maximum floating gate voltage is limited and can be significantly smaller than in the conventional case. As a result, the degradation of the tunnel oxide film can be reduced.

FIGS. 21A to 21D show a write processing scheme according to the third embodiment of the present invention when "0" data is written to the selected cell. The third embodiment is basically the same as the second embodiment except that a higher speed operation is realized by grouping a number of write pulses in the initial part of the write processing and omitting the verify operation between those pulses. The third embodiment is effective to reduce the time required for the write processing in the case wherein the threshold voltage of all memory cells do not reach the lower limit vth-min during application of a number of pulses in the initial part of the write processing in the second embodiment.

Figures 22A, 22B:
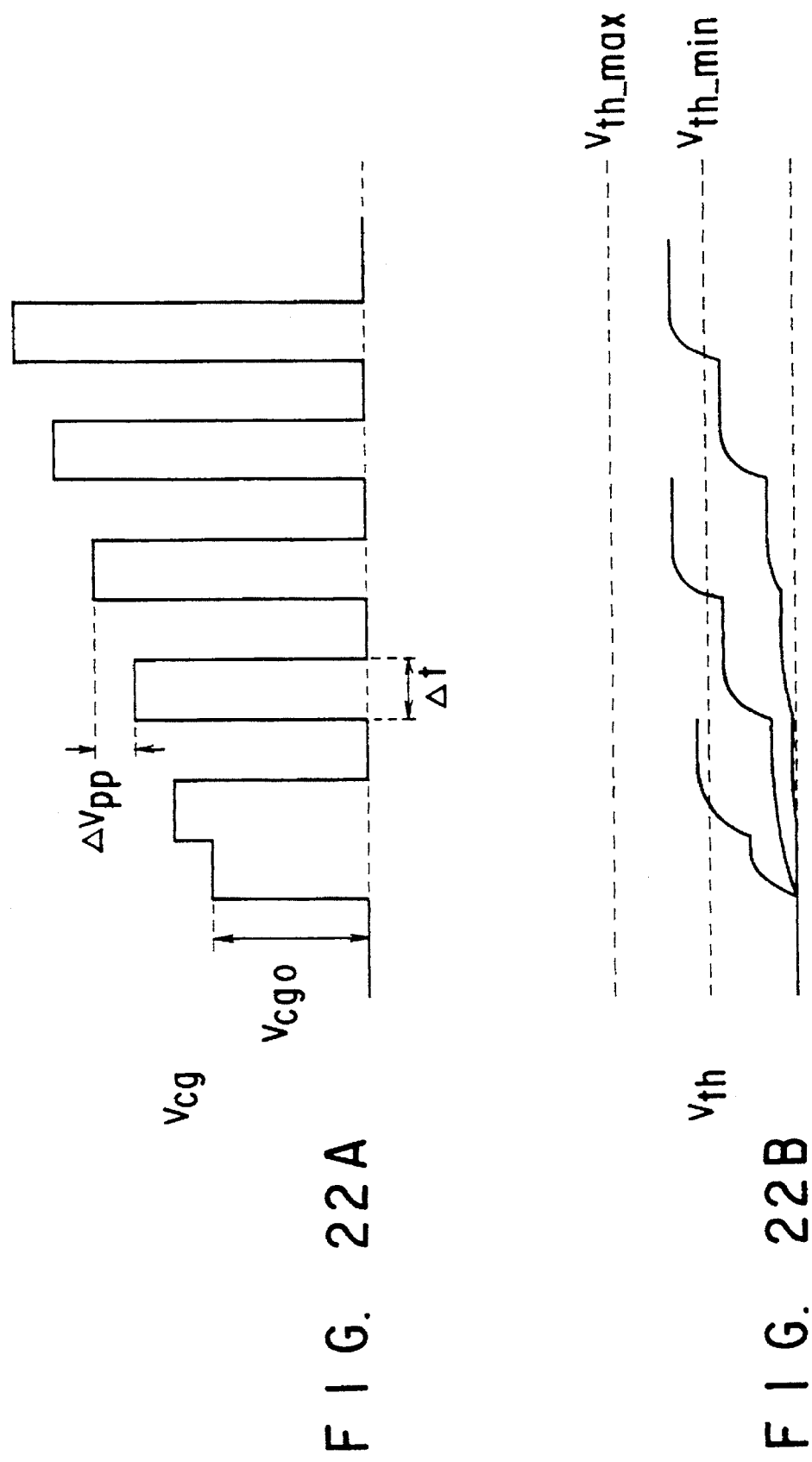
FIGS. 22A and 22B are charts showing changes in the threshold values of memory cells in an electron injection scheme using a bit-by-bit verify operation in the third embodiment.
Figure 23A:
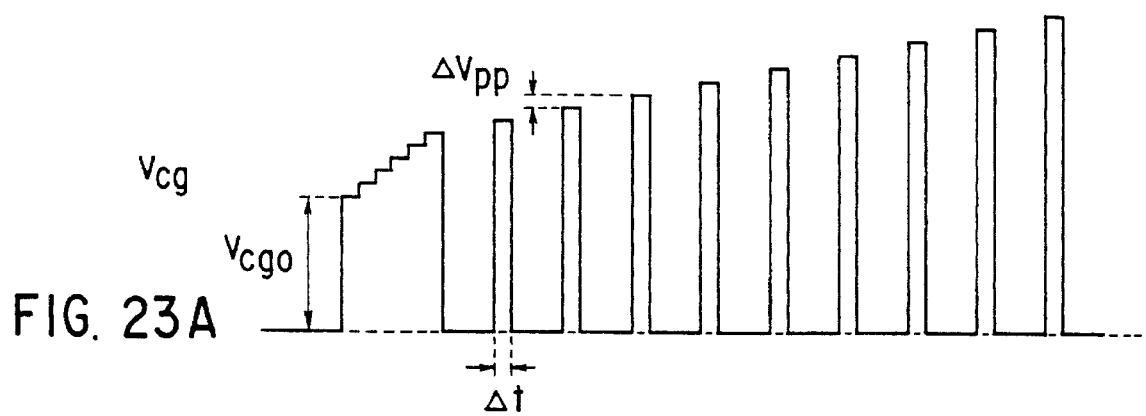
FIGS. 23A to 23D are charts showing electron injection characteristics obtained by an electron injection scheme using a verify operation to improve the controllability of the threshold value of each memory cell in the third embodiment.
Figure 23B:
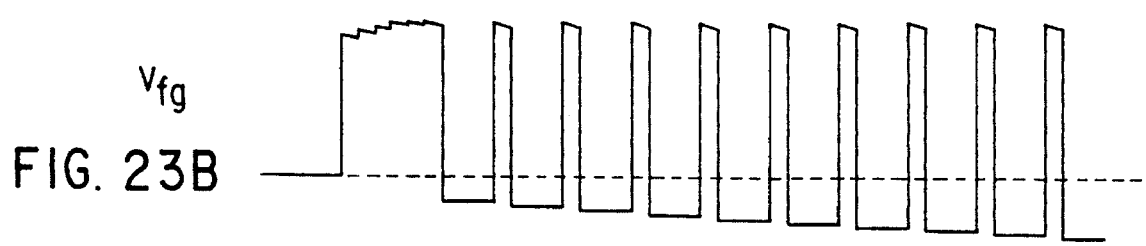
Figure 23C:
Figure 23D:
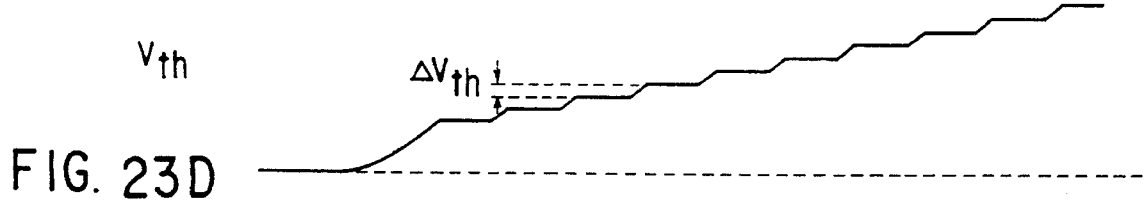
Figure 24A:
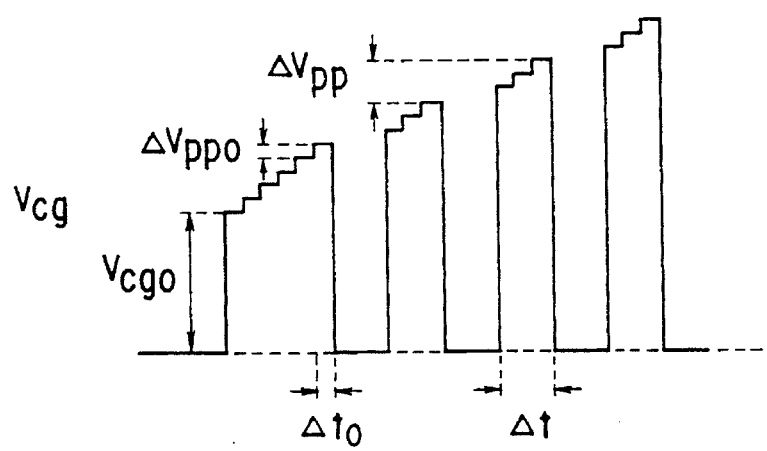
FIGS. 24A to 24D are charts showing electron injection characteristics obtained by an electron injection scheme using a verify operation in the fourth embodiment of the present invention.
Figure 24B:
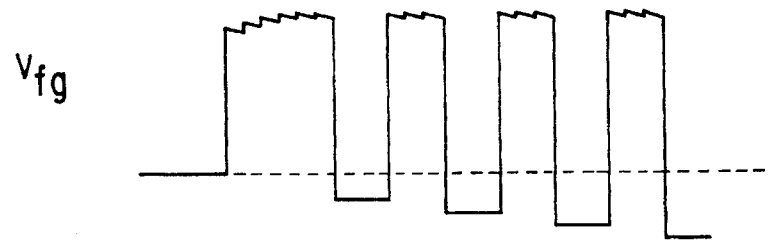
Figure 24C:
Figure 24D:
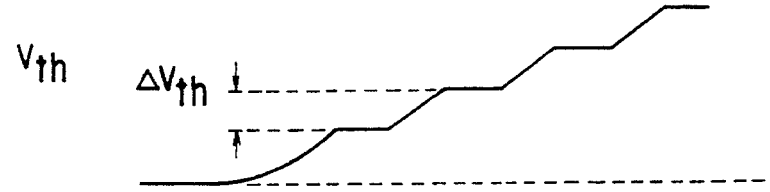
Figure 25A:
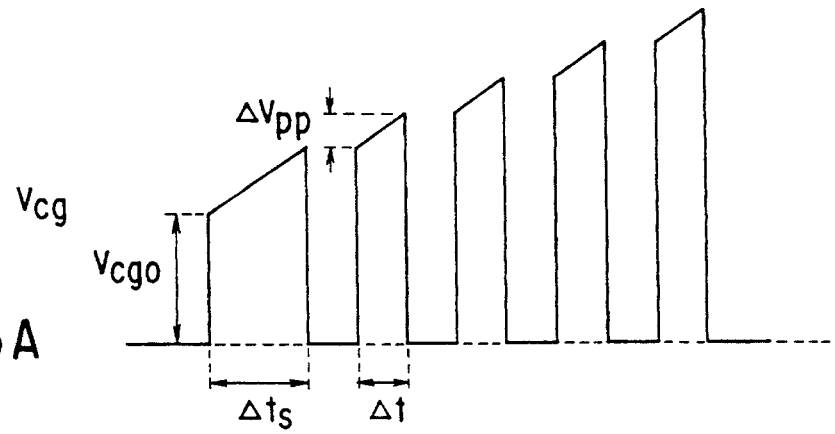
FIGS. 25A to 25D are charts showing electron injection characteristics obtained by an electron injection scheme using a verify operation in the fifth embodiment of the present invention.
Figure 25B:
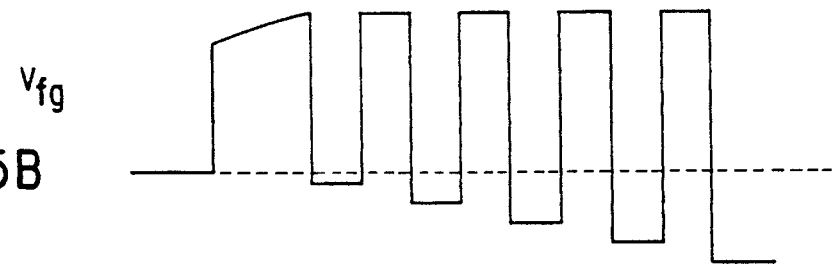
Figure 25C:
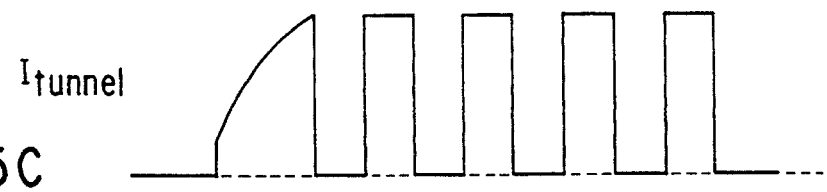
Figure 25D:
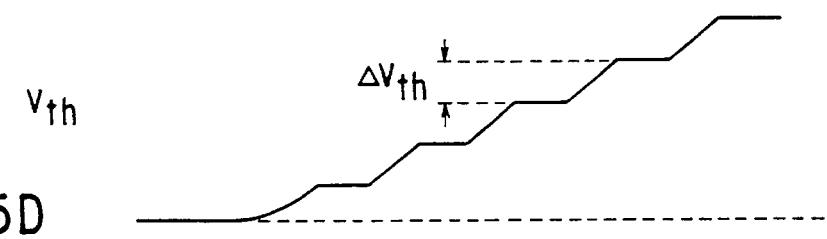

FIGS. 22A and 22B show changes in the threshold voltages of the fastest memory cell, a typical memory cell, and the slowest memory cell as a function of time in the third embodiment when "0" data is written to the selected cell. In order to reduce the deterioration of the tunnel oxide film, the maximum value of $V_{fg}$ should be as low as possible. For this reason, as shown in FIGS. 23A to 23D, the $V_{PP}$ pulse width $\Delta t$ and the $V_{PP}$ increase rate $\Delta V_{PP}$ may be decreased. In this case, however, the number of verify operations increases, and a longer time is required for write processing. In addition, the width of the threshold voltage distribution becomes unnecessarily small, resulting in a non-optional operation.

FIGS. 24A to 24D are views showing the write processing according to the fourth embodiment of the present invention when "0" data is written to the selected cell.

In the fourth embodiment, the write pulses used in the third embodiment are grouped into several sets of pulses. In the initial period, as described with reference to FIGS. 21A to 21D and 22A and 22B, a larger number of pulses are grouped.

According to the fourth embodiment, the floating gate potential $V_{fg}$ becomes almost constant, and the deterioration of the tunnel oxide film can be suppressed more than in the schemes described with reference to FIGS. 21A to 21D and 22A and 22B. Similarly, $V_{th-max} - V_{th-min} = \Delta V_{PP}$ is set, and the write processing can be performed at high speed.

FIGS. 25A to 25D are views showing a write processing method according to the fifth embodiment of the present invention.

The fifth embodiment of the present invention is equivalent to the fourth embodiment for $\Delta t_0 \to 0$ and $\Delta V_{pp0} \to 0$ when "0" data is written to the selected cell. Each $V_{PP}$ pulse has a predetermined value $dV_{PP}/dt$ and the voltage of the pulse increases with a value $\Delta V_{PP}$ during the pulse. In the fifth embodiment, the floating gate potential during write operation can be set to be almost constant, and the deterioration of the tunnel oxide film can be minimized.

During write operation with respect to the above NMOS memory cell, if $V_{PP}$ is sufficiently high, the channel region is inverted, and the drain, source, and channel regions are set at the same potential. Therefore, the method shown in FIGS. 25A to 25D is equivalent to the methods respectively shown in FIGS. 26A and 26B and FIGS. 27A and 27B.

Figure 26A:
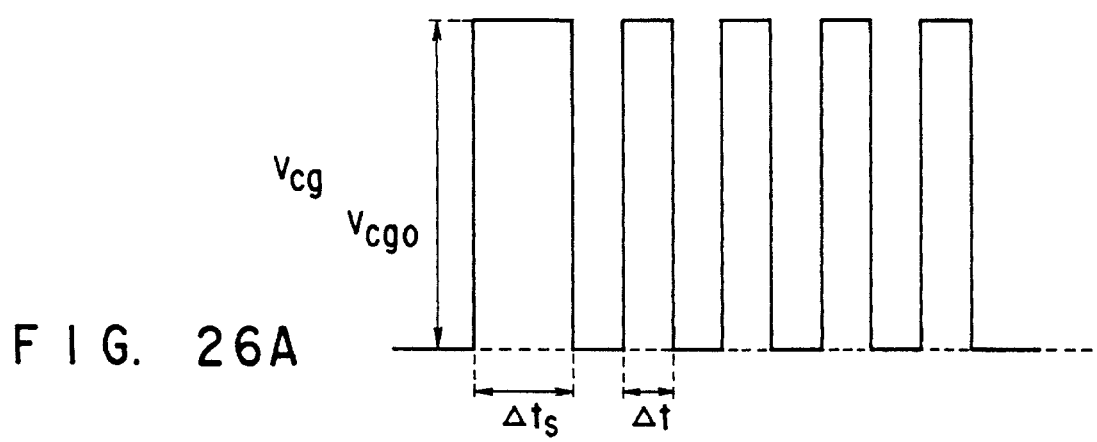
FIGS. 26A and 26B are charts showing the first modification of the electron injection scheme using the verify operation in the fifth embodiment.
Figure 26B:
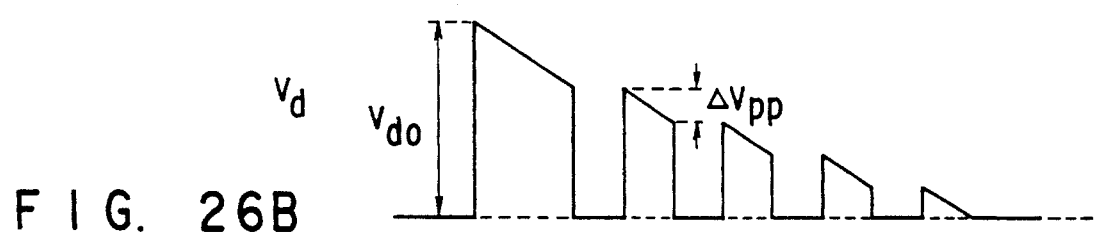
Figure 27A:
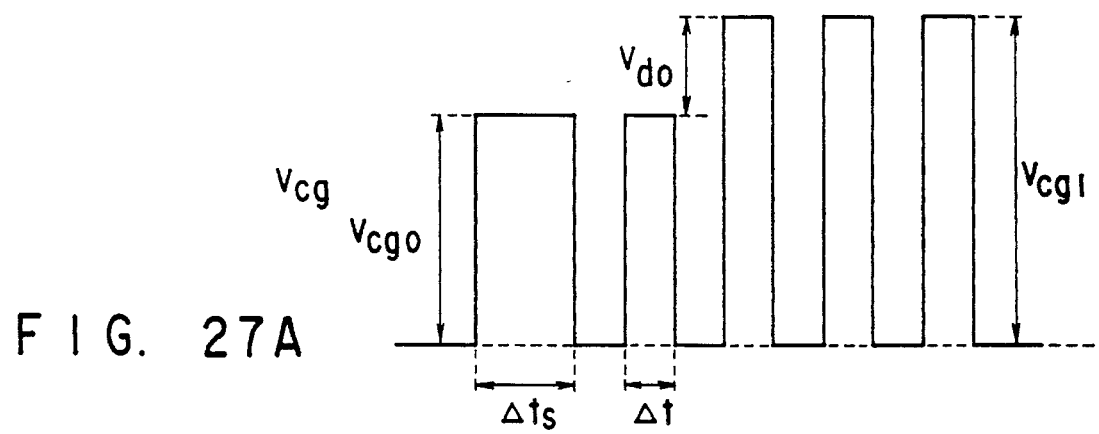
FIGS. 27A and 27B are charts showing the second modification of the electron injection scheme using the verify operation in the fifth embodiment.
Figure 27B:
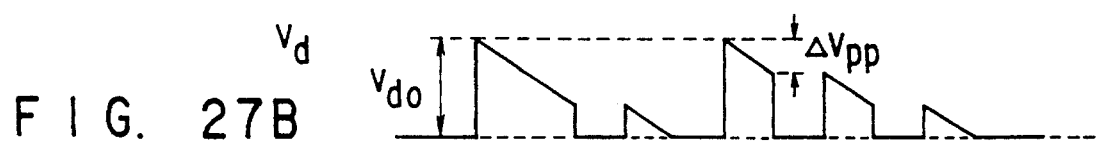

FIGS. 26A and 26B show the first modification of the fifth embodiment, in which a control gate voltage $V_{cg}$ is set to be constant while a drain voltage $V_d$ is gradually decreased. With this operation, the same effects as those of the fifth embodiment can be obtained. If the initial value $V_{d0}$ of the voltage applied to the drain in the first modification is too high for a certain application, e.g., higher than $V_{CC}$ the second modification shown in FIGS. 27A and 27B may be used. More specifically, the initial value $V_{d0}$ of the drain voltage is decreased, and the initial value $V_{cg0}$ of the control gate voltage is also decreased. After the drain voltage $V_d$ is gradually decreased to 0 V, the control gate voltage $V_{cg}$ is increased by $V_{d0}$, and $V_d$ is again increased to the initial $V_{d0}$. With this scheme, the same effects as those of the fifth embodiment FIGS. 25A to 25D can be obtained.

The above described write processing is for a '0' write cell. Although not shown in the figures, for a lll write cell, a voltage Vm of about 10 V is connected to the bit lines corresponding with the '1' write cells in the selected page. Applying this Vm voltage to the bit line of a '1' write cell, prevents a threshold voltage shift in the '1' write cell during the write operation.

In the schemes shown in FIGS. 25–27, the value dVpp/dt with which the write pulse voltage increases per unit of time is a constant value. This may be difficult to realize in practice. However, if the voltage of the pulse is increased with a value $\Delta V_{PP}$ during each pulse while dVpp/dt for each pulse is similar and 0 (i.e. the shape of subsequent pulses is the same), comparable results as obtained with the pulses with a constant dVpp/dt can be obtained.

As is apparent, the voltage Vpp has its upper limit, which is determined by the breakdown voltage $V_{break}$ of the transistors that are used to generate a switch $V_{PP}$. When the voltage $V_{PP}$ reaches the breakdown voltage $V_{break}$, the voltage cannot be increased any more. In this case, the effects of the present invention can be obtained until the voltage $V_{PP}$ reaches the breakdown voltage $V_{break}$. A write processing method has been described above with reference to FIGS. 20A to 27B. However, an erase processing can be performed in the same manner by inverting the polarity of the control gate with respect to the p-type well.

FIG. 28 shows a memory array of NAND-type EEPROMs according to the sixth embodiment of the present invention.

Eight memory cells $M_1$ to M8 are connected in series such that the respective adjacent cells share sources and drains, thus constituting one NAND cell. One end of the NAND cell is connected to a bit line BL via a first select transistor $S_1$. The other terminal of the NAND cell is connected to a common source line VS via a second select transistor $S_2$. Select gates $SG_D$ and $SG_S$ are the gate electrodes of the select transistors $S_1$ and $S_2$. Control gates CG, to $CG_8$ are the gate electrodes of the memory cells. A page is constituted by a group of memory cells sharing the same control gate CG, and a block is constituted by a group of NAND cells sharing the same select gate SG. Each memory cell has a structure similar to that shown in FIG. 19, and the memory cell array is formed in a common p-type well.

Erase, write, read, and read verify operations with respect to each NAND-type EEPROM are performed as follows.

An erase operation is performed in units of blocks. The p-type well is set at a high voltage (about 20 V), and control gates $GC_1$ to $CG_8$ in a selected block are set at 0 V. The control gates in the non-selected blocks and all the select gates are set at $V_{PP}$. Electrons from the floating gates are emitted to the p-type well, and the threshold voltage of each memory cell becomes a negative voltage.

After the erase processing, a data write operation is performed in units of pages, starting from the page located closest to the source line. In a write operation, $V_{PP}$ (about 10 to 20 V) is applied to the control gate (e.g., $CG_4$) of a selected page, and an intermediate potential $V_M$ (about 10 V) is applied to the control gates $CG_1$ to $CG_3$ and $CG_5$ to $CG_8$ of the non-selected pages and to the first select gate $SG_D$. A voltage of 0 V is applied to the bit line BL when a "0" write operation is performed. The voltage $V_M$ is applied to the bit line BL when a "1" write operation is performed. The second select gate $SG_S$ is set at 0 V.

In the "0" write operation, the OV bit line potential is transferred to the channel region of the selected memory cell. Because of the potential difference, electrons are injected from the channel into the floating gate by a tunnel current. As a result, the threshold voltage changes in the positive direction. In the "1" write operation, since the potential of the channel is set at $V_M$, the electric field applied to the tunnel oxide film is weak, and no effective injection of electrons into the floating gate occurs. Therefore, the threshold voltage undergoes no change.

After the write operation, a verify operation is performed to check the threshold voltage of each memory cell. A verify potential (about 0.5 V) is applied to a selected control gate (e.g., $CG_4$), and the non-selected control gates $CG_1$ to $CG_3$ and $CG_5$ to $CG_8$ and the first and second select gates $SG_D$ and $SG_S$ are set at the power supply voltage $V_{CC}$. If the bit line BL and the source line are electrically connected to each other after a "0" write operation, it indicates that the threshold voltage of the selected memory cell is lower than the verify potential, and the "0" write operation is insufficient. Therefore, a "0" write operation is executed again during the next write operation. Otherwise, it is determined that the threshold voltage is higher than the verify potential; the "0" write operation is sufficient; and injection of electrons into the floating gate need not be performed any more. Therefore, a "1" write operation is executed during the next write operation which prevents a further increase of the threshold voltage. After the "1" write operation, a "1" write operation is executed during a subsequent write operation regardless of the threshold voltage of the memory cell.

Since data are written by repeating write and verify operations, the writing time is adjusted for each memory cell individually. When it is detected that the data are sufficiently written in all the memory cells of the selected page, the data write processing for the selected page is completed.

In a read operation, a selected control gate (e.g., $CG_4$) is set at 0 V, and the non-selected control gates $CG_1$ to $CG_3$ and $CG_5$ to $CG_8$ and the first and second select gates $SG_D$ and $SG_S$ are set at the power supply voltage $V_{CC}$. If the potential of the precharged bit line BL decreases, the threshold voltage of the memory cell is lower than 0 V, and the data is "1". if the potential of the bit line BL does not change, the threshold voltage of the memory cell is higher than 0 V, and the data is "0". In a read operation, the threshold voltage of each memory cell must be lower than the power supply voltage $V_{CC}$.

A method of applying a writing voltage $V_{PP}$ to a selected control gate CG of a NAND-type EEPROM in a write operation will be described below.

Figure 29:
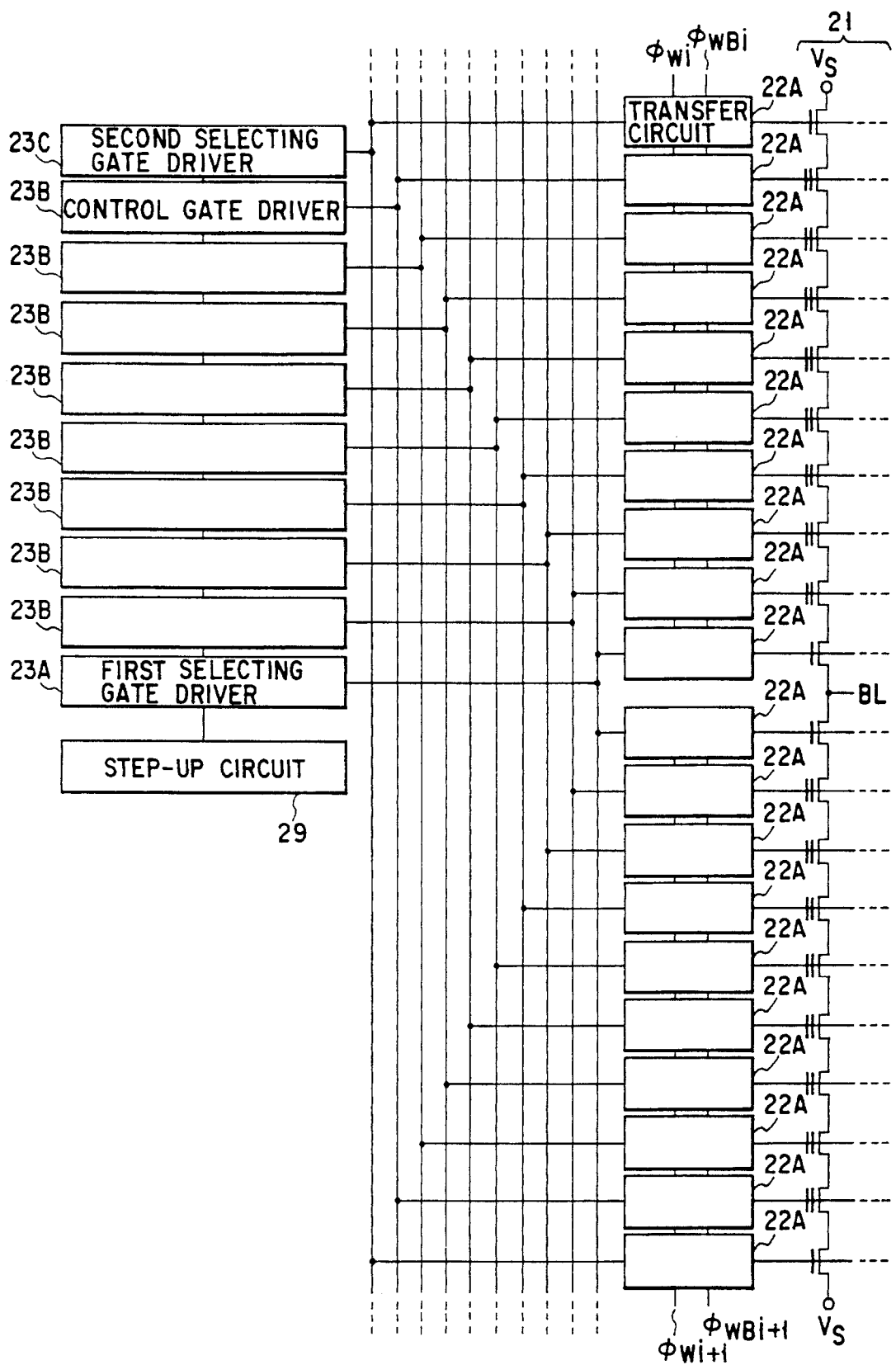
FIG. 29 is a block diagram showing the arrangement of a circuit for driving control gates in the sixth embodiment.

FIG. 29 shows the arrangement of a circuit for driving control gates.

This circuit includes transfer circuits 22A selectively transferring outputs from the control gate drivers 23B, a first select gate driver 23A, and a second select gate driver 23C to the respective control and select gates. A group of ten transfer circuits 22A corresponding to a block of a memory cell array 21 is selected by block select signals $\phi_{wi}$ and $\phi_{wBi}$. A step-up circuit 29 generates voltages $V_{PP}$ and $V_M$ required for write and erase operations from a power supply voltage $V_{PP}$, and applies them to the control gate drivers 23B, the first select gate driver 23A, and the second select gate driver 23C.

FIG. 30 shows the arrangements of the transfer circuits 22A of the control gates $CG_4$, the control gate driver 23B, and the step-up circuit 29 in FIG. 29 in more detail. Each transfer circuit 22A comprises a CMOS transfer circuit constituted by n- and p-channel MOS transistors $Q_{n1}$ and $Q_{p1}$, and a reset circuit constituted by an n-channel MOS transistor $Q_{n2}$. When the signals $\phi_{wi}$ and $\phi_{wBi}$ are set at "H" level and "L" level, respectively, the potential at node $N_1$ is transferred to the control gate. When the signals $\phi_{wi}$ and $\phi_{wBi}$ are set at "L" level and "H" level, respectively, the control gate is grounded. The step-up circuit 29 is constituted by a $V_M$ step-up circuit 41 and a $V_{PP}$ step-up circuit 42. The control gate driver 23B is constituted by a first switching circuit 43, a second switching circuit 44, and a third switching circuit 45.

The first switching circuit 43 controls whether the output $V_M$ from the $V_M$ step-up circuit 41 is connected to the node $N_1$. The second switching circuit 44 controls whether the output $V_{PP}$ from the $V_{PP}$ step-up circuit 42 is connected to the node $N_1$. The voltage transferred to the node $N_1$ is $V_{PP}-\Delta V_{PP}$. The third switching circuit 45 controls whether the output $V_{PP}$ from the $V_{PP}$ step-up circuit 42 is connected to the node $N_1$. In this case, the amount of current to be supplied when the output $V_{PP}$ is transferred to the node $N_1$ is adjusted to obtain an increase rate $dV_{PP}/dt$ of the potential on the node $N_1$.

FIG. 31 shows the detailed arrangement of the control gate driver 23B.

The first switching circuit 43 includes p-channel MOS transistors $Q_{p1}$ to $Q_{p4}$, n-channel MOS transistors $Q_{n3}$ and $Q_{n4}$, an n-channel MOS transistor $Q_{D1}$, and an inverter $I_1$. A circuit constituted by the MOS transistors $Q_{p2}$, $Q_{p3}$, $Q_{ns}$, and $Q_{n4}$ and the inverter $I_1$, serves to convert a signal $\phi_1$ which has an amplitude between 0 V and $V_{CC}$ into a signal which has an amplitude between 0 V and $V_{PP}$. When the signal $\phi_1$ is set at "L" level, the gates of the transistors $Q_{p4}$ and $Q_{D1}$ are set at $V_{PP}$ and 0 V, respectively. As a result, $V_M$ is disconnected from the node $N_1$. When the signal $\phi_1$ is set at "H" level, the gates of the transistors $Q_{p4}$ and $Q_{D1}$ are set at 0 V and $V_{PP}$, respectively. As a result, $V_M$ is connected to the node $N_1$. The transistor $Q_{D1}$ prevents transfer of $V_{PP}$ to the transistor $Q_{p4}$ when the node $N_1$ is set at $V_{PP}$.

The second switching circuit 44 includes p-channel MOS transistors $Q_{p5}$ to $Q_{p8}$, n-channel MOS transistors $Q_{n5}$ and $Q_{n6}$, and an inverter $I_2$. When a signal $\phi_2$ is set at "L" level, the gate of the transistor $Q_{p7}$ is set at $V_{PP}$. As a result, $V_{PP}$ is disconnected from the node $N_1$. When the signal $\phi_2$ is set at "H" level, the gate of the transistor $Q_{p7}$ is set at 0 V. As a result, $V_{PP}$ is connected to the node $N_1$ via $Q_{p8}$, and a voltage lowered by the threshold voltage of the transistor $Q_{p8}$ is transferred to the node $N_1$.

The third switching circuit 45 includes p-channel MOS transistors $Q_{p9}$ to $Q_{p11}$, n-channel MOS transistors $Q_{n7}$ and $Q_{n8}$, and inverter I3, and a current control circuit 46. When a signal $\phi_3$ is set at "L" level, the gate of the transistor $Q_{p11}$ is set at $V_{PP}$. As a result, $V_{PP}$ is disconnected from the node $N_1$. When the signal $\phi_3$ is set at "H" level, the gate of the transistor $Q_{p11}$ is set at 0 V. As a result, $V_{PP}$ is connected to the node $N_1$, and $V_{PP}$ is transferred to the node $N_1$ while $dV_{PP}/dt$ is controlled by the current control circuit 46.

A p-channel MOS transistor $Q_{p12}$, an n-channel MOS transistor $Q_{n9}$, and an n-channel D type MOS transistor $Q_{D2}$ constitute a circuit for setting the node $N_1$ at $V_{GH}$ or $V_{CC}$. When a signal $\phi_4$ is set at "H" level, the node $N_1$ is set at $V_{GH}$. When the signal $\phi_4$ is set at "L" level, the node $N_1$ is set at $V_{CC}$. The voltage $V_{GH}$ is normally 0 V and is set to be a verify voltage $V_{VRFY}$ (~0.5 V) in a verify operation. The transistor $Q_{D2}$ prevents transfer of $V_M$ or $V_{PP}$ to the transistor $Q_{p12}$ when a signal $\phi_5$ is set at "L" level, and $V_M$ or $V_{PP}$ is applied to the node $N_1$.

Each of the FIGS. 32A and 32B shows the detailed arrangement of the current control circuit 46 in FIG. 31.

The current control circuit 46 in FIG. 32A includes p-channel MOS transistors $Q_{p13}$ to $Q_{p15}$ and n-channel D type MOS transistors $Q_{D3}$ and $Q_{D4}$. A signal $\phi_{3B}$ is an inverted signal of the signal $\phi_3$ in FIG. 31. When the signals $\phi_3$ and $\phi_{3B}$ are respectively set at "H" level and "L" level, and a node $N_2$ is set at $V_{PP}$, the gate of the transistor $Q_{p15}$ is set at $V_{PP}- 2V_{tp}$ ($V_{tp}$ is the threshold voltage of the p-channel MOS transistor). As a result, the current flowing from a node $N_3$ to the node $N_1$ is controlled by the transistor $Q_{p15}$. The current control circuit 46 in FIG. 32B includes p-channel MOS transistors $Q_{p16}$ and $Q_{p17}$, an n-channel MOS transistor $Q_{n10}$, a capacitor $C_1$, and a resistor $R_1$. When the signal $\phi_3$ is set at "H" level, and a node $N_2$ is at $V_{PP}$, the gate of the transistor $Q_{p16}$ is controlled by the capacitor $C_1$ and the resistor $R_1$, and the gate voltage changes from $V_{PP}$ to 0 V. As a result, the current from node $N_3$ to node $N_1$ is controlled by the transistor $Q_{p16}$.

Figure 33:
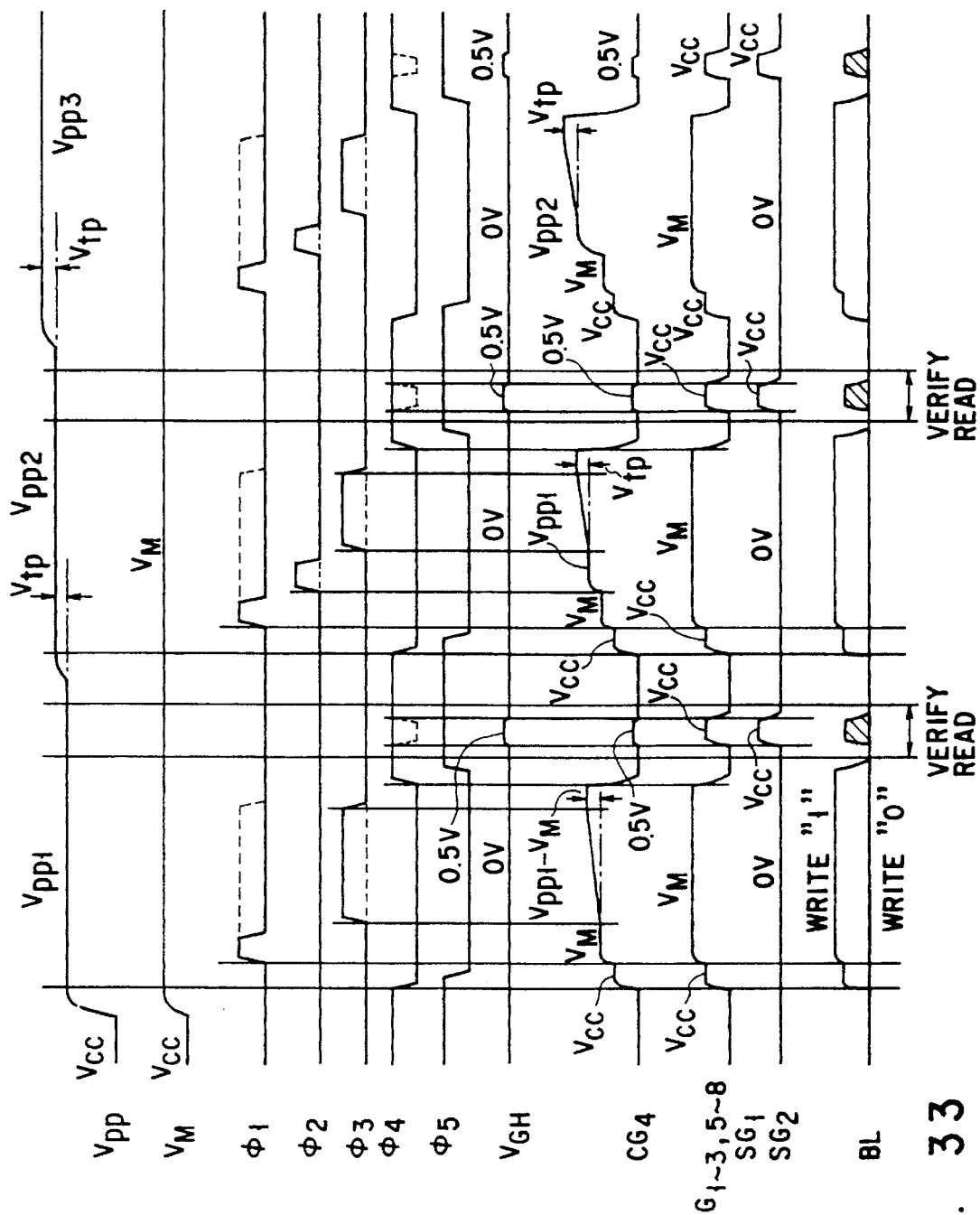
FIG. 33 is a timing chart for explaining a write/verify operation in the sixth embodiment.

FIG. 33 is a timing chart showing a write operation with respect to the EEPROM having the above arrangement.

Referring to FIG. 33, when the control gate $CG_4$ is selected, the voltages $V_M$ and $V_{PP}$ are boosted from the power supply voltage $V_{CC}$ by the $V_M$ step-up circuits 41 and 42. The voltage $V_{PP}$ is increased from $V_{PP1}$ by $V_{tP}$ every time a write/verify operation is repeated. The signals $\phi_{wi}$ and $\phi_{wBi}$ shown in FIG. 30 are respectively set at $V_{PP}$ and 0 V in a selected block.

In a write operation, when the signal $\phi_4$ is set at "L" level, the node $N_1$ is set at $V_{CC}$. As a result, all the control gates $CG_1$ to $CG_8$ of the selected block are set at $V_{CC}$. At the same time, the select gate $SG_1$ of the selected block is also set at $V_{CC}$. The bit line BL is set at $V_{CC}$ only when a "1" write operation is to be performed. During the write operation, the select gate $SG_S$ is kept at 0 V. When the signal $\phi_1$ is set at "H" level, the control gates $CG_1$ to $CG_8$, the select gate $SG_D$, and the bit line BL in which "1" is written are set at $V_M$. When the signal $\phi_3$ is set at "H" level, the voltage of the selected control gate $CG_4$ is increased from $V_M$ to $V_{pp1}$ in a time $\Delta t_0$. The nonselected control gates $CG^1$ to $CG_3$ and $CG_5$ to $CG_8$, the select gate $SG_D$, and the bit line BL in which "1" is written are kept at $V_M$. The signals $\phi_1$, $\phi_2$, $\phi_3$, and $\phi_4$ associated with the non-selected control gates are indicated by the dotted lines in FIG. 20.

When the signal $\phi_4$ is set at "H" level, all the control gates $CG_1$ to $CG_8$ are set at 0 V. At this time, the select gate $SG_D$ is also reset to 0 V, and the bit line BL is reset to 0 V afterward.

A verify operation is performed after the above operation. The selected control gate $CG_4$ is set at the verify potential $V_{VRFY}$. The non-selected control gates $CG_1$ to $CG_3$ and $CG_5$ to $CG_8$ are set at $V_{CC}$ when the signal $\phi_4$ is set at "L" level. The select gates $SG_D$ and $SG_S$ are also set at $V_{CC}$.

If it is detected that the threshold voltage of a memory cell in which "0" is to be written exceeds the verify potential $V_{VRFY}$, a "1" write operation is performed during the next write operation, thus preventing an excessive "0" write operation. If it is detected that the threshold voltage of a memory cell in which a "0" is to be written does not exceed the verify potential $V_{VRFY}$, a "0" write operation is performed again during the next write operation. A "1" write operation is performed again during the next write operation for each memory cell in which a "1" is to be written.

In the second and subsequent write operations, after the selected control gate $CG_4$ is charged to $V_M$, the signal $\phi_2$ is output to quickly charge the selected control gate $CG_4$ to the maximum selected control gate voltage in the previous write operation. In addition, the signal $\phi_3$ is set at "H" level, so that the selected control gate voltage is increased by $V_{tp}$ in the time $\Delta t$. For example, in the second write operation, the voltage is increased from $V_{pp1}$ to $V_{pp2}$ ($V_{pp2}=V_{pp1}+V_{tP}$).

Figure 34:
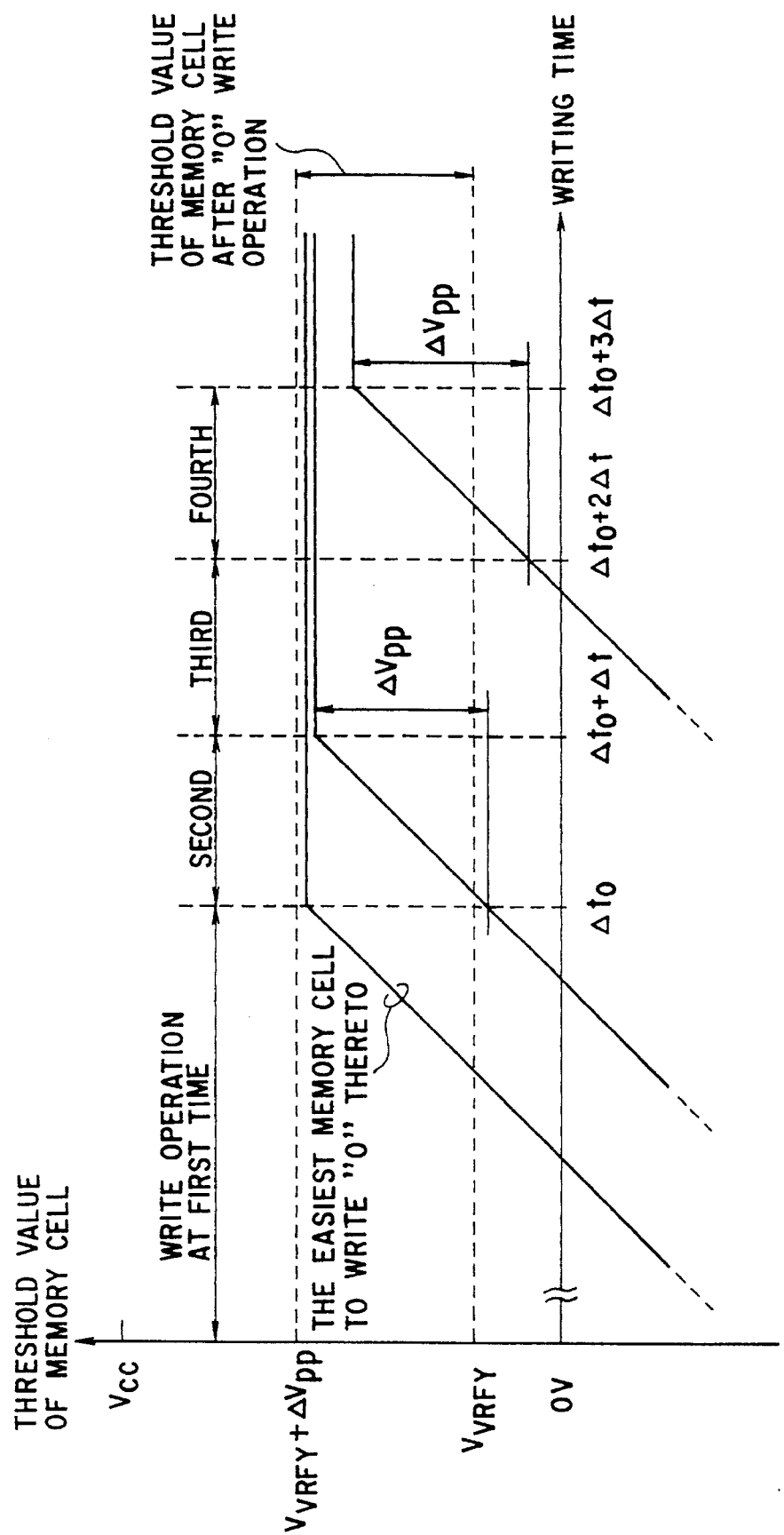
FIG. 34 is a chart showing the write characteristics of memory cells in the sixth embodiment.

The value $(V_{pp1}-V_M)/\Delta t_0$ in the first write operation is set to be almost equal to the value $V_{tP}/\Delta t$ in the second and subsequent write operations. These values are set in such a way that the threshold voltage of the fastest memory cell to write "0" therein is set to be lower than the maximum value of the allowed threshold voltage for a "0" written cell after the first write operation, and the threshold voltage of each memory cell in which a "0" is to be written shifts at a rate of $\Delta V_{PP}$ ($\Delta V_{PP}$ is the increase rate of $V_{PP}$, which is $V_{tp}$ in this case) in the second and subsequent write operations (FIG. 34). Therefore, the width of the threshold voltage distribution after a "0" write processing becomes equal to $\Delta V_{PP}$ ($V_{tP}$ in this case).

The data write processing is ended when the above write/verify cycles are repeated, until the threshold voltages of all the memory cells in which a "0" is to be written are detected to exceed $V_{VRFY}$.

FIGS. 35 and 36 show another embodiment of the control gate driver 23B. This driver includes first and second $V_{PP}$ step-up circuits 47 and 48 for generating outputs respectively denoted by reference symbols $V_{ppA}$ and $V_{ppB}$. A fourth switching circuit 49 controls whether the output $V_{ppA}$ from the first $V_{PP}$ step-up circuit 47 is connected to the node $N^1$.

Figure 37:
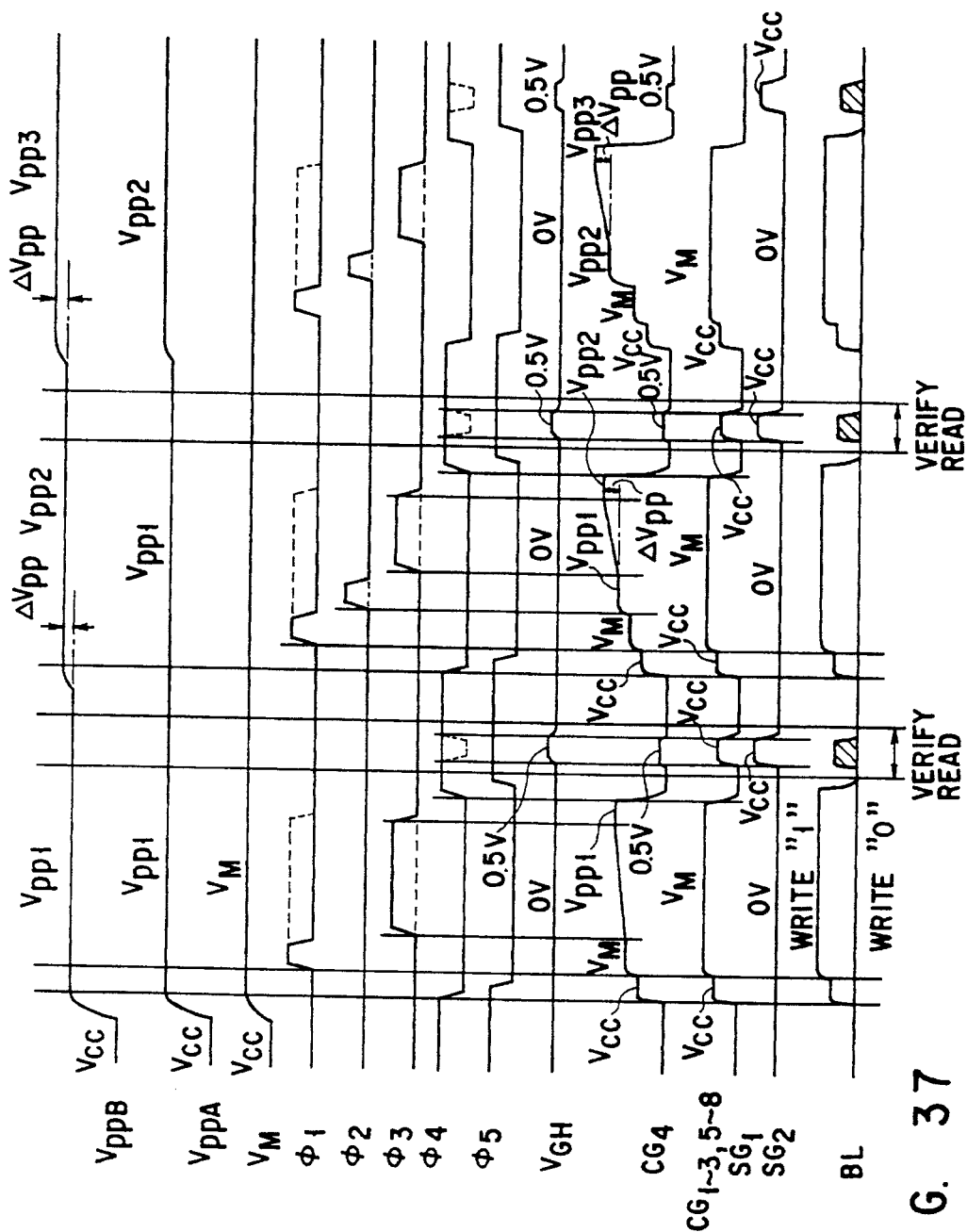
FIG. 37 is a timing chart for explaining a write/verify operation in the seventh embodiment.

FIG. 37 is a timing chart showing the write operation.

The outputs $V_{PPA}$ and $V_{PPB}$ are set to be the same voltage $V_{PP1}$ in the first write operation; and $V_{ppB}=V_{ppA}+\Delta V_{PP}$ in the second and subsequent write operations. The voltages other than $V_{ppA}$ and $V_{ppB}$ are the same as those shown in FIG. 33. In this embodiment, the setting of $\Delta V_{PP}$ is easier than that in the embodiment shown in FIGS. 30 and 31.

FIGS. 38A and 38B show a write processing method according to the eighth embodiment of the present invention. Three states (data "0", Hill, and "2") are stored in one memory cell. Although the $V_{PP}$ pulse waveforms are the same as those shown in FIGS. 25A to 25D, the voltage applied to a memory cell in which a "2" is written is different from the voltage applied to a memory cell in which a "1" is written by $\Delta V_{ppB}$. In a verify operation of all the memory cells in which a "2" is to be written, memory cells whose threshold voltages have not reached a desired threshold voltage ($V_{VRFY2}$) yet are detected. In addition, of all the memory cells in which "1" is to be written, memory cells whose threshold voltages have not reached a desired threshold voltage ($V_{VRFY1}$) yet are detected. With respect to only these detected memory cells, "2", and "1" write operations are respectively performed again. At this time, $dv_{pp}2/dt = dV_{pp1}/dt$ is set, and $\Delta V_{ppA}$ is made equal to a desired threshold voltage distribution $\Delta V_{th}$.

With this operation, the threshold voltage distribution A $V_{th}$ after the "2" and "1" write operations becomes $\Delta V_{ppA}$. The value $\Delta V_{ppB}$ is made equal to the value obtained by adding the width $\Delta V_{th}$ of the threshold voltage distribution to a threshold voltage margin $\Delta V_{margin}$ between the threshold voltage distributions obtained after "2" and "1" write operations ($\Delta V_{ppB} = \Delta V_{th}+\Delta V_{margin}$ or A $V_{ppB}=V_{VRFY2}-V_{VRFY1}$). As a result, "2" and "1" write operations are independently and parallely performed to realize a high-speed write processing. As is apparent, the maximum voltage applied to the tunnel oxide film of each memory cell is also minimized in this method.

For independent, parallel processing of "2" and "1" write operations and a high-speed write operation, it is effective to set a difference between the voltage applied to a memory cell in which a "2", is written and the voltage applied to a memory cell in which a "1" is written by $\Delta V_{ppB}$ regardless of the write pulse waveforms.

According to the gist of the above description, the present invention can be equally applied to multi-value (3 or more values) storage. The write processing has been described with reference to FIGS. 38A and 38B. However, the present invention can be equally applied to an erase processing by inverting the polarity of control gates relative to the p-type well.

The present invention is basically characterized in that by the fact that the intensity of the electric field applied to the tunnel oxide film under the floating gate through which electrons (holes) tunnel due to the potential $V_{PP}$ which is gradually increased is canceled by a change in the potential of the floating gate due to the electron (hole) injection or discharge. Therefore, according to the gist of the above description, in addition to the scheme of injecting or discharging electrons (holes) by using a tunnel current flowing via the entire channel surface as in the above embodiments, the present invention can be applied to other schemes to obtain the same effects, e.g., a scheme of performing electron injection or discharge by using a tunnel current flowing between a drain or a source and a floating gate and a scheme of using hot electrons or hot holes.

What is claimed as new and is desired to be secured by Letters Patent of the United States is:

1. A non-volatile semiconductor memory device comprising:

a memory cell array including a plurality of memory cells, which are arranged in a matrix, capable of electrically rewriting and erasing data, said memory cell having a source and a drain;

a plurality of bit lines coupled to said drain of said memory cells;

a plurality of word lines which are control gates of said memory cells;

write means for, when a page write operation is to be performed, applying a first writing potential to a selected word line, applying a first bit line potential to a bit line which is connected to a memory cell connected to said selected word line in which a first data value is to be written, and applying a second bit line potential to a bit line which is connected to a memory cell connected to said selected word line in which a second data value is to be written; and rewrite means for reading out data written by said write means, causing said write means to perform a write operation again if there is a memory cell which has undergone an insufficient write operation, and sequentially increase the first writing potential to increase the potential difference between the word line and the substrate and source/drain in accordance with the number of write operations.

2. A non-volatile semiconductor memory device according to claim 1, wherein said rewrite means includes means for changing said first and second bit line potentials.

3. A non-volatile semiconductor memory device according to claim 1, further comprising means for setting a rise time of a first write pulse to be longer than a rise time of second and subsequent pulses in a data write operation using a plurality of pulses.

4. A non-volatile semiconductor memory device according to claim 1, wherein said memory cells construct NAND cell structure by connecting said plurality of memory cells in series.

5. A non-volatile semiconductor memory device according to claim 1, further comprising:

a first selecting gate connected to one end of said a NAND cell and said bit line;

a second selecting gate connected to another end of said NAND cell; and a source line connected to another end of said NAND cell via said second selecting gate.

6. A non-volatile semiconductor memory device according to claim 1, wherein said plurality of memory cells construct a memory cell array by connecting a plurality of said memory cells to each said bit line.

7. A non-volatile semiconductor memory device according to claim 1, wherein said memory cells, whose common drain is connected to said bit line via a first selecting gate and common source is connected to a common source line via a second selecting gate, construct a NOR structure by connecting to said bit line in parallel.

8. A non-volatile semiconductor memory device according to claim 1, further comprising means for setting a potential of a first write pulse to a potential to prevent (overprogram) overwrite for the fastest memory cell to write thereto during data write by a plurality of pulses.

9. A non-volatile semiconductor memory device according to claim 1, further comprising means for setting a upper-limit potential of a write pulse to a rated potential of said memory cells and peripheral circuits during data write by a plurality of pulses.

10. A non-volatile semiconductor memory device comprising:

semiconductor substrate;

a memory cell array constituted by memory cells capable of electrically rewriting data and arranged in the form of a matrix, each of said memory cells being formed by stacking a charge storage layer and a control gate on said semiconductor substrate;

threshold voltage changing means for applying a threshold voltage changing write pulse between said control gate and said semiconductor substrate to change the threshold voltage of each of an arbitrary number of memory cells in said memory cell array;

threshold voltage verify means for detecting the states of said arbitrary number of memory cells after application of the threshold voltage changing write pulse;

threshold voltage re-changing means for applying a threshold voltage changing write pulse to a memory cell, of said arbitrary number of memory cells, whose threshold voltage has not reached a desired threshold voltage yet, for a time a, thereby changing the threshold voltage again; and repeating means for, after a threshold voltage changing operation and a threshold voltage verify operation are respectively performed by said threshold voltage changing means and said threshold voltage verify means, repeating a threshold voltage re-changing operation by said threshold voltage re-changing means and the threshold voltage verify operation until the threshold voltage of said memory cell reaches the desired value, wherein said threshold voltage re-changing means includes means for increasing a potential of the threshold voltage changing write pulse by a pulse peak value increase $\Delta V_{PP}$ every time a threshold voltage re-changing operation is performed, and said repeating means includes means for electrically erasing or writing data such that the width of the threshold voltage distribution of said memory cells whose threshold voltages have reached the desired threshold voltage becomes equal to $\Delta V_{PP}$.

11. A non-volatile semiconductor memory device according to claim 10, wherein said memory cells construct NAND cell structure by connecting said plurality of memory cells in series.

12. A non-volatile semiconductor memory device according to claim 10, further comprising:

a first selecting gate connected to one end of said a NAND cell and said bit line;

a second selecting gate connected to another end of said NAND cell; and a source line connected to another end of said NAND cell via said second selecting gate.

13. A non-volatile semiconductor memory device according to claim 10, wherein said plurality of memory cells construct a memory cell unit by connecting to said bit lines in parallel.

14. A non-volatile semiconductor memory device according to claim 10, wherein said memory cells, whose common drain is connected to said bit line via a first selecting gate and common source is connected to a common source line via a second selecting gate, construct a NOR structure by connecting to said bit line in parallel.

15. A non-volatile semiconductor memory device according to claim 10, further comprising means for setting a potential of a first write pulse to a potential to prevent overwrite for the fastest memory cell to write thereto during data write by a plurality of pulses.

16. A non-volatile semiconductor memory device according to claim 10, further comprising means for setting a upper-limit potential of a write pulse to a rated potential of said memory cells and peripheral circuits during data write by a plurality of pulses.

17. A non-volatile semiconductor memory device comprising:

a memory cell array constituted by memory cells capable of electrically rewriting data and arranged in the form of a matrix, each of said memory cells being formed by stacking a charge storage layer and a control gate on a semiconductor layer;

erase means for performing an erase operation to set data in each memory cell of said memory cell array to "0";

pulse applying means for applying threshold voltage changing write pulses ($V_{pp1}$, $V_{pp2}$ ..., $V_{ppn}$) corresponding to write data ("1","2",..., "n") between said control gate and said semiconductor layer to change the threshold voltage of each of an arbitrary number of memory cells in said memory cell array;

threshold voltage verify means for detecting the states of said arbitrary number of memory cells upon application of the threshold voltage changing write pulses;

rewrite pulse applying means for applying threshold voltage changing write pulses corresponding to the write data to memory cells, of said arbitrary number of memory cells, whose threshold voltage values have not reached desired threshold voltages ($V_{th1}$, $V_{tH2}$, ..., $V_{thn}$) corresponding to the write data ("1", "2",..., "n"), thereby changing the threshold voltages again in accordance with the write data; and repeating means for, after a threshold voltage changing operation and a threshold voltage verify operation are respectively performed by said write pulse applying means and said threshold voltage verify means, repeating a threshold voltage re-changing operation by said rewrite pulse applying means and the threshold voltage verify operation until the threshold voltages of said memory cells reach the desired values corresponding to the write data, wherein said write pulse applying means includes means for setting the threshold voltage changing write pulses according to $V_{pp1}= V_{pp2}-\Delta V_{ppd2}=V_{pp3}-\Delta V_{ppd3}= \cdots V_{ppn}-\Delta V_{ppdn}$, and said rewrite pulse applying means includes means for setting the desired threshold voltages according to $Vt_{thi}-V_{thi-1}=\Delta V_{ppdi}$ (i=2, 3, ..., n).

18. A device according to claim 9, wherein said write pulse applying means includes means for applying a threshold voltage changing write pulse for a time $\Delta Vt_0$, said rewrite pulse applying means includes means for applying a threshold voltage changing write pulse for a time $\Delta t$, and means for increasing the threshold voltage changing write pulse by a pulse peak value increase $\Delta V_{pp}$ every time a threshold voltage re-changing operation is performed, and said repeating means includes means for electrically writing data such that the width of the threshold voltage distribution of said memory cells whose threshold voltages have reached the desired threshold voltage becomes equal to.

19. A device according to claim 9, wherein said rewrite pulse applying means includes means for keeping the peak value of a threshold voltage changing write pulse constant.

20. A device according to claim 9, wherein said rewrite pulse applying means includes means for increasing the peak value of a threshold voltage changing write pulse by a pulse peak value increase $\Delta V_{pp}$ for a time corresponding to a pulse width $\Delta t$, and means for increasing the peak value of a threshold voltage changing write pulse by $\Delta V_{pp} \times \Delta t_0/\Delta t$ for a time corresponding to a pulse width $\Delta t_0$.

21. A device according to claim 9, wherein said rewrite pulse applying means includes means for increasing a peak value of a threshold voltage changing write pulse by a pulse peak value increase $\Delta V_{pp}$ at a predetermined increase rate for a time corresponding to a pulse width $\Delta t$, and means for increasing a peak value of a threshold voltage changing write pulse by $\Delta V_{pp} \times \Delta t_0/\Delta t$ at a predetermined increase rate for a time corresponding to a pulse width $\Delta t_0$.

22. A device according to claim 9, wherein a threshold value changing pulse width $\Delta t_0$ used in a threshold value changing operation is equal to a threshold value changing pulse width $\Delta t$ used in a threshold value re-changing operation.

23. A device according to claim 9, wherein a threshold value changing pulse width $\Delta t_0$ used in a threshold value changing operation is larger than a threshold value changing pulse width $\Delta t$ used in a threshold value re-changing operation.

24. A non-volatile semiconductor memory device according to claim 23, wherein said memory cells construct a NAND cell- structure by connecting said plurality of memory cells in series.

25. A non-volatile semiconductor memory device according to claim 23, further comprising:

a first selecting gate connected to one end of said NAND cell and said bit line;

a second selecting gate connected to another end of said NAND cell; and a source line connected to another end of said NAND cell via said second selecting gate.

26. A non-volatile semiconductor memory device according to claim 23, wherein said plurality of memory cells construct a memory cell unit by connecting to said bit lines in parallel.

27. A non-volatile semiconductor memory device according to claim 23, wherein said memory cells, whose common drain is connected to said bit line via a first selecting gate and common source is connected to a common source line via a second selecting gate, construct a NOR structure by connecting to said bit line in parallel.

28. A non-volatile semiconductor memory device according to claim 23, further comprising means for setting a potential of a first write pulse to a potential to prevent overwrite for the fastest memory cell to write thereto during data write by a plurality of pulses.

29. A non-volatile semiconductor memory device according to claim 23, further comprising means for setting a upper-limit potential of a write pulse to a rated potential of said memory cells and peripheral circuits during data write by a plurality of pulses.

30. A non-volatile semiconductor memory device comprising:

semiconductor substrate;

a memory cell including source and drain regions formed in a surface region of said semiconductor substrate, and a first gate insulating film, a charge storage layer, a second gate insulating film, and a control gate sequentially stacked on said semiconductor substrate, said memory cell being capable of electrically rewriting data by exchanging charges;

means for applying a high potential to said semiconductor substrate and an intermediate potential to said control gate in a first data erase operation, and applying a high potential to said semiconductor substrate and a lower potential than in the previous data erase operation to said control gate in second and subsequent data erase operations, thereby removing electrons from said charge storage layer.

31. A device according to claim 30, wherein the high potential is a boosted potential, the intermediate potential is a power supply potential, and the low potential is a ground potential.

32. A non-volatile semiconductor memory device comprising:

a semiconductor substrate;

a plurality of memory cells, each including source and drain regions formed in a surface region of said semiconductor substrate, and a first gate insulating film, a charge storage layer, a second gate insulating film, and a control gate sequentially stacked on said semiconductor substrate, said memory cells being capable of electrically rewriting data by exchanging charges and being arranged in the form of a matrix; and means for applying a high potential to said semiconductor substrate and said control gate of each non-selected memory cell and applying an intermediate potential to said control gate of a selected memory cell in a first data erase operation, and applying a high potential to said semiconductor substrate and said control gate of each non-selected memory cell and applying a potential lower than the intermediate potential to said control gate of said selected memory cell in second and subsequent data erase operations, thereby removing electrons from said charge storage layer.

33. A device according to claim 32, wherein the high potential is a boosted potential, the intermediate potential is a power supply potential, and the low potential is a ground potential.

34. A non-volatile semiconductor memory device comprising:

a memory cell array including a plurality of memory cells, which are arranged in a matrix, capable of electrically rewriting and erasing data, said memory cell having a source and a drain; a plurality of bit lines coupled to said drain of said memory cells;

a plurality of word lines which are control gates of said memory cells;

writing means for sequentially increasing a potential difference between a word line and at least one of a substrate, a source and a drain during a page write operation;

means for reading information written by said writing means and for rewriting memory cells which are insufficiently written; and means for preventing to rewrite a memory cell in which the write operation is completed by reducing a potential difference between said word line and at least one of said substrate, said source and said drain, whereby the write operation is performed in an optimal condition for each memory cell.

* * * * *

UNITED STATES PATENT AND TRADEMARK OFFICE
CERTIFICATE OF CORRECTION

PATENT NO.  : 5,555,204
DATED       : September 10, 1996
INVENTOR(S) : Tetsuo ENDOH, et al.

It is certified that error appears in the above-indentified patent and that said Letters Patent is hereby corrected as shown below:

Title page, item [54] and col. 1, lines 1-2, title should read:

-- EEPROM FOR WRITING AND ERASING DATA USING TUNNEL CURRENT--

Signed and Sealed this

Third Day of December, 1996

Attest:

BRUCE LEHMAN

Attesting Officer

Commissioner of Patents and Trademarks